(12) United States Patent
Maki et al.

(10) Patent No.: US 8,703,583 B2
(45) Date of Patent: Apr. 22, 2014

(54) FABRICATION METHOD OF SEMICONDUCTOR DEVICE

(75) Inventors: Hiroshi Maki, Tokyo (JP); Masayuki Mochizuki, Tokyo (JP); Ryuichi Takano, Tokyo (JP); Yoshiaki Makita, Tokyo (JP); Haruhiko Fukasawa, Tokyo (JP); Keisuke Nadamoto, Tokyo (JP); Tatsuyuki Okubo, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/618,292

(22) Filed: Nov. 13, 2009

(65) Prior Publication Data

US 2010/0055878 A1  Mar. 4, 2010

Related U.S. Application Data

(62) Division of application No. 11/735,741, filed on Apr. 16, 2007, now Pat. No. 7,629,231.

(30) Foreign Application Priority Data

May 23, 2006  (JP) ................................. 2006-143277

(51) Int. Cl.
*H01L 21/00* (2006.01)

(52) U.S. Cl.
USPC .... 438/464; 438/460; 438/114; 257/E21.237; 414/941

(58) Field of Classification Search
USPC ................... 257/E21.237, E21.525–E21.529; 438/460, 464, 458, 33, 68, 113, 114; 228/212, 213; 414/935–941
See application file for complete search history.

(56) References Cited

U.S. PATENT DOCUMENTS 5,960,260 A * 9/1999 Umehara et al. .............. 438/118
6,041,996 A  3/2000 Arikado (Continued)

FOREIGN PATENT DOCUMENTS

EP  1 321 966 A1  6/2003
JP  07-014860 A  1/1995

(Continued)

OTHER PUBLICATIONS

Office Action dated Apr. 10, 2012 in Japanese Patent Application No. 2006-143277.

(Continued)

*Primary Examiner* — Steven J Fulk
*Assistant Examiner* — Abbigale Boyle
(74) *Attorney, Agent, or Firm* — Miles & Stockbridge P.C.

(57) ABSTRACT

A technique with which die bonding can be carried out without forming a void in a bond area is provided. A vacuum supply line that connects to a vacuum chuck hole formed in the bottom face of a vacuuming collet and supplies the vacuuming collet with reduced pressure for vacuum chucking a chip is constructed of two systems. That is, the vacuum supply line is so structured that a first pipe and a second pipe connect to the vacuuming collet. The first pipe supplies the vacuuming collet with a vacuum that provides suction force when a chip is unstuck from a dicing tape and transported to a mounting position on a wiring substrate. The second pipe supplies the vacuuming collet with a vacuum that provides suction force when a chip is mounted over a wiring substrate. The intensity of the vacuum (suction force) supplied to the vacuuming collet is controlled by opening or closing valves respectively installed in the pipes.

21 Claims, 62 Drawing Sheets

(56) References Cited

U.S. PATENT DOCUMENTS

| | | |
|---|---|---|
| 6,619,535 B1 | 9/2003 | Imanishi et al. |
| 6,916,686 B2 | 7/2005 | Wada et al. |
| 7,015,071 B2 | 3/2006 | Wada et al. |
| 7,115,482 B2 | 10/2006 | Maki et al. |
| 2005/0059205 A1* | 3/2005 | Maki et al. .................. 438/232 |
| 2005/0061856 A1 | 3/2005 | Maki et al. |
| 2005/0118823 A1 | 6/2005 | Kawashima |
| 2005/0260829 A1 | 11/2005 | Uematsu et al. |
| 2006/0128065 A1 | 6/2006 | Inada et al. |

FOREIGN PATENT DOCUMENTS

| | | | |
|---|---|---|---|
| JP | 10-209223 A | | 8/1998 |
| JP | 2002-280398 A | | 9/2002 |
| JP | 2002-299418 A | | 10/2002 |
| JP | 2002299418 A | * | 10/2002 |
| JP | 2003-203964 A | | 7/2003 |
| JP | 2003-234359 A | | 8/2003 |
| JP | 2004-6599 A | | 1/2004 |
| JP | 2004-022995 A | | 1/2004 |
| JP | 2004-128339 A | | 4/2004 |
| JP | 2004-228255 A | | 8/2004 |
| JP | 2004228255 A | * | 8/2004 |
| JP | 2004-266137 A | | 9/2004 |
| JP | 2004-304066 A | | 10/2004 |
| JP | 2005-019962 A | | 1/2005 |
| JP | 2005-093838 A | | 4/2005 |
| JP | 2005-117019 A | | 4/2005 |
| JP | 2005-150311 A | | 6/2005 |
| JP | 2005-322815 A | | 11/2005 |
| JP | 2006-24729 A | | 1/2006 |
| KR | 10-2000-0061185 | | 10/2000 |
| KR | 10-2005-0053314 | | 6/2005 |
| KR | 10-2006-0048012 A | | 5/2006 |

OTHER PUBLICATIONS

Office Action issued May 10, 2013, in Korean Patent Application No. 10-2007-0044347.

Office Action issued Jul. 2, 2013, in Japanese Patent Application No. 2012-131521.

Office Action dated Sep. 5, 2013, in Korean Patent Application No. 10-2013-0068778.

* cited by examiner

FABRICATION METHOD OF SEMICONDUCTOR DEVICE

CROSS-REFERENCE TO RELATED APPLICATIONS

This application is a division of application Ser. No. 11/735,741 filed Apr. 16, 2007, now U.S. Pat. No. 7,629,231. This application also claims priority from Japanese Patent Application No. 2006-143277 filed on May 23, 2006, the disclosure of which, including the specification, drawings, and abstract, is incorporated herein by reference in its entirety.

BACKGROUND OF THE INVENTION

The present invention relates to a processing technology for semiconductor devices, and in particular to a technology effectively applicable to the manufacture of an insulated gate field effect transistor formed in a semiconductor thin film over an insulating film.

Japanese Unexamined Patent Publication No. 2003-203964 (Patent Document 1 (corresponding Europatent Publication No. EP1321966)), Japanese Unexamined Patent Publication No. 2004-22995 (Patent Document 2), and Japanese Unexamined Patent Publication No. 2005-150311 (Patent Document 3) disclose a technology for implementing the following: in a die bonding process for, semiconductor chips (hereafter, simply referred to as chips) with DAF (Die Attach Film) stuck to their rear surface, the production of an air bubble is suppressed in the interface between a chip and a die pad. More specific description will be given. A chip is bent and deformed into a convex shape by a vacuum chuck section (pressure application section) constructed of an elastic material. In this state, die bonding is carried out to prevent an air bubble from being caught in the interface between the chip and a die pad.

Japanese Unexamined Patent Publication No. 2005-322815 (Patent Document 4) discloses a technology for implementing the following: a collet is elastically deformed to deform a chip into a convex shape, and die bonding is carried out by pressurizing the vacuum in the vacuum hole in the collet to atmospheric pressure; and a void is thereby prevented from being formed in the interface between the chip and a die pad.

Japanese Unexamined Patent Publication No. 2002-280398 (Patent Document 5) and Japanese Unexamined Patent Publication No. 2004-6599 (Patent Document 6) disclose a technology for implementing the following: when a thermocompression bonding film is stuck to a die pad (die bonding area) with a film vacuuming collet, the thermocompression bonding film is vacuumed to the convex surface of the film vacuuming collet and is transported and compression-bonded to the die pad; and a void is thereby prevented from being formed in the interface between the thermocompression bonding film and the die pad.

Japanese Unexamined Patent Publication No. 2004-128339 (Patent Document 7) discloses a technology for reducing cracking of a chip and defective compression bonding by using the following collet in vacuuming, holding, and die-bonding a chip: a collet having multiple vacuuming holes formed in its vacuum chuck section for vacuuming a chip; or a collet having the entire surface of its vacuum chuck section formed of a porous material.

Japanese Unexamined Patent Publication No. 2005-93838 (Patent Document 8 (corresponding U.S. application Ser. No. 10/901,999; filed on Jul. 30, 2004 in U.S.)) discloses a technology for implementing the following: a die bonding process is divided into a first heating stage and a second heating stage; in the first heating stage, chips are temporarily bonded in a short time and in the second heating stage, multiple chips are properly bonded in a lump; and the bonding time is thereby shortened.

Japanese Unexamined Patent Publication No. 2004-304066 (Patent Document 9 (corresponding U.S. application Ser. No. 10/812,869; filed on Mar. 31, 2004 in U.S.)) discloses a technology for implementing the following: multiple chips obtained by dividing a semiconductor wafer (hereafter, simply referred to as wafer) are stuck to an adhesive tape. The head of a transducer is brought into contact with the rear surface of this tape, and a longitudinal vibration of predetermined frequency and amplitude is applied to it; and chips are thereby swiftly unstuck from the adhesive tape without causing cracking or chipping.

Japanese Unexamined Patent Publication No. 2004-228255 (Patent Document 10) discloses a die pickup apparatus. This apparatus is so controlled as to increase the plunging amount of a plunge-up pin pitch by pitch, and is thus capable of stably picking up dies.

Japanese Unexamined Patent Publication No. 2006-24729 (Patent Document 11) discloses a technology for implementing the following with a dispenser used in a die bonding process: the dispenser is so formed that the opening in its nozzle for discharging paste is in a flattened shape and its diameter in the direction of width is larger than its diameter in the direction orthogonal thereto. This accelerates the operation of applying the paste for die bonding and prevents a problem that a void is formed between the paste for die bonding and a chip.

Japanese Unexamined Patent Publication No. 2005-117019 (Patent Document 12 (corresponding U.S. application Ser. No. 10/942,889; filed on Sep. 17, 2004 in U.S.)) discloses a technology for implementing the following: when a chip stuck to a dicing tape is unstuck from it, multiple blocks are used to plunge up the dicing tape. Thus, the chip is swiftly unstuck from the dicing tape without cracking or chipping. The multiple blocks are constructed of a first block largest in diameter, a second block smaller in diameter than the first block, and a third block smaller in diameter than the second block. They are so disposed that the second block is placed inside the first block and the third block is placed inside the second block.

SUMMARY OF THE INVENTION

In recent years, there have been in practical use packages obtained by laminating multiple chips over a wiring substrate and packaging them with the aim of enhancing the packaging density of semiconductor devices. When such a package is assembled, a chip processed and thinned down to a few tens of µm is used.

To mount such a thin chip over a wiring substrate, the following procedure is taken. A tape for protecting integrated circuits is stuck to the principal surface of a wafer with desired integrated circuits formed therein. In this state, the rear surface of the wafer is polished and etched to reduce its thickness to a few tens of µm or so. Subsequently, dicing is carried out with the adhesive tape stuck to the rear surface of this thin wafer to divide the wafer into multiple chips. Thereafter, a plunge-up pin or the like is pressed against the rear surface of the adhesive tape to unstick the chips from the adhesive tape one by one. An unstuck chip is picked up with a collet and transported to over the wiring substrate and pellet bonding is carried out. The chip is subjected to thermocompression through an adhesive film, and is thereby die-bonded.

In a process for assembling a package using such a very thin chip as mentioned above, the following takes place: when a chip is picked up by a collet, it is deformed by the vacuuming force from the collet. If die bonding is carried out in this state, the chip is die-bonded as is deformed. As a result, a void (air bubble) is formed in the interface between the chip and a die pad on the wiring substrate or in the interface between two laminated chips. Since a high-temperature process, such as wire bonding process and molding process, is carried out following the die bonding process, the void can cause a problem. For example, the void may be expanded and bursted to damage the chip. To prevent this, it is required to suppress deformation of a chip during die bonding.

When a very thin chip divided by dicing is unstuck from an adhesive tape and picked up, cracking or chipping is likely to occur in the chip. Therefore, some measure is required to prevent this. When chips are unstuck from an adhesive tape, the operation of picking up a chip may fail. This may be able to be coped with by the following means: means for picking it up again under the condition that the stroke amount of a plunge-up pin or the like has been increased or the plunging speed has been reduced; or means for adjusting (increasing) the expanding amount of an adhesive tape. However, these means still involve problems. The means for picking up a chip again under the condition that the stroke amount of a plunge-up pin or the like has been increased or the plunging speed has been reduced can fail to pick it up again. When a chip is picked up, it is plunged up with a plunge-up jig, including a plunge-up pin and the like, vacuumed to the rear surface of an adhesive tape. Use of means for adjusting the expanding amount of an adhesive tape can make the tension of the adhesive tape too high to vacuum it with the plunge-up jig. In this case, a problem that a chip cannot be unstuck from the adhesive tape arises.

There is means for implementing the following: when a chip is unstuck from an adhesive tape, the head of a transducer is brought into contact with the rear surface of the adhesive tape and a longitudinal vibration of predetermined frequency and amplitude is applied to it. Thus, the chip is unstuck from the adhesive tape without causing cracking or chipping. However, this means also involves a problem. Since the strength of adhesion between a chip and an adhesive tape differs depending on the size of the chip, there are cases where the frequency and amplitude of vibration must be varied. As a result, the chip cannot be swiftly unstuck from the adhesive tape. There are cases where a chip is partway unstuck and the pick-up operation fails. If an attempt is made to pick up the chip partway unstuck again in these cases, a problem can arise. This chip can be highly probably unstuck from the adhesive tape, and excessive application of vibration can degrade pick-up position accuracy.

The present inventors found that the following phenomenon occurs when a DAF-type chip is unstuck from an adhesive tape by vibration: separation progresses more slowly in an area closer to the periphery of the area of bond between the chip and the adhesive tape; and separation progresses faster in an area closer to the center of the area of bond. For this reason, it is required to apply vibration in accordance with the progress of separation in an area closer to the periphery of the area of bond where separation progresses more slowly. However, this involves a problem. When a chip is unstuck by vibration, heat produced by the vibration is applied to the chip. In an area closer to the center of the area of bond where separation has been completed, a DAF product can adhere because of the applied heat and it may be impossible to unstick it.

An object of the invention disclosed herein is to provide a technology with which die bonding can be carried out without forming a void in a bond area.

Another object of the invention disclosed herein is to provide a technology with which a chip can be reliably and accurately unstuck from an adhesive tape for holding chips during die bonding.

The following is a brief description of the gist of the representative elements of the invention laid open in this application.

1. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips by the adhesive tape; (c) vacuuming and holding the upper face of the first semiconductor chip to be unstuck from the adhesive tape of the semiconductor chips held by the adhesive tape by first suction force with a vacuuming collet, and thereby unsticking the first semiconductor chip from the adhesive tape; and (d) after the step (c), vacuuming and holding the upper face of the first semiconductor chip by second suction force, smaller than the first suction force, with the vacuuming collet, and further die-bonding the lower face of the first semiconductor chip to a chip mounting area.

The first suction force is a suction force sufficient to unstick the first semiconductor chip from the adhesive tape. The second suction force is a suction force that is smaller than the first suction force and is sufficient to prevent the first semiconductor chip from dropping from the vacuuming collet.

2. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips by the adhesive tape; (c) vacuuming and holding the upper face of the first semiconductor chip to be unstuck from the adhesive tape of the semiconductor chips held by the adhesive tape with a vacuuming collet, and thereby unsticking the first semiconductor chip from the adhesive tape; (d) placing a mounting board on a first bonding stage equipped with a pressure applying jig; (e) after the step (c) and the step (d), vacuuming and holding the upper face of the first semiconductor chip with the vacuuming collet and further transporting the semiconductor chip to over a chip mounting area on the principal surface of the mounting board, and applying pressure to a temporary bonding area in the center of the lower face of the first semiconductor chip from the rear surface of the mounting board with the pressure applying jig and further bonding the temporary bonding area to the chip mounting area; and (f) after the step (e), applying pressure to the entire lower face of the first semiconductor chip from the rear surface of the mounting board to bond the lower face of the first semiconductor chip to the chip mounting area.

3. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips by the adhesive tape; (c) vacuuming and holding the upper face of the first semiconductor chip to be unstuck from the adhesive tape of the semiconductor chips held by the adhesive tape with a vacuuming collet, and thereby unsticking the first semiconductor chip from the adhesive tape; and (d) after the step (c), vacuuming and holding the upper face of the first semiconductor chip with the vacuuming collet, and further die-bonding the lower face of the first semiconductor chip to a chip mounting area.

The vacuuming collet includes a head section brought into contact with the first semiconductor chip and a support section that holds the head section. The support section is so constructed that in its supporting seat section in contact with the head section, a first surface is spherically machined. The head section is so constructed that a second surface in contact with the supporting seat section is spherically machined in agreement with the first surface of the supporting seat section. The support section holds the head section so that the lower face of the first semiconductor chip is in parallel with the chip mounting area.

4. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips with the adhesive tape; (c) vacuuming and holding the upper face of the first semiconductor chip to be unstuck from the adhesive tape of the semiconductor chips held by the adhesive tape with a vacuuming collet, and thereby unsticking the first semiconductor chip from the adhesive tape; and (d) after the step (c), vacuuming and holding the upper face of the first semiconductor chip with the vacuuming collet, and further die-bonding the lower face of the first semiconductor chip to a chip mounting area.

The vacuuming collet includes a head section brought into contact with the first semiconductor chip, a first support section that holds the head section, and a second support section that holds the first support section. The first support section is so constructed that in its first supporting seat section in contact with the head section, a first surface is curvedly machined along a first direction with a first curvature. The head section is so constructed that a second surface in contact with the first supporting seat section is curvedly machined in agreement with the first surface of the first supporting seat section. The second support section is so constructed that in its second supporting seat section in contact with the first support section, a third surface is curvedly machined along a second direction intersecting the first direction with a second curvature. The first support section and the second support section respectively hold the head section and the first support section so that the lower face of the first semiconductor chip is in parallel with the chip mounting area.

5. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips with the adhesive tape; (c) horizontally applying first tension to the adhesive face of the adhesive tape with the semiconductor chips stuck thereto and further plunging up the first semiconductor chip to be unstuck from the adhesive tape of the semiconductor chips from the rear surface of the adhesive tape with a plunge-up jig, vacuuming and holding the upper face of the first semiconductor chip with a vacuuming collet, and thereby unsticking the first semiconductor chip from the adhesive tape; (d) if the operation of unsticking the first semiconductor chip from the adhesive tape fails at the step (c), carrying out the step (c) again under the condition that at least either the plunging amount or plunging speed of the plunge-up jig has been varied; (e) if the operation of unsticking the first semiconductor chip from the adhesive tape fails at the step (d), carrying out the step (c) again under the condition that the first tension has been reduced; and (f) after the first semiconductor chip unsticks from the adhesive tape, vacuuming, and holding the upper face of the first semiconductor chip with the vacuuming collet, and further die-bonding the lower face of the first semiconductor chip to a chip mounting area.

6. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips with the adhesive tape; (c) horizontally applying first tension to the adhesive face of the adhesive tape with the semiconductor chips stuck thereto and further applying a longitudinal vibration of a first amplitude and plunging up the first semiconductor chip to be unstuck from the adhesive tape of the semiconductor chips with a plunge-up jig from the rear surface of the adhesive tape, and vacuuming and holding the upper face of the first semiconductor chip with a vacuuming collet and thereby unsticking the first semiconductor chip from the adhesive tape; (d) if the operation of unsticking the first semiconductor chip from the adhesive tape fails at the step (c), carrying out the step (c) again under the condition that the first amplitude has been reduced; (e) if the operation of unsticking the first semiconductor chip from the adhesive tape at the step (d), carrying out the step (c) again under the condition that the first tension has been reduced; and (f) after the first semiconductor chip unsticks from the adhesive tape, vacuuming and holding the upper face of the first semiconductor chip with the vacuuming collet, and further die-bonding the lower face of the first semiconductor chip to a chip mounting area.

7. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips with the adhesive tape; (c) horizontally applying first tension to the adhesive face of the adhesive tape with the semiconductor chips stuck thereto and further applying a longitudinal vibration of a first amplitude and plunging up the first semiconductor chip to be unstuck from the adhesive tape of the semiconductor chips with a plunge-up jig from the rear surface of the adhesive tape, and vacuuming and holding the upper face of the first semiconductor chip with a vacuuming collet and thereby unsticking the first semiconductor chip from the adhesive tape; and (d) after the first semiconductor chip unsticks from the adhesive tape, vacuuming and holding the upper face of the first semiconductor chip with the vacuuming collet, and further die-bonding the lower face of the first semiconductor chip to a chip mounting area.

The plunge-up jig is provided therein with an air gap in a position opposite the center of the lower face of the first semiconductor chip.

8. A fabrication method of a semiconductor device according to the invention includes the steps of: (a) preparing a semiconductor wafer in which its principal surface is partitioned into multiple chip areas by parting areas, an integrated circuit is formed in each of the chip areas, and an adhesive tape is stuck to its rear surface; (b) cutting the semiconductor wafer along the parting areas to divide it into multiple semiconductor chips, and holding the semiconductor chips with the adhesive tape; (c) preparing a housing jig that is for housing one or more mounting boards and is provided with an opening through which the mounting board can be loaded and unloaded; (d) placing the housing jig in a dimensional measurement position, measuring the first width of the housing jig in a third direction level with the opening, and determining the first difference between a reference value and the first width; (e) correcting a moving distance in the third direction by the first difference and moving the housing jig to a mounting board unloading position; (f) after the step (e), unloading one of the mounting boards from the housing jig, and transporting it to a chip mounting position along a transport track extended in a fourth direction opposite the opening of the housing jig and orthogonal to the third direction; (g) vacuuming and holding the upper face of the first semiconductor chip to be unstuck from the adhesive tape of the semiconductor chips held by the adhesive tape with a vacuuming collet, and thereby unsticking the first semiconductor chip from the adhesive tape; and (h) after the step (g), vacuuming and holding the upper face of the first semiconductor chip with the vacuuming collet, and further die-bonding the lower face of the first semiconductor chip to a chip mounting area in the mounting board placed in the chip mounting position.

The following is a brief description of the gist of effects obtained by the representative elements of the invention laid open in this application. (1) When a semiconductor chip is mounted in a mounting area of a wiring substrate or the like, warpage and inclination of the semiconductor chip are eliminated. Therefore, a void can be prevented from being formed between the semiconductor chip and the mounting area. As a result, the semiconductor chip can be prevented from being unstuck from the mounting area, and can be mounted with reliability. (2) If the operation of picking up a semiconductor chip fails when the semiconductor chip held by an adhesive tape such as a dicing tape is unstuck from the adhesive tape and picked up, the following measure is taken: a plunge-up jig performs a retry under the modified conditions for plunging up the adhesive tape and expanding the adhesive tape. Therefore, the semiconductor chip to be unstuck can be made more likely to unstick from the adhesive tape. (3) When a magazine with one or more wiring substrates housed therein is transported to a wiring substrate unloading position, variation in the dimensions of the magazine is considered. Therefore, a wiring substrate can be prevented from being broken when it is unloaded from the magazine.

DETAILED DESCRIPTION OF THE PREFERRED EMBODIMENTS

Figure 1:
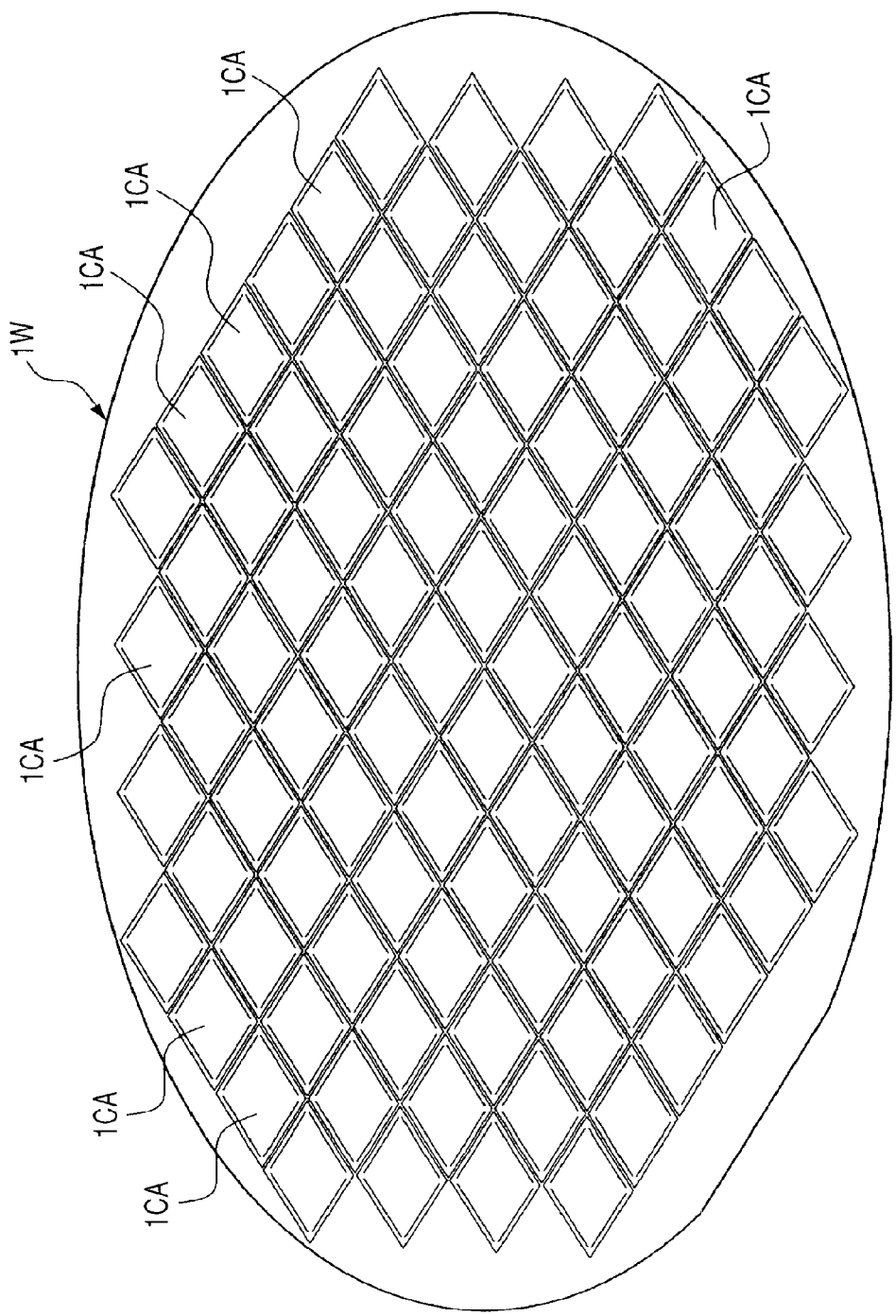
FIG. 1 is a perspective view of semiconductor chips using in the fabrication of a semiconductor device in a first embodiment of the invention.

Description will be given to the meaning of terms found in this specification before the invention is described in detail.

Wafer refers to an insulating, anti-insulating, or semiconductor substrate, including a single crystal silicon substrate (usually, in substantially circular planar shape), an SOI (Silicon On Insulator) substrate, an epitaxial substrate, a sapphire substrate, a glass substrate, and the like or a composite substrate of them used in the fabrication of a semiconductor element or an integrated circuit. The semiconductor device cited in this specification includes not only those fabricated over a semiconductor or insulator substrate, such as a silicon wafer or sapphire substrate, but also those formed over any other insulating substrate of, for example, glass, including TFT (Thin Film Transistor) and STN (Super-Twisted-Nematic) liquid crystals, and the like unless otherwise stated.

Device surface or element formation surface refers to the principal surface of a wafer on which a device pattern corresponding to multiple chip areas is formed by lithography.

Collet refers to a vacuum chuck tool used to transport chips one by one after a wafer is divided into the individual chips by dicing or the like.

Chip plunge-up refers to the following operation performed when, after a wafer is divided into individual chips, the chips are separated, vacuumed, and transported: plunging up a chip from the rear surface side of the wafer over an adhesive tape stuck to the rear surface with a needle-like pin or the like.

Magazine refers to a case for supplying and housing mounting boards or the like on which a chip is to be mounted. It is set in the loader and unloader of equipment in which die bonding, wire bonding, plastic molding, or any other like step is carried out.

In the following description, each embodiment will be divided into multiple sections or embodiments if necessary for the sake of convenience. Unless explicitly stated otherwise, they are not unrelated to one another, and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies, and the number may be above or below that specific number.

In the following description of embodiments, needless to add, their constituent elements (including elemental steps and the like) are not always indispensable unless explicitly stated otherwise or they are obviously indispensable in principle. When a statement of "formed of A" or "constructed of A" is given in the description of an embodiment or the like with respect to a constituent element, any other element is not excluded, needless to add. This applies unless it is explicitly stated that something is constructed only of that element.

Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

When mention is made of a material or the like, that specific material is a principal material, and any extraneous element, added substance, additional element, or the like is not excluded. This applies unless explicitly stated otherwise or it is apparent in principle or from the situation that some material is the only constituent element. For example, a silicon member includes not only pure silicon but also an additive impurity, binary, ternary, and other like alloys (e.g., SiGe), and the like unless explicitly stated otherwise.

In every drawing for explaining embodiments of the invention, members having the same function will be marked with the same numerals or codes, and the repetitive description thereof will be omitted.

The drawings illustrating embodiments may be partly hatched to make them more understandable even though they are plan views.

Hereafter, detailed description will be given to embodiments of the invention with reference to the drawings.

First Embodiment

In the first embodiment, the invention is applied to the fabrication of a semiconductor package in which a chip is mounted over a wiring substrate. Description will be given to the fabrication method in the order of process steps with reference to FIG. 1 to FIG. 33.

First, integrated circuits are formed in the principal surface of a wafer 1W formed of single crystal silicon illustrated in FIG. 1. Thereafter, the integrated circuit formed in each of the multiple chip formation areas (chip areas) 1CA partitioned by lattice-shaped scribe lines (parting areas) is subjected to an electrical test to determine its acceptability. The chip formation areas 1CA in the wafer 1W used in the first embodiment are in square planar shape with their longitudinal length equal to their lateral length.

Figure 2:
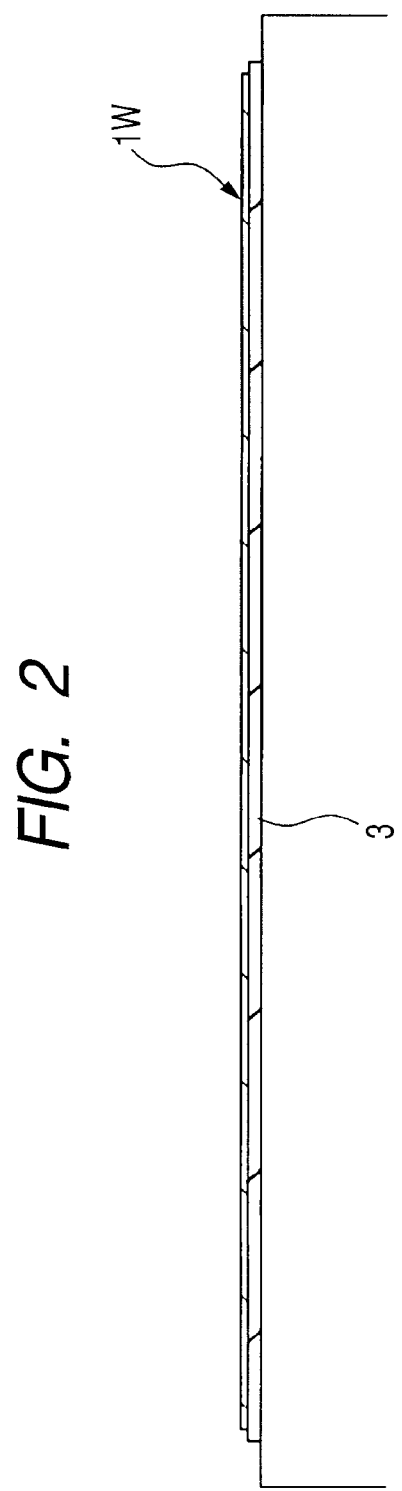
FIG. 2 is a side view illustrating a grinding step for a semiconductor wafer.

Next, as illustrated in FIG. 2, a back grind tape 3 for integrated circuit protection is stuck to the integrated circuit formation surface (on the lower side of the drawing) of the wafer 1W. In this state, the rear surface (on the upper side of the drawing) of the wafer 1W is ground with a grinder. The damage layer on the rear surface produced during this grinding is removed by wet etching, dry polishing, plasma etching, or any other like method to reduce the thickness of the wafer 1W to a value not more than 100 μm, for example, a value of 50 μm to 90 μm or so. The processing methods such as wet etching, dry polishing, and plasma etching have the following effects: while in these methods, the speed of processing that proceeds in the direction of the thickness of a wafer is lower than the speed of grinding by a grinder, the damage it does to the interior of the wafer is minor as compared with damage done by grinding; in addition, a damage layer produced in the wafer as the result of grinding by the grinder can be removed; and this makes the wafer 1W and chips resistant to cracking.

Figure 3:
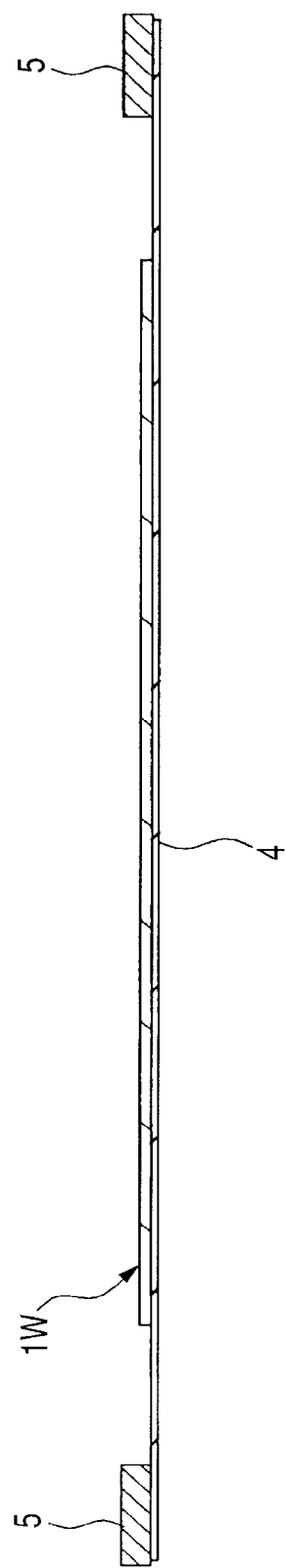
FIG. 3 is a side view illustrating a step for sticking a dicing tape to a semiconductor wafer.

The back grind tape 3 is removed, and then DAF (not shown) is stuck to the rear surface (the surface opposite the integrated circuit formation surface) of the wafer 1W, as illustrated in FIG. 3. The DAF functions as adhesive when a chip is mounted over a wiring substrate. Further, a dicing tape (adhesive tape) 4 is stuck to the DAF, and in this state, the peripheral portion of the dicing tape 4 is fixed on a wafer ring 5. Instead, the wafer 1W is often stuck to a dicing tape 4 to which DAF has been stuck beforehand. The dicing tape 4 is obtained by: applying an adhesive compound to the surface of a tape base material formed of polyolefin (PO), polyvinyl chloride (PVC), polyethylene terephthalate (PET), or the like to provide it with adherence (tackness); and cutting it in a circular shape. An UV cure adhesive compound is also often used.

Figure 4:
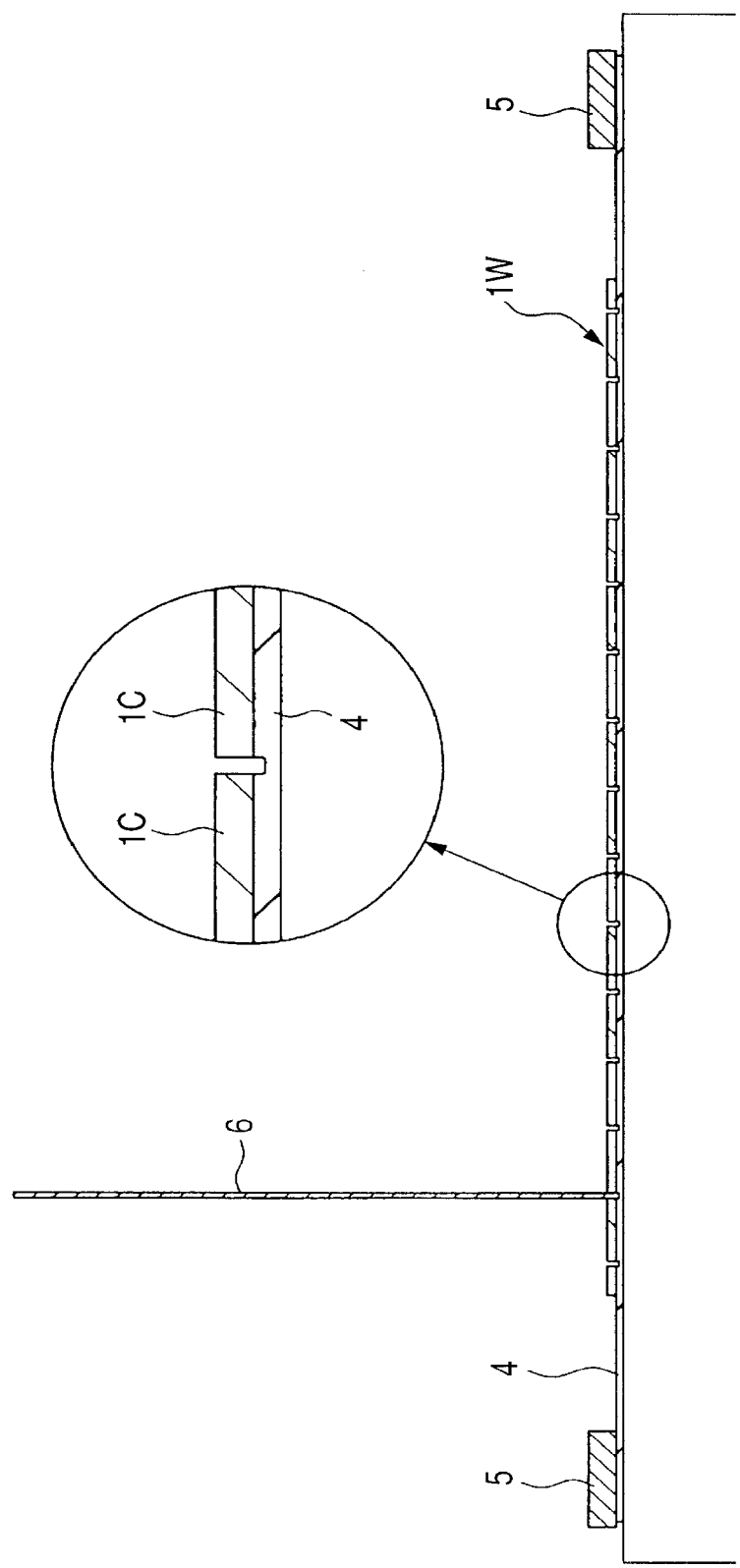
FIG. 4 is a side view illustrating a dicing step for a semiconductor wafer.

Next, the wafer 1W is diced using a dicing blade 6 as illustrated in FIG. 4, and the chip formation areas 1CA are thereby divided into square chips 1C. At this time, it is required to leave the individual divided chips 1C on the circular dicing tape 4; therefore, the dicing tape 4 is cut by a few tens of μm in the direction of its thickness. When an UV cure adhesive tape is used as the dicing tape 4, the dicing tape 4 is irradiated with ultraviolet rays to reduce the adhesive force of the adhesive compound prior to the chip 1C unsticking step described later.

Figure 5:
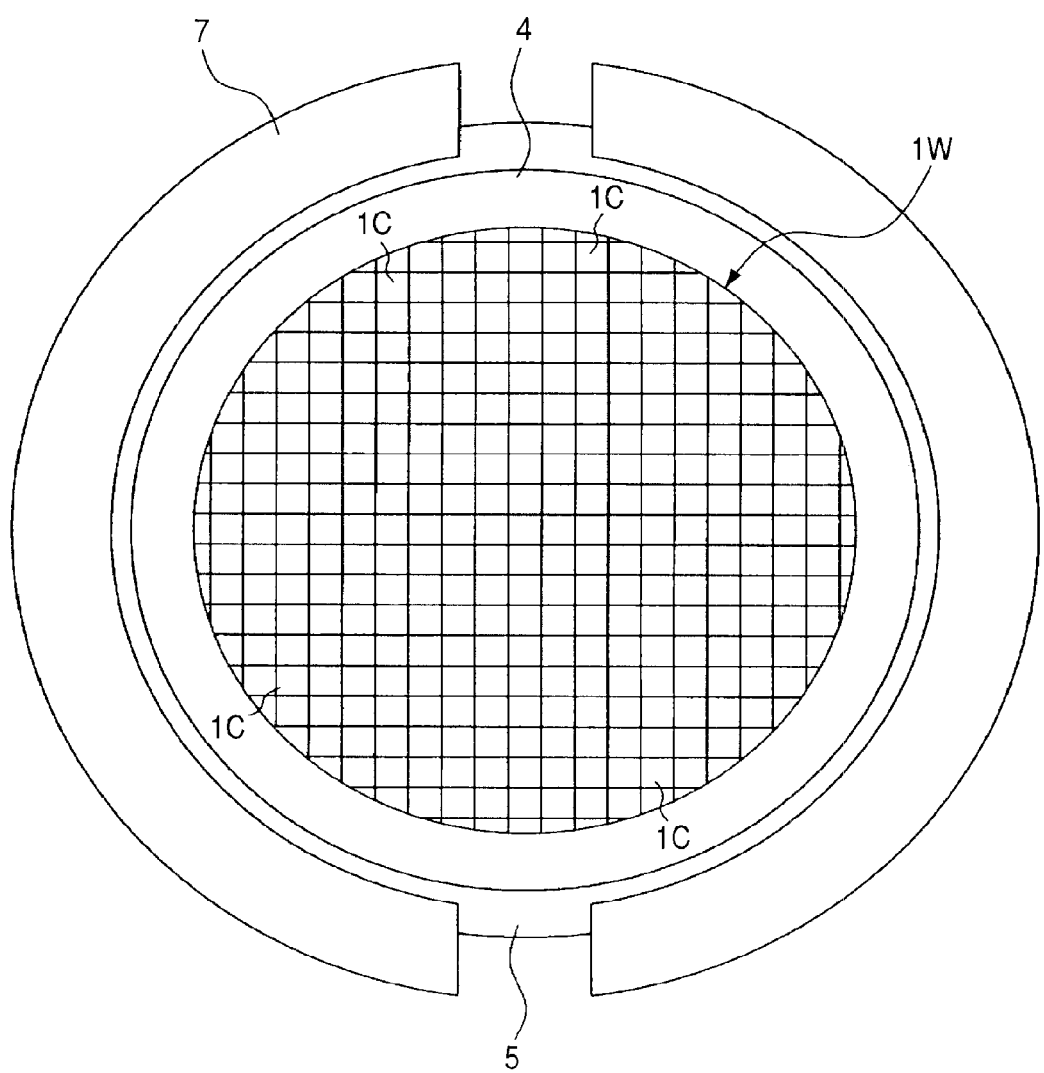
FIG. 5 is a plan view illustrating the way a semiconductor wafer and a dicing tape are fixed on a wafer ring, and a retaining plate is disposed above and an expand ring is disposed beneath.
Figure 6:
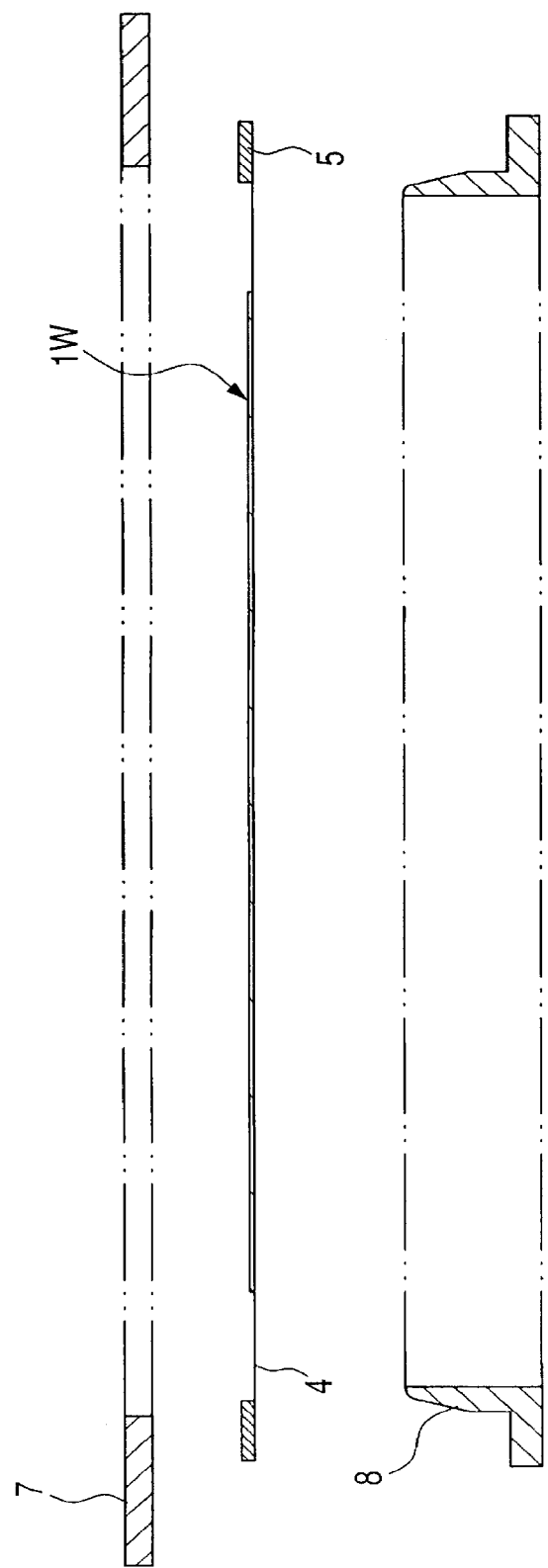
FIG. 6 is a sectional view illustrating the way a semiconductor wafer and a dicing tape are fixed on a wafer ring, and a retaining plate is disposed above and an expand ring is disposed beneath.
Figure 7:
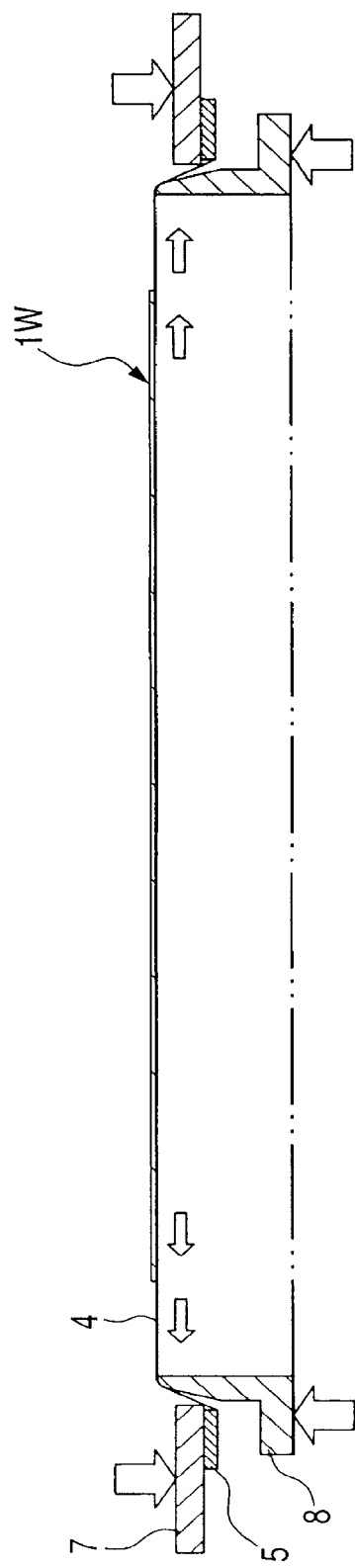
FIG. 7 is a sectional view illustrating the way a dicing tape and a wafer ring are clamped between a retaining plate and an expand ring and the dicing tape is thereby provided with tension.

As illustrated in FIG. 5 (plan view) and FIG. 6 (sectional view), a retaining plate 7 is disposed above the dicing tape 4 fixed on the wafer ring 5 and an expand ring 8 is disposed under the dicing tape. As illustrated in FIG. 7, the retaining plate 7 is pressed against the upper face of the wafer ring 5, and at the same time, the peripheral portion of the rear surface of the dicing tape 4 is pushed upward by the expand ring 8. Thus, (the adhesive face of) the dicing tape 4 receives high tension (first tension) directed from its central portion to its peripheral portion; therefore, the dicing tape is stretched taut in the horizontal direction.

Figure 8:
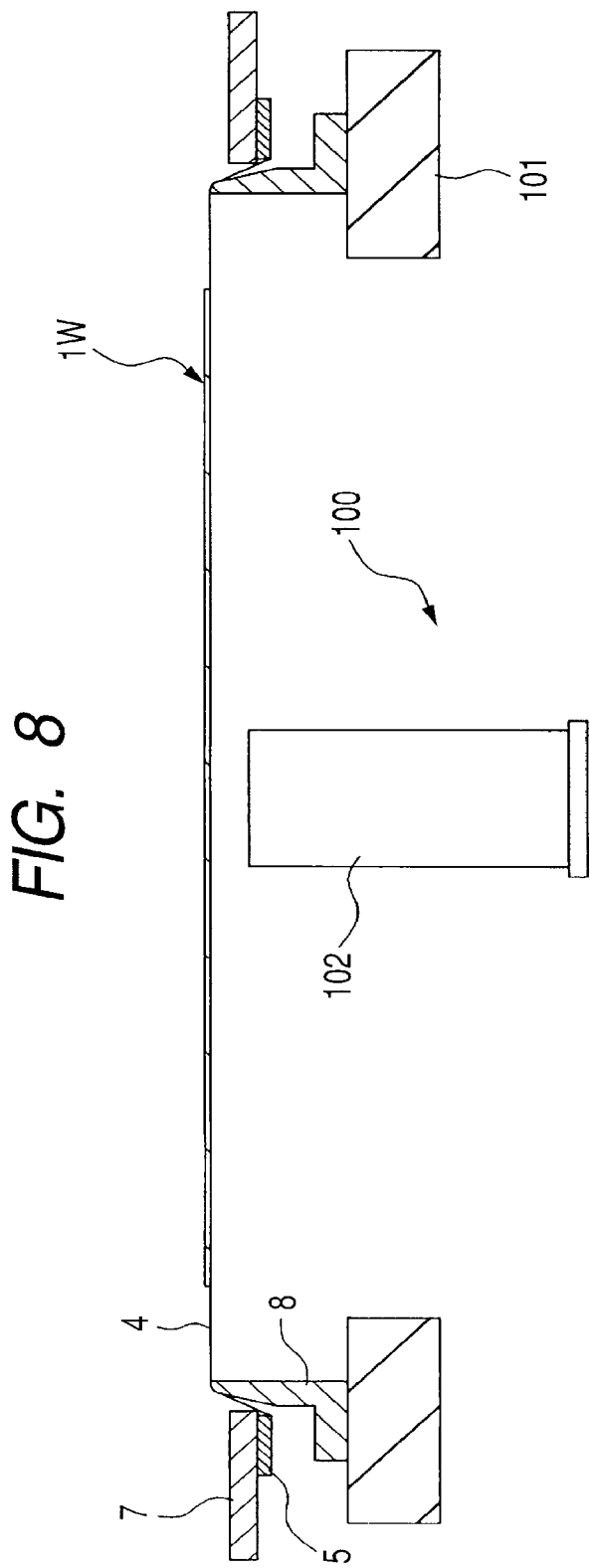
FIG. 8 is a sectional view of a substantial part of a chip unsticking apparatus, explaining a method for unsticking a semiconductor chip from a dicing tape stuck thereto.

In this state, the expand ring 8 is positioned on the stage 101 of the chip unsticking apparatus 100 illustrated in FIG. 8, and is held horizontal. In the center of the stage 101, there is disposed a vacuum chuck piece 102 that is moved in the horizontal direction and in the vertical direction by a drive mechanism (not shown). The dicing tape 4 is so held that its rear surface is opposed to the upper face of the vacuum chuck piece 102.

Figure 9:
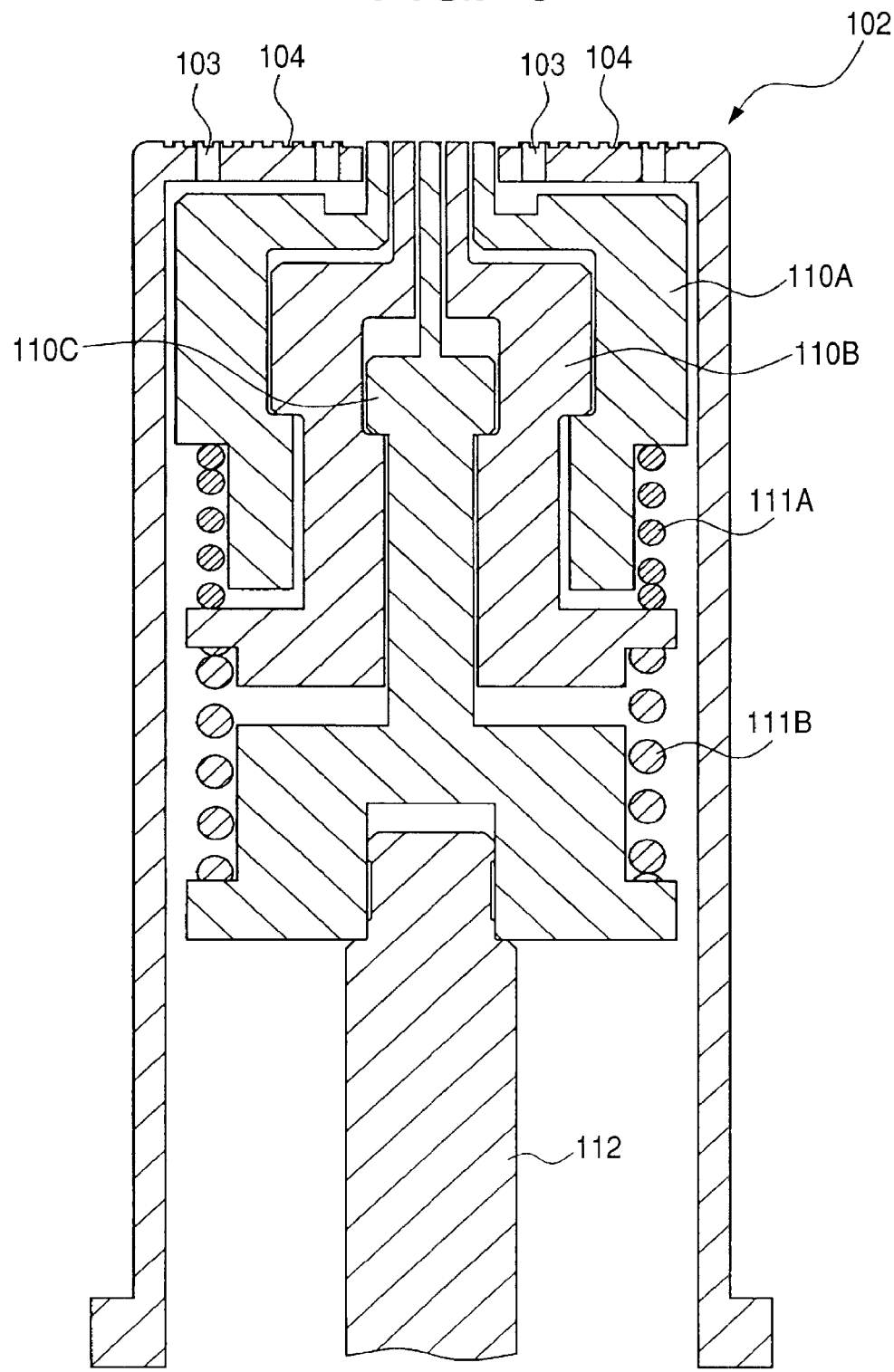
FIG. 9 is a sectional view illustrating a vacuum chuck piece of a chip unsticking apparatus.
Figure 10:
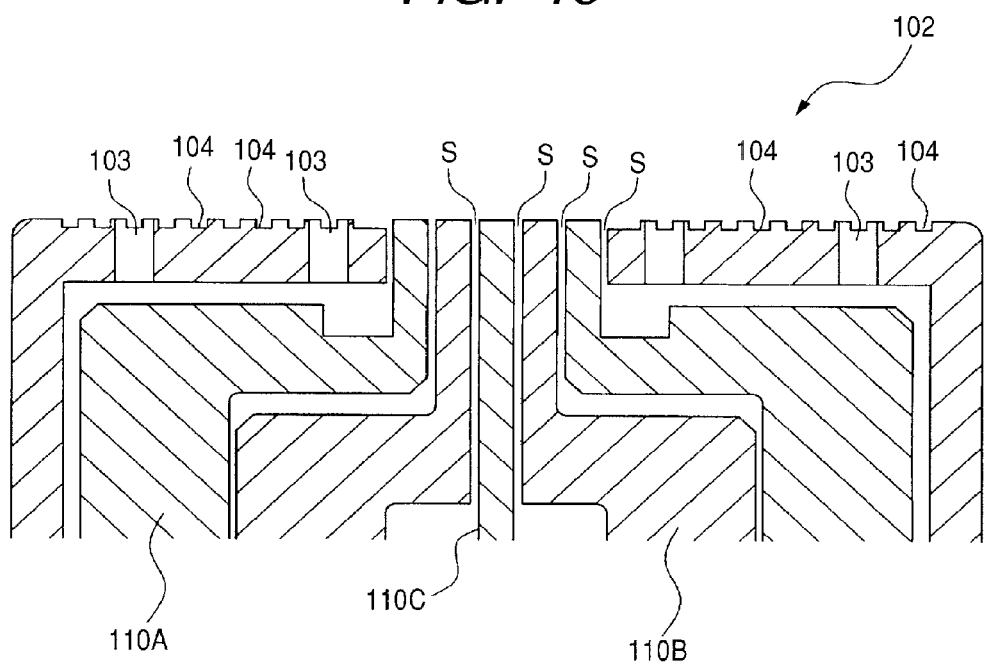
FIG. 10 is an enlarged sectional view of an area in proximity to the upper face of a vacuum chuck piece.
Figure 11:
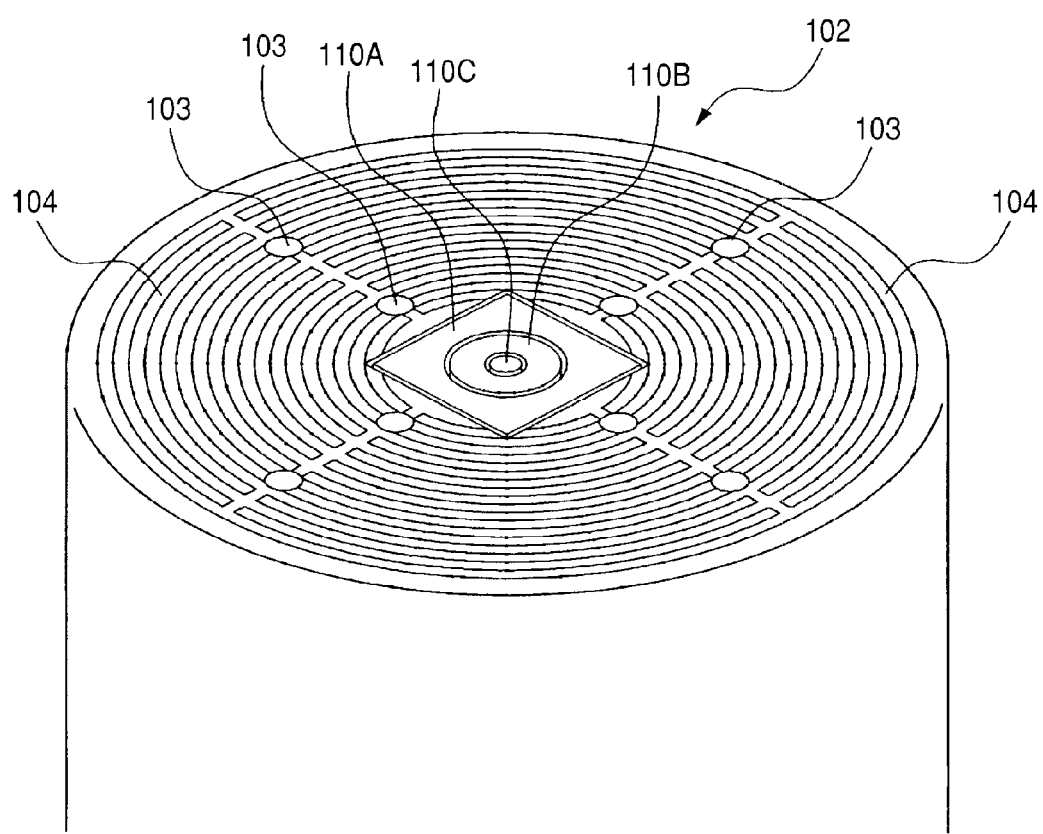
FIG. 11 is an enlarged perspective view of an area in proximity to the upper face of a vacuum chuck piece.

FIG. 9 is a sectional view of the vacuum chuck piece 102; FIG. 10 is an enlarged sectional view of an area in proximity to the upper face of the vacuum chuck piece 102; and FIG. 11 is an enlarged perspective view of an area in proximity to the upper face of the vacuum chuck piece 102.

The upper face of the vacuum chuck piece 102 is provided at its peripheral portion with multiple vacuum ports 103 and multiple grooves 104 concentrically formed. More vacuum ports 103 may be disposed in the entire upper face of the vacuum chuck piece instead of providing the grooves 104. The interior of each vacuum port 103 and groove 104 is depressurized with a suction force of −90 kPa to −60 kPa by a suction mechanism (not shown) when the vacuum chuck piece 102 is moved up to bring its upper face into contact with the rear surface of the dicing tape 4. At this time, the rear surface of the dicing tape 4 is vacuumed downward and is brought into tight contact with the upper face of the vacuum chuck piece 102.

If the grooves 104 are large in width or depth, an unfavorable phenomenon can occur when the dicing tape 4 is vacuumed downward. When the dicing tape 4 positioned under a chip 1C adjacent to a chip 1C to be unstuck is vacuumed to a groove 104, the interface between the adjacent chip 1C and the dicing tape 4 positioned under the chip can be broken into two above the groove 104. Especially, in case of a dicing tape 4 using an adhesive compound relatively low in adhesive force, this break is likely to occur. When this phenomenon occurs, an adjacent chip 1C can drop from the dicing tape 4 while the chip (first semiconductor chip) 1C to be unstuck is being unstuck from the dicing tape 4. To prevent this phenomenon from occurring, it is effective to take the following measure: the width or depth of the grooves 104 is reduced as much as possible so that a void will not formed between the dicing tape 4 positioned under adjacent chips 1C and the upper face of the vacuum chuck piece 102.

In the central part of the vacuum chuck piece 102, there are incorporated a first block 110A, a second block 110B, and a third block 110C that plunge up the dicing tape 4. Inside the first block 110A largest in diameter, there is disposed the second block 110B smaller in diameter than the first block, and inside the second block, there is disposed the third block 110C smallest in diameter. As described later, the three blocks, the first block 110A, second block 110B, and third block 110C are so constructed that they are moved up and down in conjunction with the following: a first helical compression spring 111A placed between the first block 110A positioned outside and the second block 110B positioned in the middle; a second herical compression spring 111B placed between the second block 110B positioned in the middle and the third block 110C positioned inside and having a higher spring constant than that of the first herical compression spring 111A; and a pusher 112 coupled with the third block 110C and moved up and down by a drive mechanism, not shown.

With respect to the three blocks, the first block 110A, second block 110B, and third block 110C, it is advisable to take the following measure: the first block 110A, largest in diameter and positioned outside, whose diameter is slightly (e.g., 0.5 mm to 3 mm or so) smaller than that of the chip 1 to be unstuck is used. When the chip 1C is square, for example, it is desirable to use a slightly smaller square block. When the chip 1C is rectangular, it is desirable to use a slightly smaller rectangular block. Thus, the corners that form the periphery of the upper face of the first block 110A are positioned slightly inside the outer edge of the chip 1C. Therefore, force for separating the chip 1C and the dicing tape 4 can be concentrated on a place (the outermost portion of the chip 1C) where the separation between the chip 1C and the dicing tape 4 starts.

To ensure a sufficient area of contact between the upper face of the first block 110A and the dicing tape 4, it is desirable that the upper face should be a flat surface or a surface having a large radius of curvature. When the area of contact between the upper face of the first block 110A and the dicing tape 4 is small, large bending stress is concentrated on the peripheral portion of the chip 1C that is supported from below by the upper face of the first block 110A. As a result, the peripheral portion of the chip 1C can crack.

The second block 110B, positioned in the middle, disposed inside the first block 110A has a diameter 1 mm to 3 mm or so smaller than that of the first block 110A. The third block 110C, smallest in diameter and disposed inside the second block 110B, has a diameter 1 mm to 3 mm or so further smaller than that of the second block 110B positioned in the middle. In the first embodiment, the second block 110B positioned in the middle and the third block 110C positioned outside are respectively formed in a columnar shape in consideration of ease of machining and the like. Instead, they may be formed in a quadratic prism shape similarly with the first block 110A positioned outside or in a shape approximate thereto. The upper faces of the three blocks, the first block 110A, second block 110B, and third block 110C are identical with one another in height in the initial state. (The initial state is a state in which none of the first block 110A, second block 110B, and third block 110C is in operation.) At this time, the upper faces of the three blocks are also flush with the peripheral portion of the upper face of the vacuum chuck piece 102.

As illustrated in close-up in FIG. 10, a gap (S) is provided between the peripheral portion of the vacuum chuck piece 102 and the first block 110A positioned outside and between the three blocks, the first block 110A, second block 110B, and third block 110C. The interior of these gaps (S) is depressurized by a suction mechanism, not shown. When the rear surface of the dicing tape 4 is brought into contact with the upper face of the vacuum chuck piece 102, the dicing tape 4 is vacuumed downward, and is brought into tight contact with the upper faces of the first block 110A, second block 110B, and third block 110C.

Figure 12:
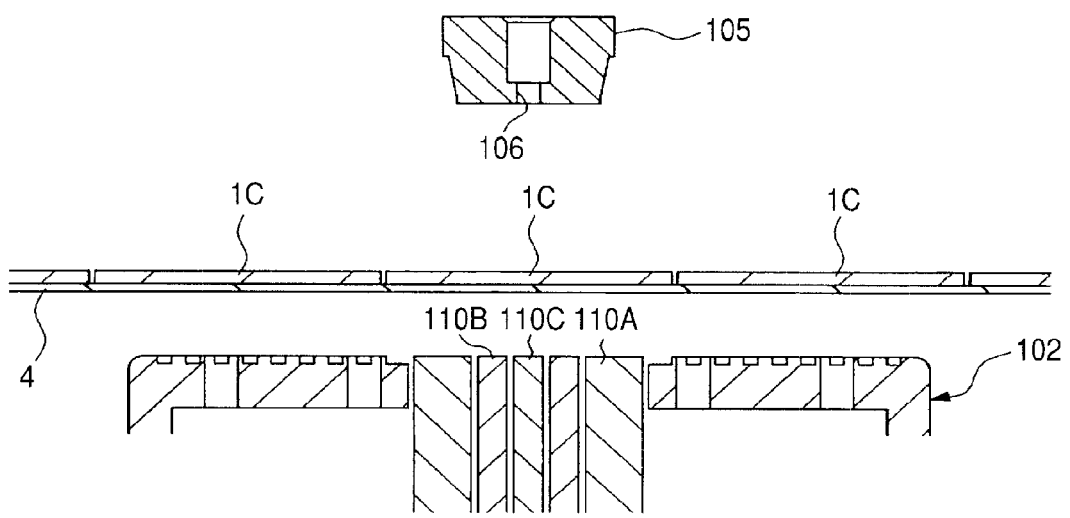
FIG. 12 is an enlarged sectional view of an area in proximity to the upper face of a vacuum chuck piece, explaining a method for unsticking a semiconductor chip.

To unstick a chip 1C from the dicing tape 4 using the chip unsticking apparatus 100 equipped with the above-mentioned vacuum chuck piece 102, the following procedure is taken: as illustrated in FIG. 12, the central portion (first block 110A, second block 110B, and third block 110C) of the vacuum chuck piece 102 is moved to directly under one chip 1C to be unstuck (the chip 1C positioned in the center of the drawing); at the same time, a vacuuming collet 105 is moved to above this chip 1C. The vacuuming collet 105 supported by a transferring mechanism (not shown) is provided in the center of its bottom face with a vacuum chuck hole 106 whose interior is depressurized. The vacuuming collet is so constructed that it is capable of selectively vacuuming and holding only one chip 1C to be unstuck.

Figure 13:
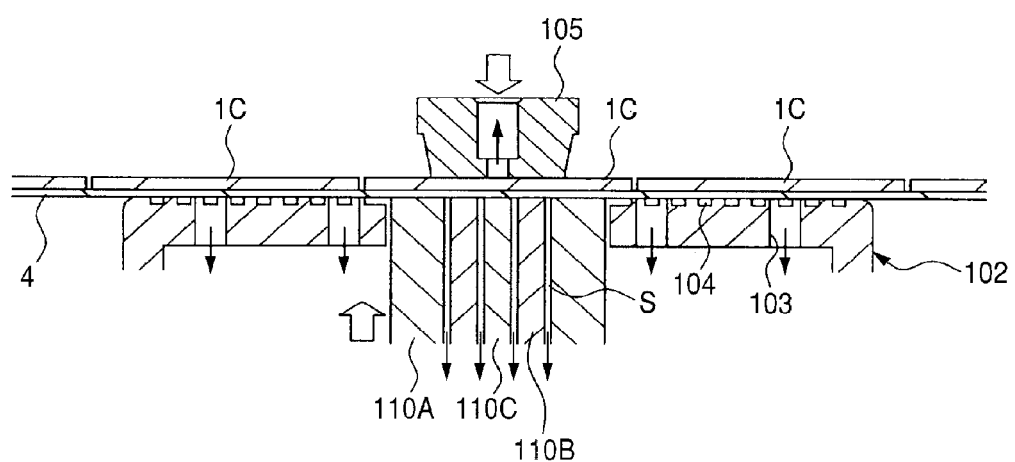
FIG. 13 is an enlarged sectional view of an area in proximity to the upper face of a vacuum chuck piece, explaining a method for unsticking a semiconductor chip.

Next, as illustrated in FIG. 13, the vacuum chuck piece 102 is moved up to bring its upper face into contact with the rear surface of the dicing tape 4, and further the interior of the above-mentioned vacuum ports 103, grooves 104, and gaps (S) is depressurized. As a result, the dicing tape 4 in contact with the chip 1C to be unstuck is brought into tight contact with the upper faces of the first block 110A, second block 110B, and third block 110C. In addition, the dicing tape 4 in contact with other chips 1C adjacent to this chip 1C is brought into tight contact with the peripheral portion of the upper face of the vacuum chuck piece 102. At this time, the vacuum chuck piece 102 is slightly (e.g., 400 μm or so) is plunged up. Thus, tension can be further applied to the dicing tape 4 to which tension has been horizontally applied by the above-mentioned retaining plate 7 and expand ring 8. Therefore, the vacuum chuck piece 102 and the dicing tape 4 can be more reliably brought into tight contact with each other.

At substantially the same time as the ascent of the vacuum chuck piece 102, the vacuuming collet 105 is moved down to bring the bottom face of the vacuuming collet 105 into contact with the upper face of the chip 1C to be unstuck. Thus, the chip 1C is vacuumed with a suction force of 80 kPa or so and the chip 1C is lightly held down. By vacuuming the chip 1C upward using the vacuuming collet 105 when the dicing tape 4 is vacuumed downward using the vacuum chuck piece 102, as mentioned above, the following can be implemented: the separation between the dicing tape 4 and the chip 1C by plunging up the first block 110A, second block 110B, and third block 110C can be facilitated.

Figure 14:
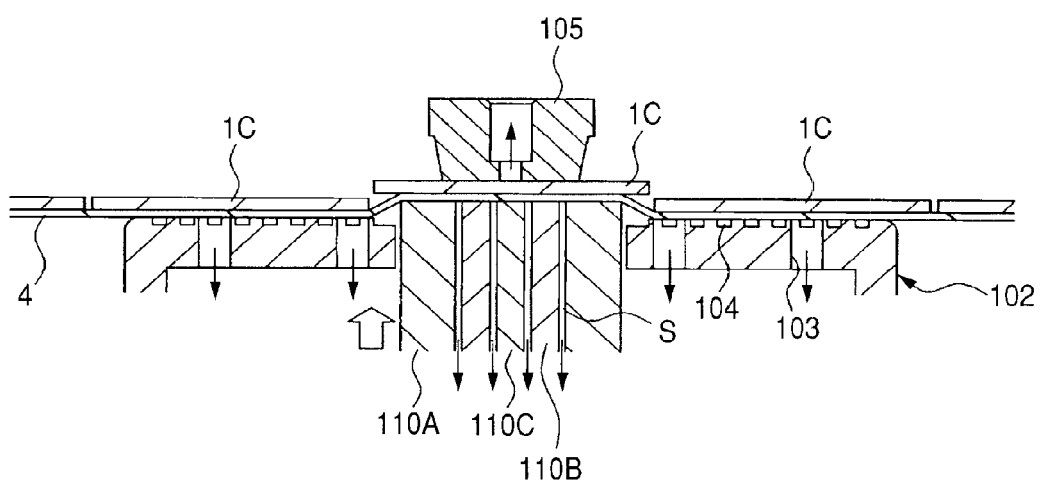
FIG. 14 is an enlarged sectional view of an area in proximity to the upper face of a vacuum chuck piece, explaining a method for unsticking a semiconductor chip.
Figure 15:
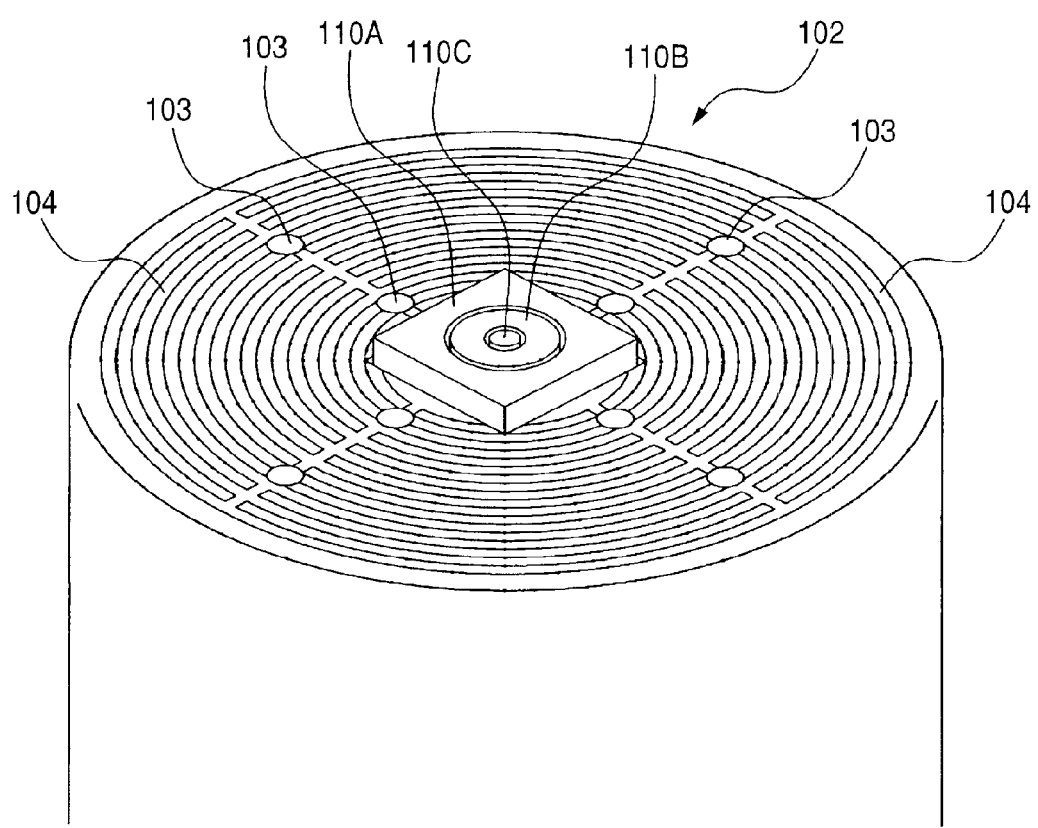
FIG. 15 is an enlarged perspective view of an area in proximity to the upper face of a vacuum chuck piece, explaining a method for unsticking a semiconductor chip.

Next, as illustrated in FIG. 14, the three blocks, the first block 110A, second block 110B, and third block 110C are simultaneously plunged up to apply upward load to the rear surface of the dicing tape 4 and push up the chip 1C and the dicing tape 4. At this time, the rear surface of the chip 1C is supported by the upper faces (contact faces) of the first block 110A, second block 110B, and third block 110C through the dicing tape 4 to lessen the bending stress exerted on the chip 1C. Further, the periphery (corners) of the upper face of the first block 110A is disposed inside the periphery of the chip 1C. Stress for separating the chip 1C and the dicing tape 4 is thereby concentrated on the interface between them where the separation starts, and the circumferential portion of the chip 1C is efficiently unstuck from the dicing tape 4. At this time, the dicing tape 4 positioned under other chips 1C adjacent to the chip 1C to be unstuck is vacuumed downward to bring it into tight contact with the peripheral portion of the upper face of the vacuum chuck piece 102. Thus, separation of the dicing tape 4 at the circumferential portion of the chip 1C can be facilitated. FIG. 15 is an enlarged perspective view of an area in proximity to the upper face of the vacuum chuck piece 102. (The chip 1C or the dicing tape 4 is not shown.)

The plunging amount (stroke) of each of the first block 110A, second block 110B, and third block 110C is, for example, 0.4 mm or so. The stroke may be varied depending on the angle required for separation. The adhesive compound applied to the dicing tape 4 differs in adhesive force from manufacturer to manufacturer or from product class to product class. Therefore, when an adhesive compound high in adhesive force is used, it is required to increase the plunging amount to ensure an angle required for separation even though the chips 1C are identical in size.

When the first block 110A, second block 110B, third block 110C are plunged up to apply load to the rear surface of the chip 1C, it is desirable to take the following measure: at the extreme peripheral portion of the chip 1C, the bending stress in a direction orthogonal to the periphery of the chip is made smaller than the bending stress in a direction parallel with the periphery of the chip. At the extreme peripheral portion of a chip 1C, there remains a fine crack produced when the wafer 1W is diced using the above-mentioned dicing blade 6. For this reason, if high bending stress is applied to the extreme peripheral portion of the chip 1C in a direction orthogonal to the periphery of the chip 1C when the first block 110A, second block 110B, and third block 110C are plunged up, a crack can grow to break the chip 1C. In the first embodiment, the first block 110A whose upper face slightly smaller in size than the chip 1C is used to evenly apply load slightly inside the extreme peripheral portion of the chip 1C. Therefore, this problem can be avoided, and further the entire circumferential portion of the chip 1C can be evenly unstuck from the dicing tape 4.

Figure 16:
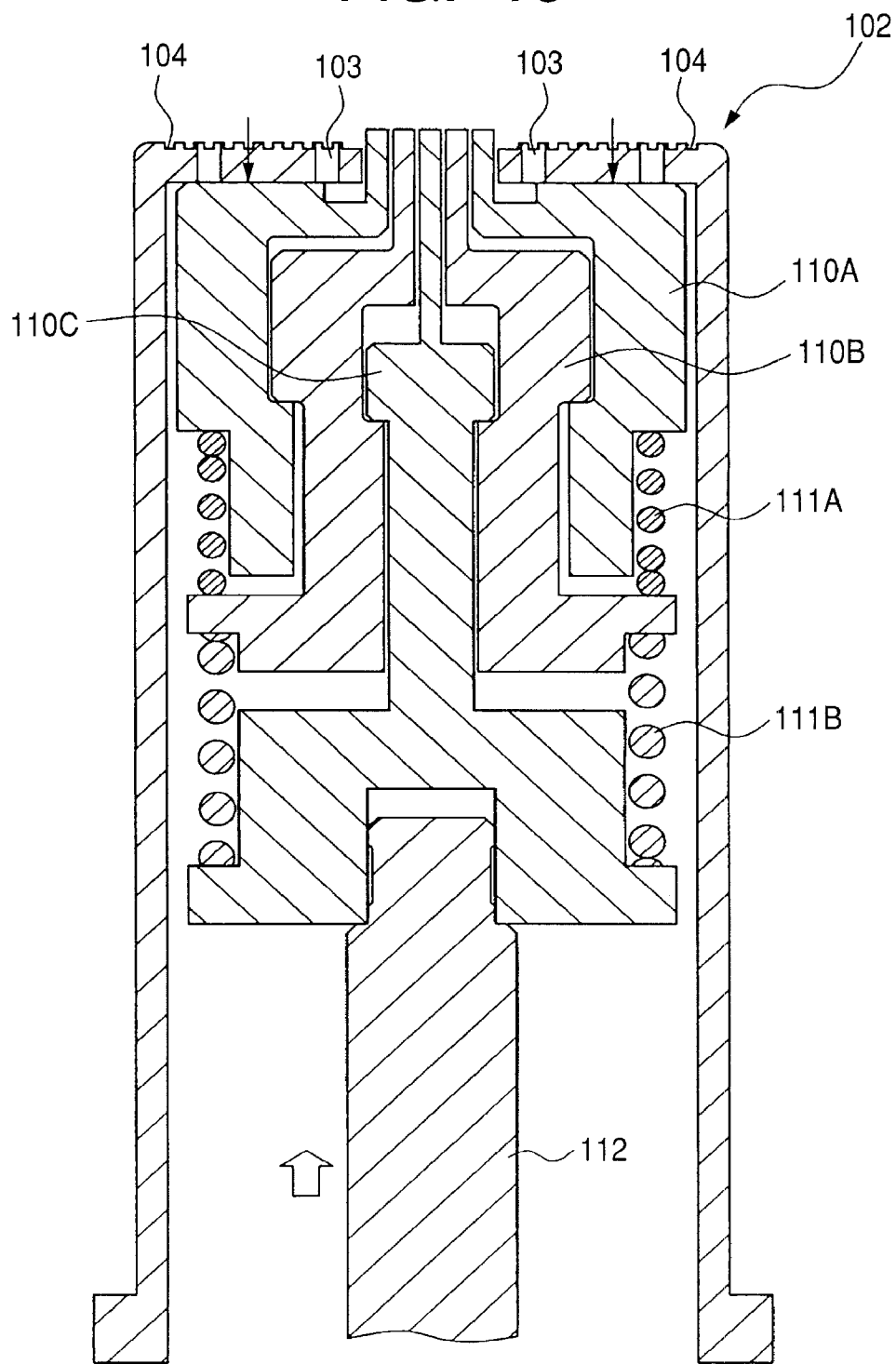
FIG. 16 is a sectional view of a vacuum chuck piece, explaining a method for unsticking a semiconductor chip.

To simultaneously plunge up the three blocks, the first block 110A, second block 110B, and third block 110C, the pusher 112 is pushed upward to push up the third block 110C, positioned inside, coupled with the pusher 112 as illustrated in FIG. 16. Thus, the second block 110B positioned in the middle is pushed up by spring force from the helical compression spring 111B placed between the third block 110C positioned inside and the second block 110B positioned in the middle. Further, the first block 110A positioned outside is pushed up by spring force from the helical compression spring 111A placed between the first block 110A positioned outside and the second block 110B positioned in the middle. As a result, the three blocks, the first block 110A, second block 110B, and third block 110C are simultaneously pushed up. When part (surface indicated by arrows in the drawing) of the first block 110A positioned outside is brought into contact with the peripheral portion of the vacuum chuck piece 102, the ascent of the first block 110A, second block 110B, and third block 110C is stopped. At this time, the most part of the chip 1C to be unstuck is supported by the upper faces of the three blocks, the first block 110A, second block 110B, and third block 110C. In the area outside the periphery (corners) of the upper face of the first block 110A, separation efficiently proceeds in the interface between the chip 1C and the dicing tape 4.

When the three blocks, the first block 110A, second block 110B, and third block 110C are simultaneously plunged up, the pusher 112 pushes up the block 110C. At this time, the pusher pushes it up with so weak force that the helical compression spring 111A whose spring force is weak will not be compressed. Thus, after part of the first block 110A positioned outside is brought into contact with the peripheral portion of the vacuum chuck piece 102, the second block 110B positioned in the middle or the third block 110C positioned inside is not further plunged up.

The helical compression spring 111A is required to have spring force of at least such a level as to lift the first block 110A against the tension of the dicing tape 4. If the spring force of the helical compression spring 111A is lower than the tension of the dicing tape 4, the first block 110A positioned outside is not lifted even when the pusher 112 is pushed up. Therefore, the chip 1C cannot be supported any more by the upper face of the first block 110A positioned outside. In this case, sufficient stress cannot be concentrated on the starting point of separation between the chip 1C and the dicing tape 4. This can result in some problem. For example, the speed of separation may be reduced, or excessive bending stress may be applied to the chip 1C, which may be in turn broken.

Figure 17:
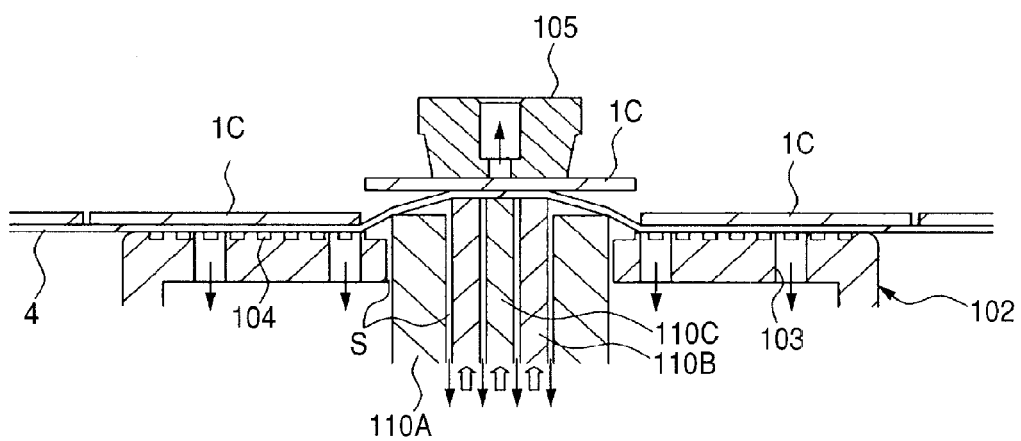
FIG. 17 is an enlarged sectional view of an area in proximity to the upper face of a vacuum chuck piece, explaining a method for unsticking a semiconductor chip.
Figure 18:
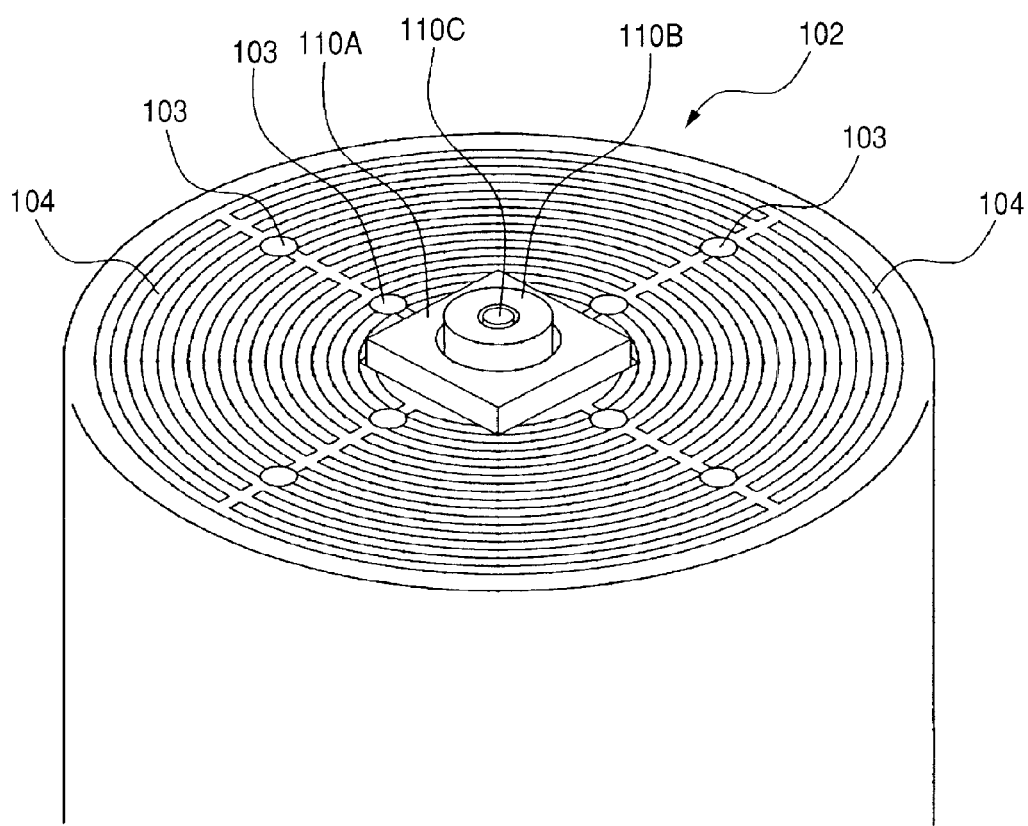
FIG. 18 is an enlarged perspective view of an area in proximity to the upper face of a vacuum chuck piece, explaining a method for unsticking a semiconductor chip.

Next, as illustrated in FIG. 17, the second block 110B positioned in the middle and the third block 110C positioned inside are simultaneously plunged up to push up the dicing tape 4. Thus, the position of the periphery (corners) of the upper face of the second block 110B supporting the chip 1C is shifted further inward as compared with the state in which it is supported by the first block 110A. As a result, the separation between the chip 1C and the dicing tape 4 proceeds from the area outside the periphery of the upper face of the second block 110B toward the center of the chip 1C. FIG. 18 is an enlarged perspective view illustrating an area in proximity to the upper face of the vacuum chuck piece 102 at this time (The chip 1C or the dicing tape 4 is not shown.)

Figure 19:
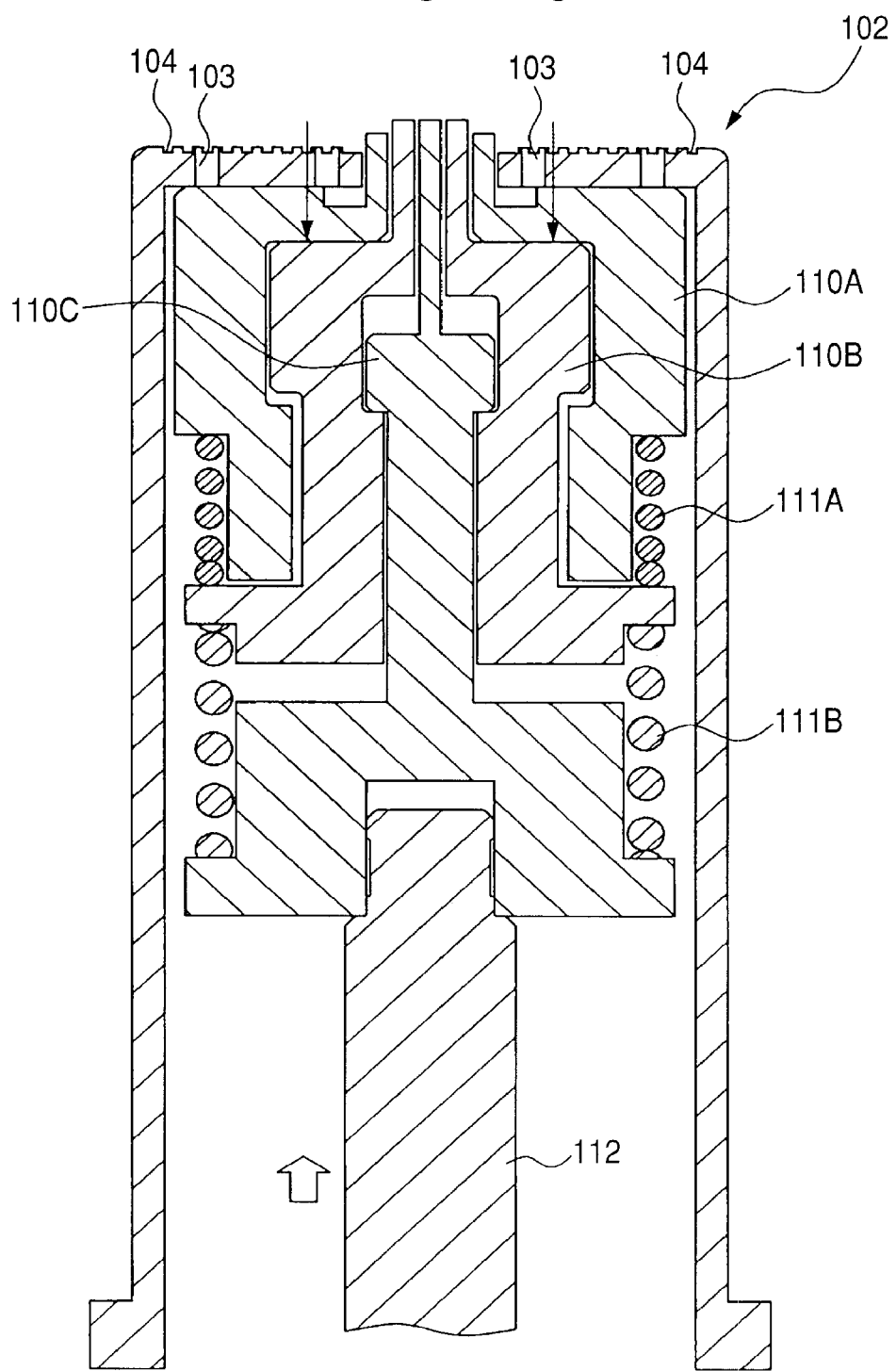
FIG. 19 is a sectional view of a vacuum chuck piece, explaining a method for unsticking a semiconductor chip.

To simultaneously plunge up the two blocks, the second block 110B and the third block 110C positioned inside, the pusher 112 is pushed up to further push up the third block 110C coupled with the pusher 112, as illustrated in FIG. 19. At this time, the second block 110B positioned in the middle is pushed up by spring force from the helical compression spring 111B. Therefore, the two blocks, the second block 110B and the third block 110C positioned inside are simultaneously pushed up. When part (surface indicated by arrows in the drawing) of the second block 110B positioned in the middle, is brought into contact with the first block 110A positioned outside, the ascent of the second block 110B and the third block 110C positioned inside is stopped. The force of the pusher 112 for pushing up the third block 110C is set to such a magnitude that the helical compression spring 111A whose spring force is weak is compressed but the helical compression spring 111B whose spring force is strong is not compressed. Thus, after part of the middle block 110B is brought into contact with the first block 110A positioned outside, the third block 110C positioned inside is not further plunged up.

When the two blocks, the second block 110B and the third block 110C positioned inside are plunged up, the following measure is taken to facilitate the separation between the chip 1C and the dicing tape 4: the interior of the gaps (S) between the first block 110A, second block 110B, and third block 110C is depressurized, and the dicing tape 4 in contact with the chip 1C is thereby vacuumed downward. Further, the interior of the grooves 104 is depressurized to bring the dicing tape 4 in contact with the peripheral portion of the upper face of the vacuum chuck piece 102 into tight contact with the upper face of the vacuum chuck piece 102. (Refer to FIG. 17.)

Figure 20:
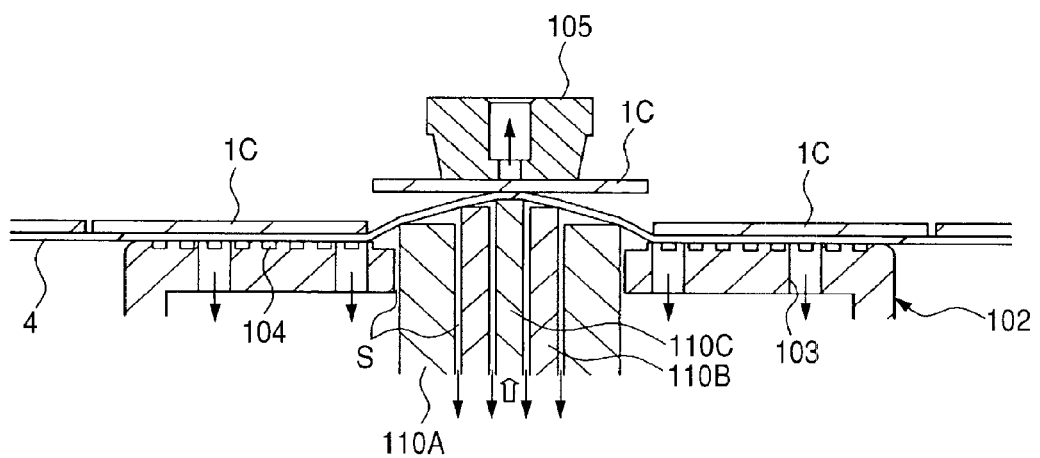
FIG. 20 is an enlarged sectional view of an area in proximity to the upper face of a vacuum chuck piece, explaining a method for unsticking a semiconductor chip.
Figure 21:
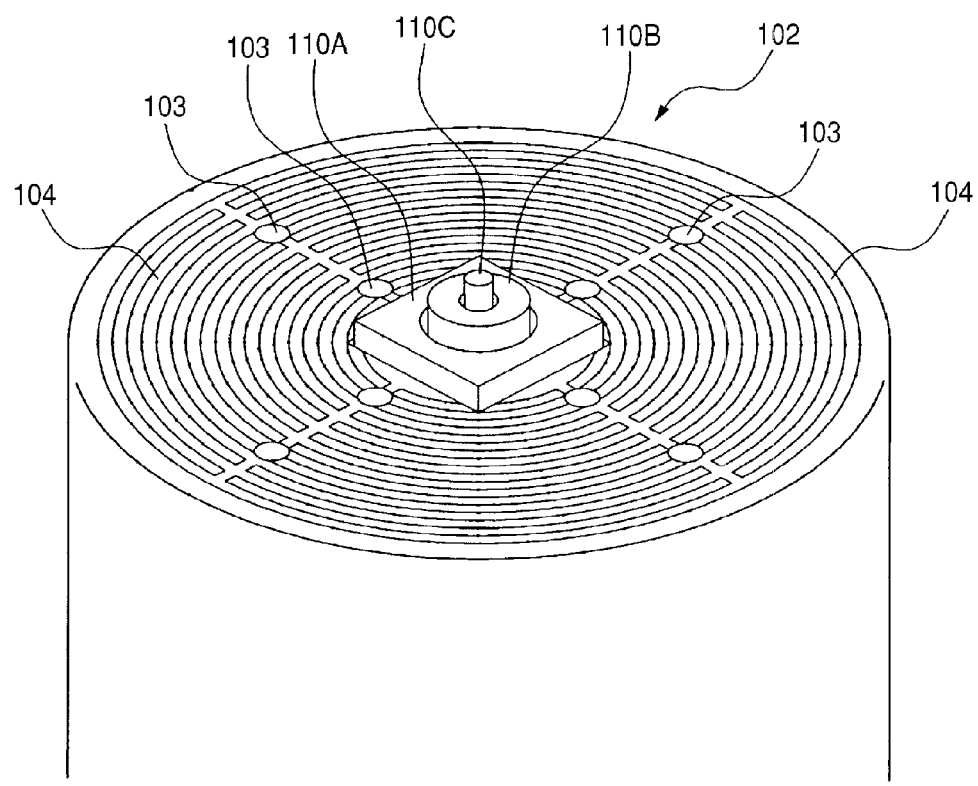
FIG. 21 is an enlarged perspective view of an area in proximity to the upper face of a vacuum chuck piece, explaining a method for unsticking a semiconductor chip.
Figure 22:
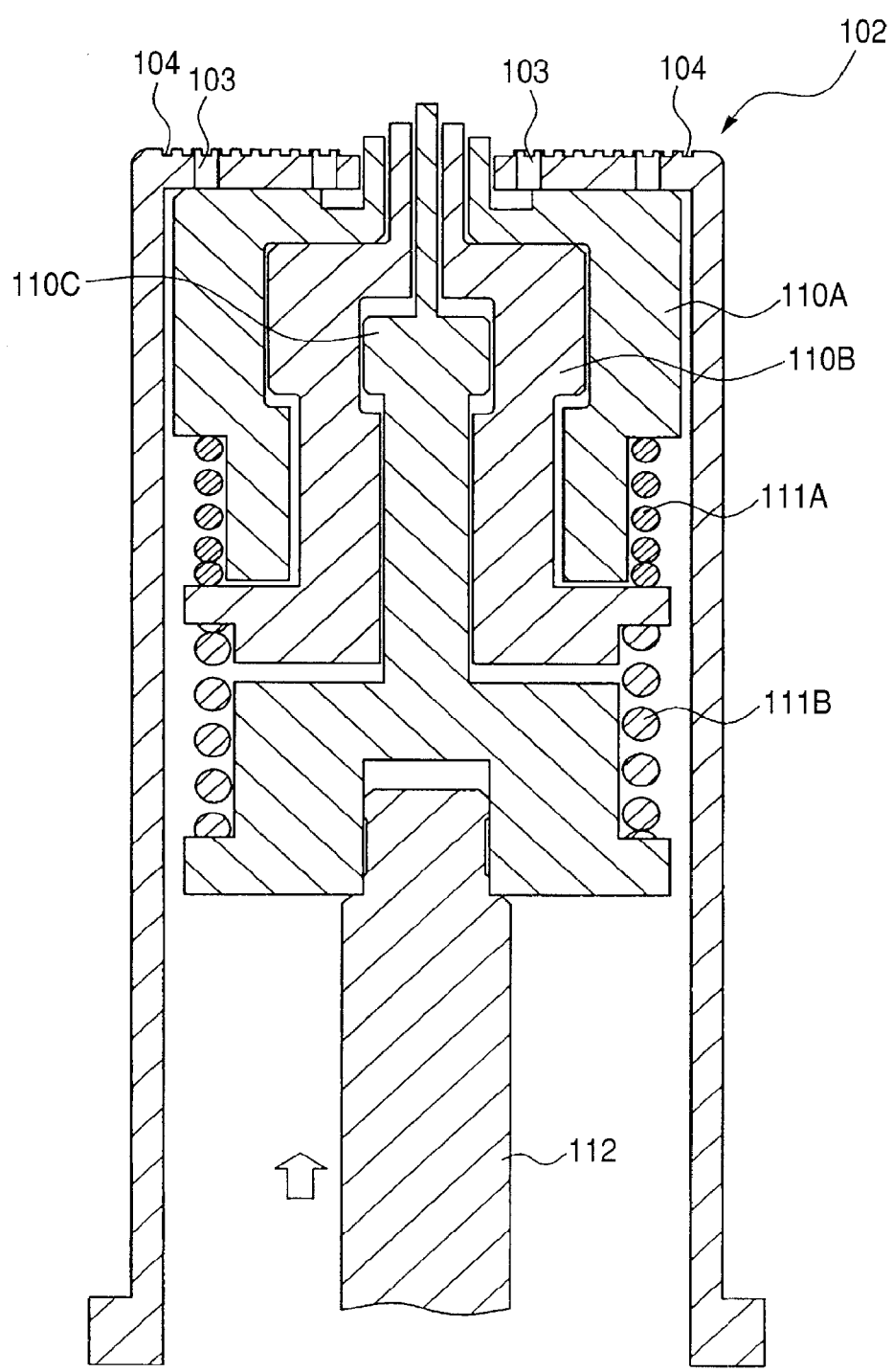
FIG. 22 is a sectional view of a vacuum chuck piece, explaining a method for unsticking a semiconductor chip.

Next, as illustrated in FIG. 20, the third block 110C positioned inside is further plunged up to push up the rear surface of the dicing tape 4 and support the rear surface of the chip 1C by the upper face of the third block 110C. FIG. 21 is an enlarged perspective view illustrating an area in proximity to the upper face of the vacuum chuck piece 102 at this time (The chip 1C or the dicing tape 4 is not shown.) To plunge up the third block 110C positioned inside, the third block 110C is pushed up by so strong force that the helical compression spring 111B is compressed, as illustrated in FIG. 22. As a result, the separation between the chip 1C and the dicing tape 4 proceeds in the area outside the periphery (corners) of the upper face of the third block 110C in contact with the dicing tape 4.

Figure 23:
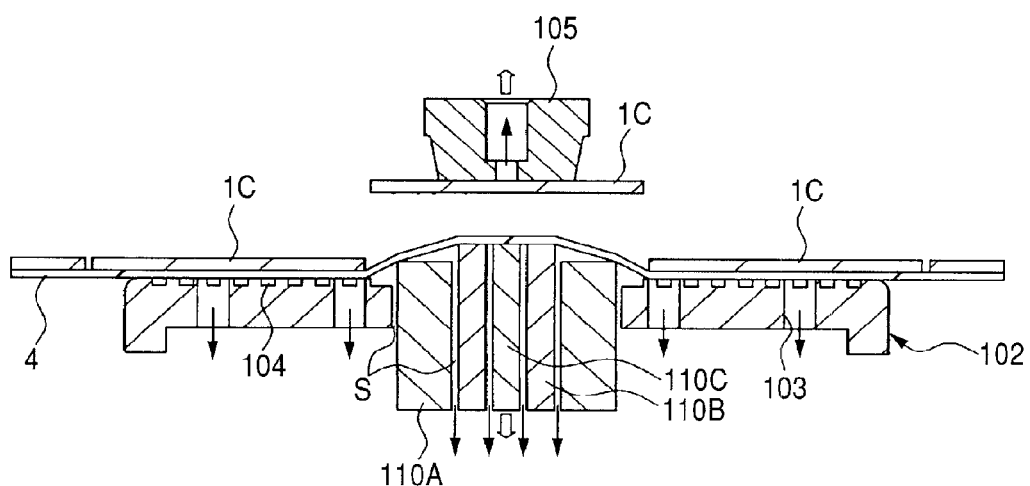
FIG. 23 is an enlarged sectional view of an area in proximity to the upper face of a vacuum chuck piece, explaining a method for unsticking a semiconductor chip.

Subsequently, as illustrated in FIG. 23, the third block 110C is pulled downward and at the same time the vacuuming collet 105 is pulled upward. This completes the operation of unsticking the chip 1C from the dicing tape 4.

The upper face of the third block 110C need be reduced in area to the extent that when the third block 110C is plunged up, the chip 1C is unstuck from the dicing tape 4 by only suction force from the vacuuming collet 105. If the area of the upper face of the third block 110C is large, the area of contact between the chip 1C and the dicing tape 4 is also large, and this increase the adhesive force between them. Therefore, the chip 1C cannot be unstuck from the dicing tape 4 by only the force of the vacuuming collet 105 for vacuuming the chip 1C.

Meanwhile, when the area of the upper face of the third block 110C is small, high load is concentratedly applied to a narrow area (central portion) of the chip 1C when the third block 110C pushes up the rear surface of the dicing tape 4. In an extreme case, the chip 1C can be broken. To cope with this, it is desirable to take the following measure to prevent high load from being applied to a narrow area in the chip 1C when the block 110c is plunged up: the plunging speed is reduced;

the time for which the upper face of the third block 110C is in contact with the dicing tape 4 is shortened; or the plunging amount (stroke) of the third block 110C is reduced (e.g., by 0.2 mm to 0.4 mm or so).

One effective method for increasing the suction force of the vacuuming collet 105 is to reduce the speed at which the vacuuming collet 105 is pulled up. If the vacuuming collet 105 is rapidly pulled up with part of the chip 1C in tight contact with the dicing tape 4, a gap is produced between the bottom face of the vacuuming collet 105 and the upper face of the chip 1C. Since the degree of vacuum in the vacuuming collet 105 is consequently reduced, the force for vacuuming the chip 1C is reduced. Meanwhile, when the speed at which the vacuuming collet 105 is pulled up is reduced, the time required to unstick the chip 1C from the dicing tape 4 is lengthened. Consequently, it is advisable to take the following measure: the speed at which the vacuuming collet 105 is pulled up is made variable; when pull-up is started, the pull-up speed is lowered to ensure sufficient suction force; and when the area of contact between the chip 1C and the dicing tape 4 is reduced to some extent, the pull-up speed is increased to prevent the unsticking time from being lengthened. Making the area of the bottom face of the vacuuming collet 105 larger than the area of the upper face of the third block 110C is another effective method for increasing the suction force of the vacuuming collet 105.

By increasing the suction force of the vacuuming collet 105 as mentioned above, the following can be implemented: even when the area of contact between the chip 1C and the dicing tape 4 is relatively large, the chip 1C can be unstuck from the dicing tape 4 by only the suction force of the vacuuming collet 105. Therefore, the unsticking time can be shortened and further the above problem that will occur if the area of the upper face of the third block 110C is reduced can be avoided.

When the third block 110C is pulled down with the chip 1C held down by the vacuuming collet 105, the vacuuming collet 105 is also moved downward. Therefore, there is the possibility that the chip 1C is hit against the third block 110C and broken. When the third block 110C is pulled down, to cope with this, it is desirable to pull down the vacuuming collet 105 immediately before or fix the position of the vacuuming collet 105 at least so that it will not be moved downward.

Figure 24:
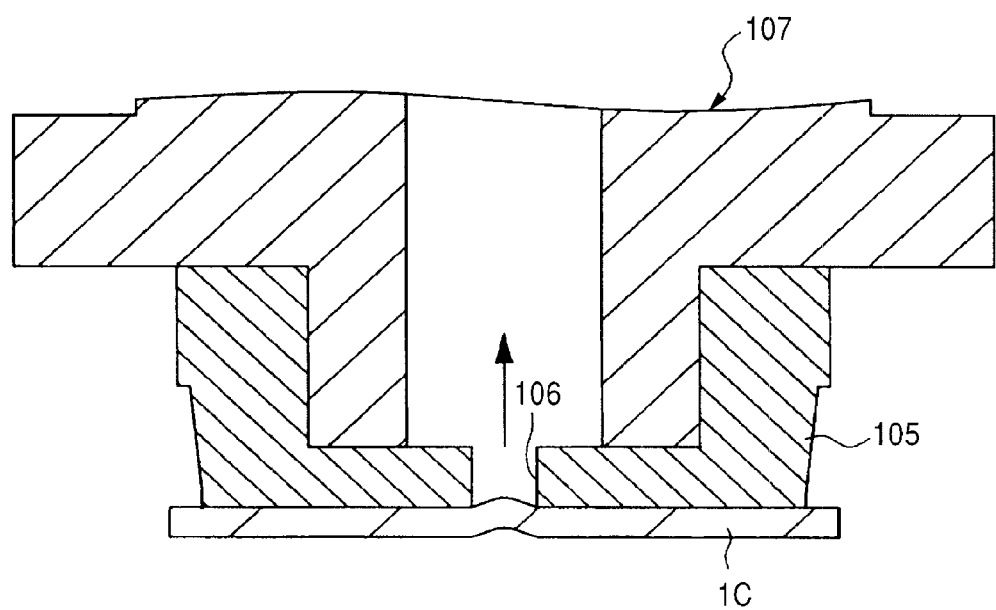
FIG. 24 is a sectional view of a substantial part, illustrating warpage in a semiconductor chip vacuum chucked by a vacuuming collet.
Figure 25:
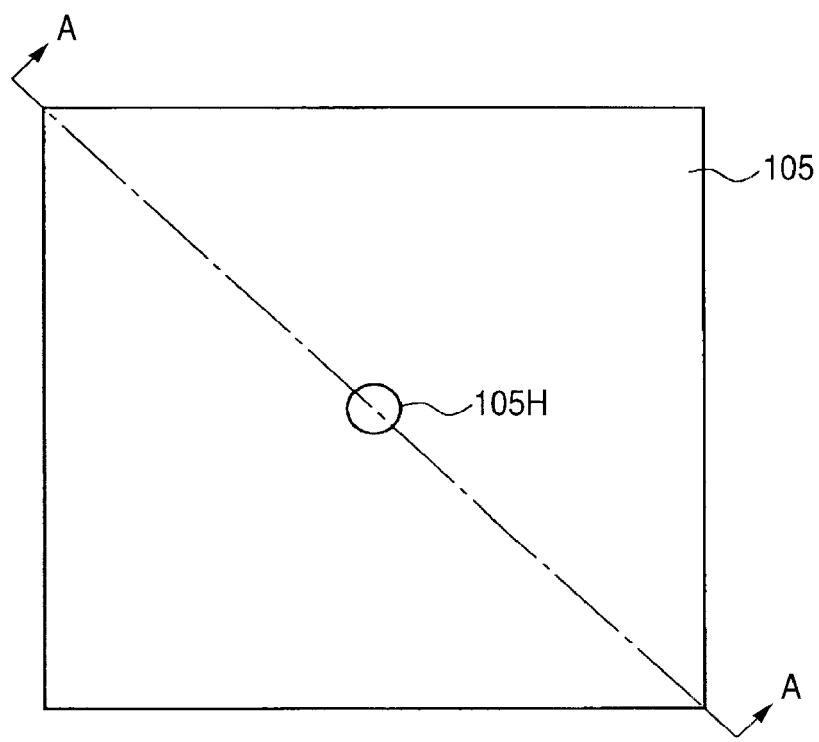
FIG. 25 is a plan view illustrating the vacuuming face of the vacuuming collet illustrated in FIG. 24.
Figure 26:
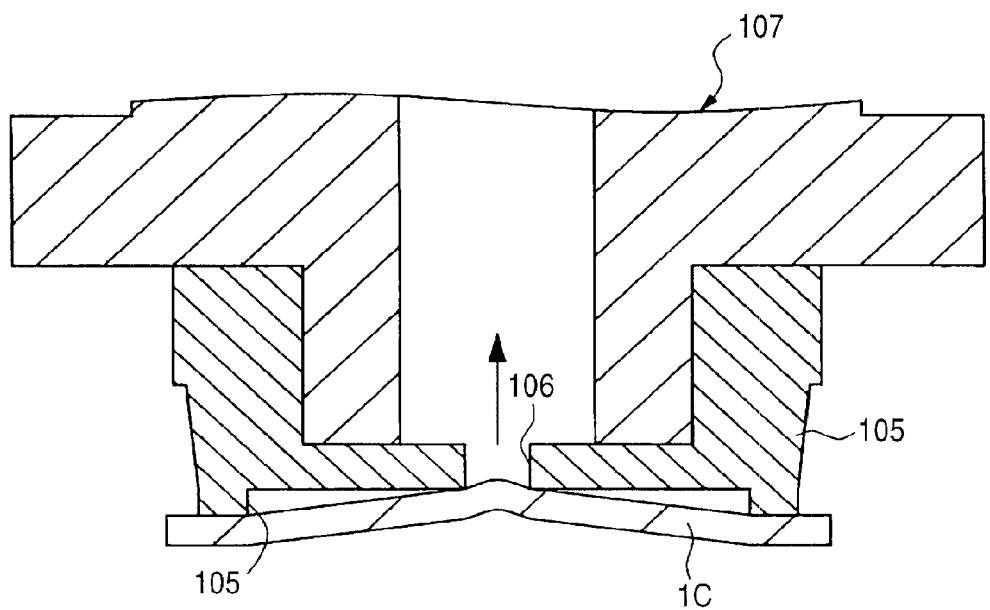
FIG. 26 is a sectional view of a substantial part, illustrating warpage in a semiconductor chip vacuum chucked by a vacuuming collet.
Figure 27:
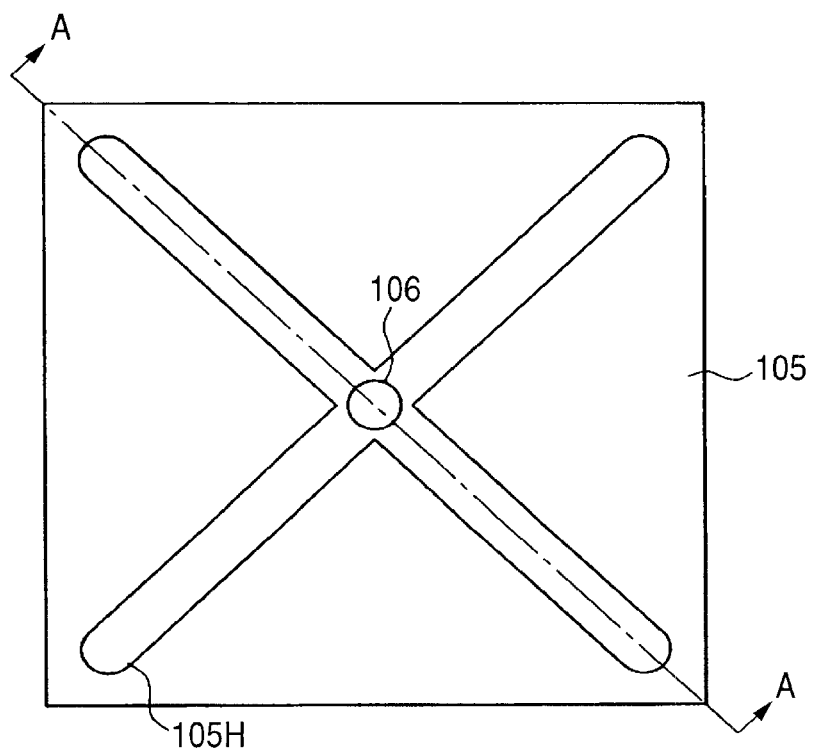
FIG. 27 is a plan view illustrating the vacuuming face of the vacuuming collet illustrated in FIG. 26.
Figure 28:
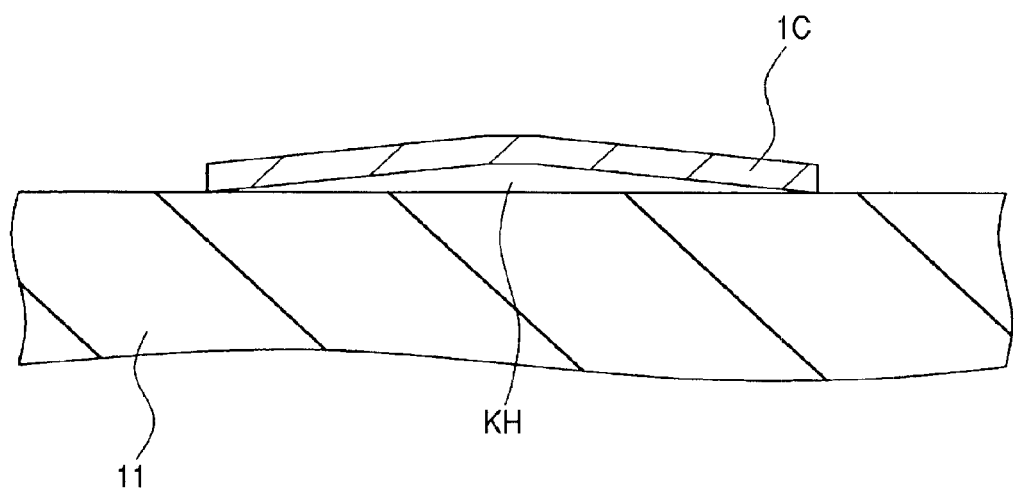
FIG. 28 is a sectional view of a substantial part, explaining a void formed between a semiconductor chip and a wiring substrate.

As mentioned above, the chip 1C is as thin as approximately 100 μm or less. Especially, when it is as thin as 75 μm or less, it is likely to be warped by the suction force of the vacuuming collet 105 after it is unstuck from the dicing tape 4 by the vacuuming collet 105. FIG. 24 is a sectional view of a substantial part of a bonding head 107 including the vacuuming collet 105. It shows the chip 1C vacuumed into a vacuum chuck hole 106 formed in the vacuuming collet 105 and warped. FIG. 25 is a plan view illustrating the vacuum chuck surface (surface brought into contact with a chip 1C) of the vacuuming collet 105. The section of the vacuuming collet 105 illustrated in FIG. 24 corresponds to a section taken along line A-A of FIG. 25. FIG. 26 and FIG. 27 respectively illustrate a section and a plane of a vacuuming collet 105 of such structure that its vacuum chuck surface is provided with grooves 105H in addition to the vacuum chuck hole 106. When the vacuum chuck surface is provided with such a groove 105H, a chip 1C is also vacuumed into the groove 105H and warped. If such a warped chip 1C is placed and mounted (bonded) over a wiring substrate 11 by the vacuuming collet 105, it is mounted over the wiring substrate 11 as is warped. This can form a void (air bubble) KH between the chip 1C and the wiring substrate 11. Especially, when DAF is used as adhesive as in the first embodiment, a void is prone to be formed. With such a void KH formed, a mount (adhesion) failure occurs in the chip 1C. In this case, there is the possibility that in a subsequent step (e.g., plastic molding step) or the like involving heat, a chip 1C is broken away from the wiring substrate 11 by expansion of the void KH or the like.

Figure 29:
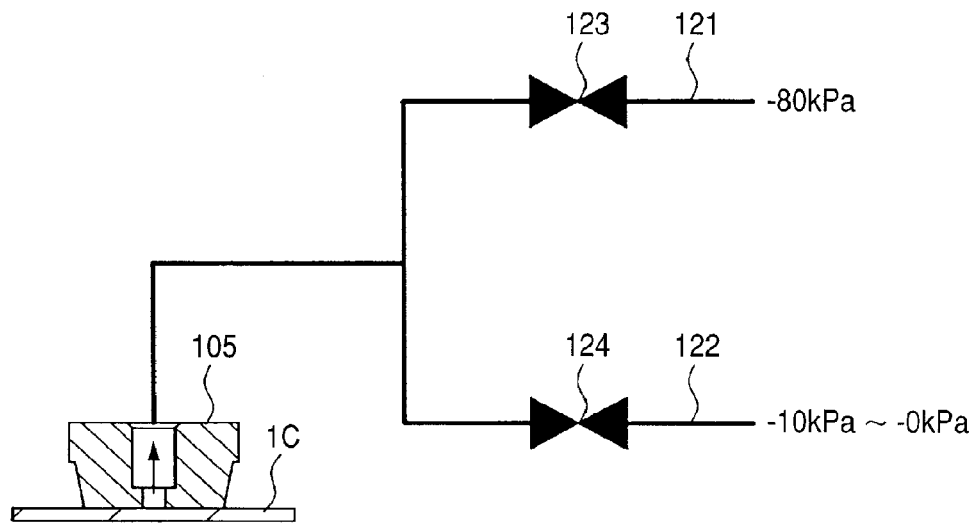
FIG. 29 is an explanatory drawing illustrating an example of a vacuum supply line for supplying reduced pressure to a vacuuming collet.

To cope with this, the following measure is taken in the first embodiment: a vacuum supply line that connects to the vacuum chuck hole 106 formed in the bottom face of the vacuuming collet 105 and supplies the vacuuming collet 105 with reduced pressure for vacuum chucking a chip 1C is constructed of two systems illustrated in FIG. 29. More specific description will be given. The first embodiment is so constructed that the following pipes are connected to the vacuuming collet 105: a pipe (first vacuum supply system) 121 for supplying the vacuuming collet 105 with a vacuum (−80 kPa or so) that provides suction force (first suction force) when a chip 1C is unstuck from a dicing tape 4 and transported to a mounting position on a wiring substrate 11; and a pipe (second vacuum supply system) 122 for supplying the vacuuming collet 105 with a vacuum that provides suction force (second suction force) when a chip 1C is mounted over a wiring substrate 11. In the first embodiment, the intensity of a vacuum supplied through the pipe 122 only has to be sufficient to prevent a chip 1C from being warped and a chip 1C from dropping from the vacuuming collet 105. For example, it is −10 kPa to 0 kPa or so, preferably, −1 kPa to 0 kPa or so. When the thickness of a chip 1C is approximately 75 μm or above, for example, the intensity of a vacuum is preferably −5 kPa to 0 kPa or so. The pipes 121, 122 respectively have valves 123, 124 such as electromagnetic valves installed therein. The intensity of a vacuum (suction force) supplied to the vacuuming collet 105 can be controlled by opening or closing these valves 123, 124.

When a chip 1C is unstuck from a dicing tape 4 and transported to a mounting position on a wiring substrate 11, the following operation is performed: the valve 123 is opened and the valve 124 is closed, and the vacuuming collet 105 is thereby supplied with a vacuum (−80 kPa or so) that provides suction force when the chip 1C is unstuck from the dicing tape 4 and transported to the mounting position on the wiring substrate 11. Though this causes the above-mentioned warpage in the chip 1C, it can be eliminated by taking the following measure: immediately after the chip 1C is transported to the mounting position on the wiring substrate 11, the valve 123 is closed and the valve 124 is opened. Thus, the force of the vacuuming collet 105 for vacuuming the chip 1C is reduced, and the warpage caused in the chip 1C can be eliminated. By mounting a chip 1C over a wiring substrate 11 after warpage is eliminated as mentioned above, the formation of the above-mentioned void KH can be suppressed. (Refer to FIG. 28 for the void KH.) Thus, it can be possible to prevent a chip 1C from being broken away from a wiring substrate 11 after the chip 1C is mounted.

Figure 30:
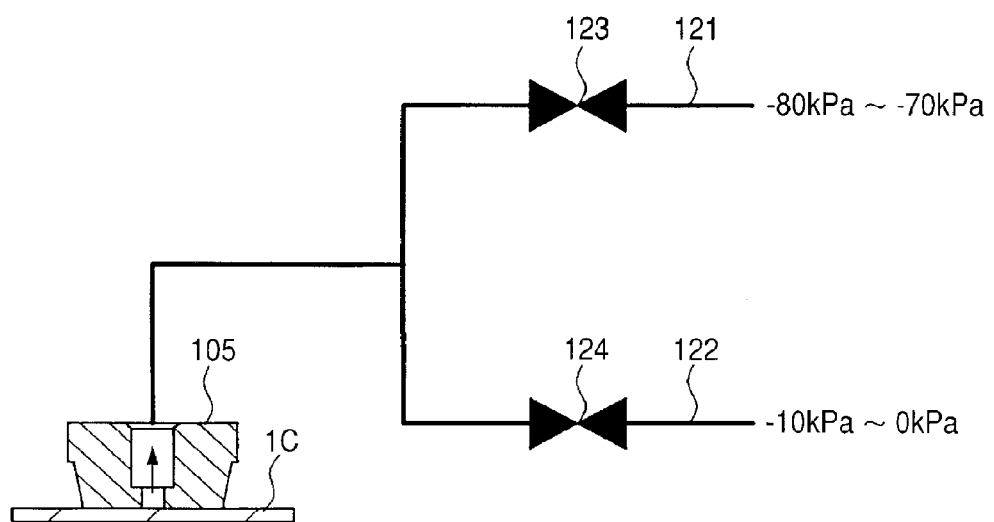
FIG. 30 is an explanatory drawing illustrating an example of a vacuum supply line for supplying reduced pressure to a vacuuming collet.

Instead, the measure illustrated in FIG. 30 may be taken. More specific description will be given. The intensity of a vacuum supplied through the pipe 121 is reduced by the amount equivalent to the intensity of a vacuum supplied through the pipe 122. When a chip 1C is unstuck from a dicing tape 4 and transported to a mounting position on a wiring substrate 11, both the valves 123, 124 are opened. Thus, the vacuuming collet 105 is supplied with a vacuum (−80 kPa or so) that provides suction force when the chip 1C is unstuck from a dicing tape 4 and transported to the mounting position on the wiring substrate 11. Immediately after the chip 1C is transported to the mounting position on the wiring substrate 11, the same construction as illustrated in FIG. 29 is obtained and warpage caused in the chip 1C can be eliminated by closing only the valve 123.

The chip 1C unstuck from the dicing tape 4 as mentioned above is vacuumed and held by the vacuuming collet 105 and transported to the next step (pellet bonding step). When the vacuuming collet 105 that transported the chip 1C to the next step comes back to the chip unsticking apparatus, the next chip 1C is unstuck from the dicing tape 4 following the procedure illustrated in FIG. 12 to FIG. 23. Thereafter, chips 1C are unstuck from the dicing tape 4 one by one, following the same procedure.

Figure 31:
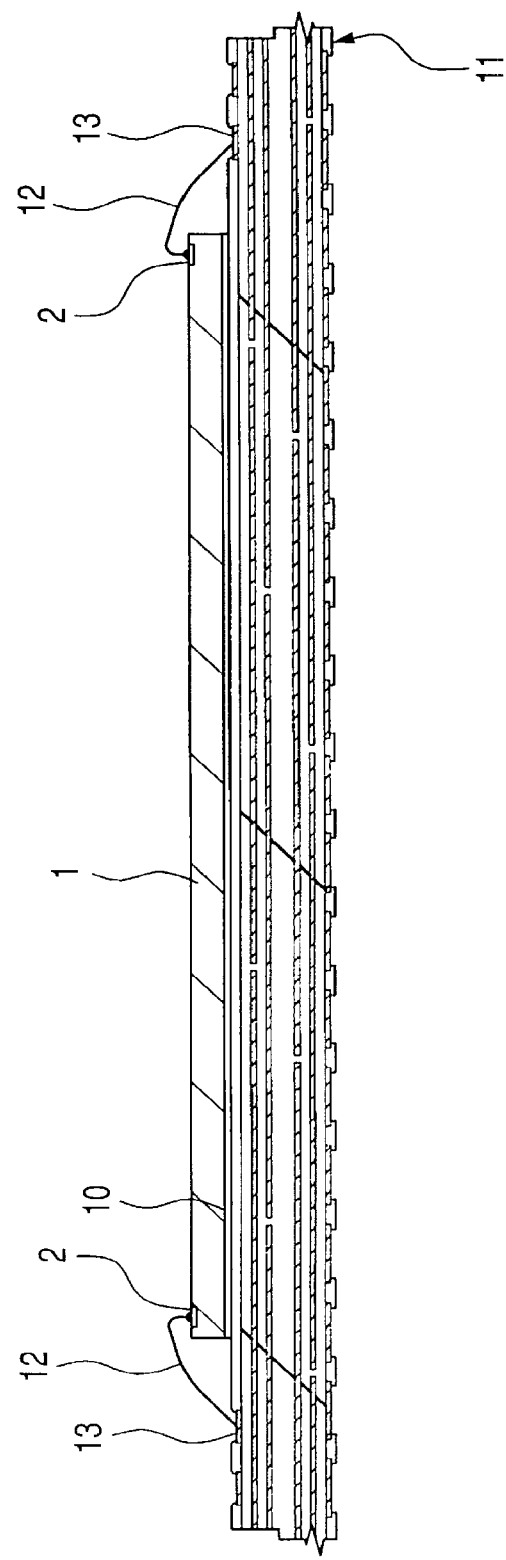
FIG. 31 is a sectional view of a wiring substrate, illustrating a pellet bonding step for a semiconductor chip.

Next, as illustrated in FIG. 31, the chip 1C transported to the pellet bonding step is mounted in a mounting position (chip mounting area) on a wiring substrate (mounting board) 11 through DAF 10 stuck to its rear surface beforehand, by thermocompression. In the first embodiment, there is no warpage caused in the chip 1C at this time; therefore, a void KH can be prevented from being formed between the chip 1C and the wiring substrate 11. (Refer to FIG. 28 for the void KH.) That is, the chip 1C can be mounted (bonded) over the wiring substrate 11 with reliability. Subsequently, it is electrically connected with an electrode 13 on the wiring substrate 11 through an Au wire 12. If there is a void KH formed between the chip 1C and the wiring substrate 11 at this time, the void KH can be expanded by heat produced when the Au wire 12 is connected. This can break the chip 1C away from the wiring substrate 11. In the first embodiment, a measure is taken to prevent the formation of a void KH; therefore, a problem of the separation of the chip 1C or the like can be prevented from occurring.

Figure 32:
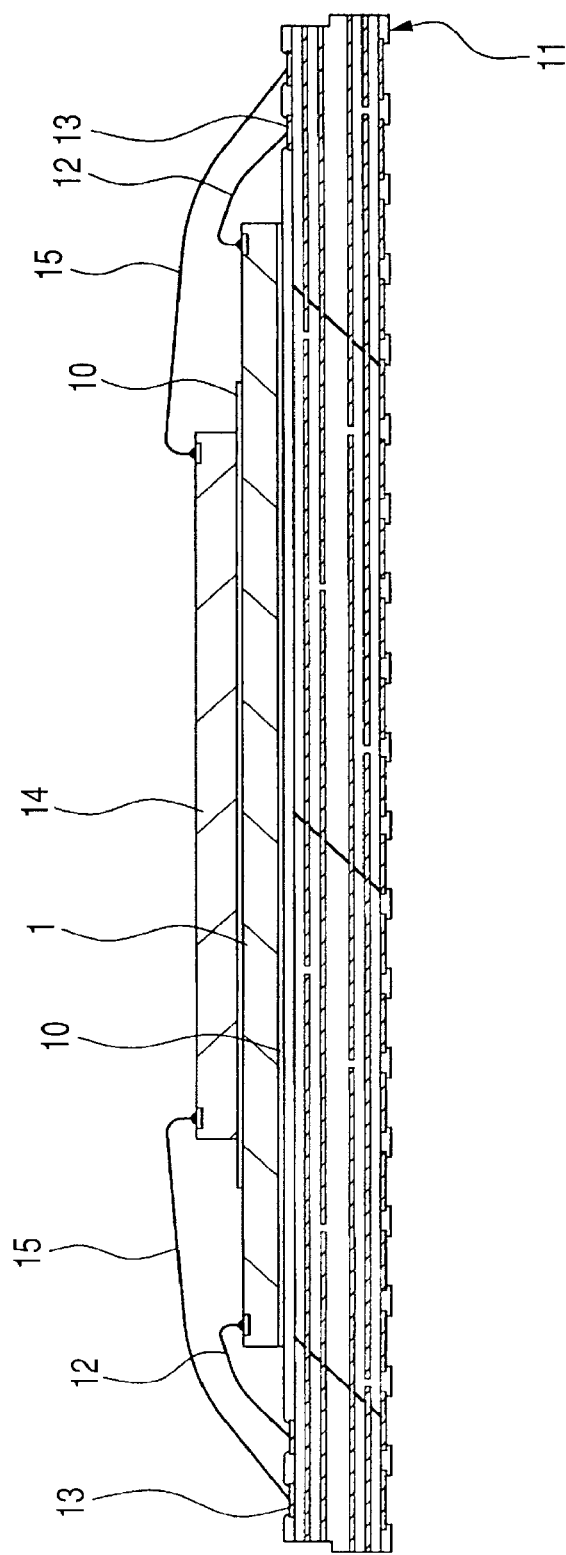
FIG. 32 is a sectional view of a wiring substrate, illustrating steps for laminating semiconductor chips and wire bonding.

Next, as illustrated in FIG. 32, a second chip 14 is laminated over the chip 1C mounted over the wiring substrate 11, through DAF 10 or the like, and it is electrically connected with an electrode 16 on the wiring substrate 11 through an Au wire 15 or the like. The second chip 14 is a silicon chip in which an integrated circuit different from that of the chip 1C is formed. The second chip is unstuck from the dicing tape 4 by the above-mentioned method, and then transported to the pellet bonding step and laminated in a mounting position (chip mounting area) over the chip 1C. In packages of such structure that chips are laminated, as mentioned above, the chips are thinned because of demands for reduction in the size and thickness of packages. Therefore, when a chip 1C and a second chip 14 are mounted, the following advantage can be brought by applying the above-mentioned method of the first embodiment: a void KH can be especially effectively prevented from being formed between the chip 1C and the wiring substrate 11 and between the second chip 14 and the chip 1C. (Refer to FIG. 28 for the void KH.)

Figure 33:
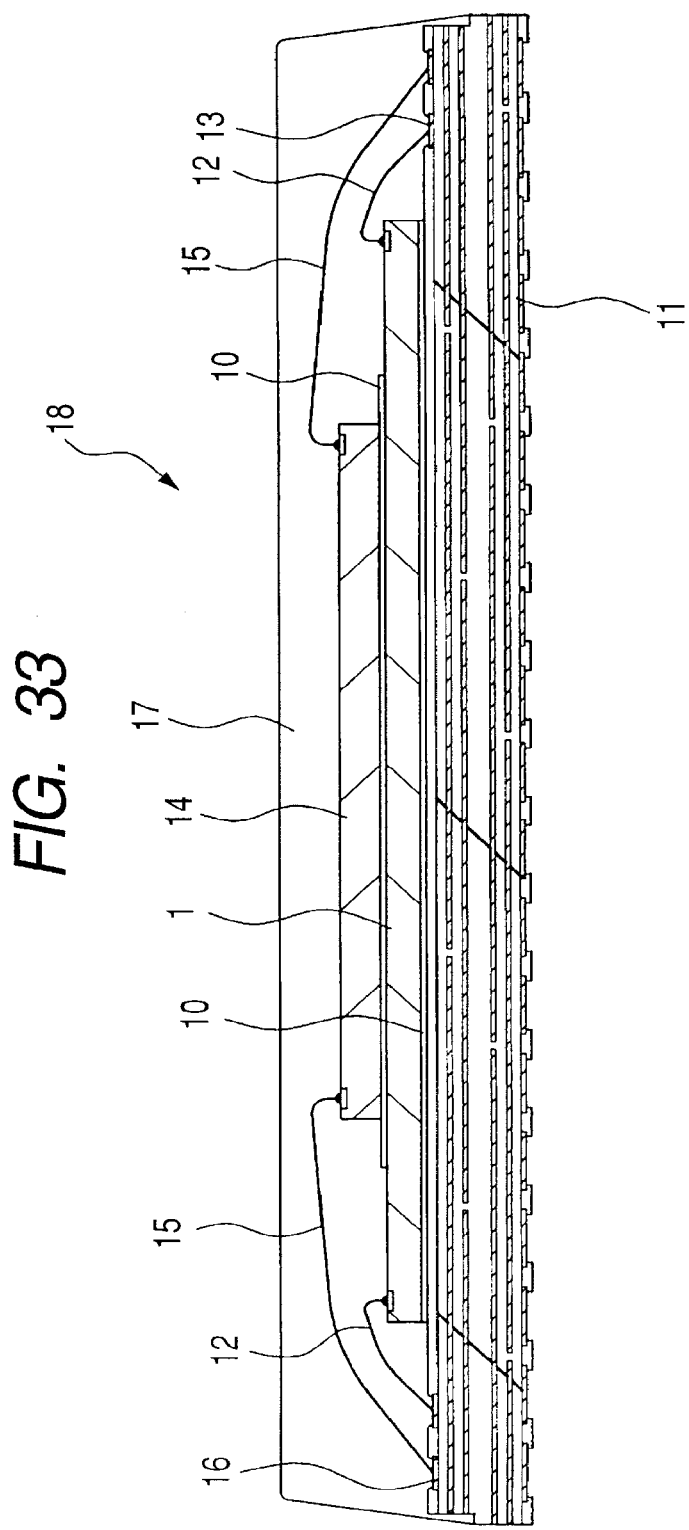
FIG. 33 is a sectional view of a wiring substrate, illustrating a step for plastic molding semiconductor chips.

Thereafter, the wiring substrate 11 is transported to a molding step. At this step, the chip 1C and the second chip 14 are sealed with molding resin 17 as illustrated in FIG. 33, and a laminate package 18 is thereby completed. In the first embodiment, a measure is taken for preventing a void KH from being formed between the chip 1C and the wiring substrate 11 and between the second chip 14 and the chip 1C. At the molding step, therefore, the following problem can be prevented from occurring: a void KH is expanded by heat used during the sealing operation, and the chip 1C and the second chip 14 are thereby separated from each other.

In the description of this embodiment, three blocks, the first block 110A, second block 110B, and third block 110C are used to unstick a chip. However, the number of blocks is not limited to three, and four or more blocks may be used when the size of a chip 1C to be unstuck is large. Or, two blocks may be used when the size of a chip 1C to be unstuck is very small.

Second Embodiment

In the second embodiment, the vacuum supply line described in relation to the first embodiment is constructed otherwise. (Refer to FIG. 29 and FIG. 30 for the vacuum supply line of the first embodiment.) The constructions of the other steps and members are the same as those in the first embodiment.

Figure 34:
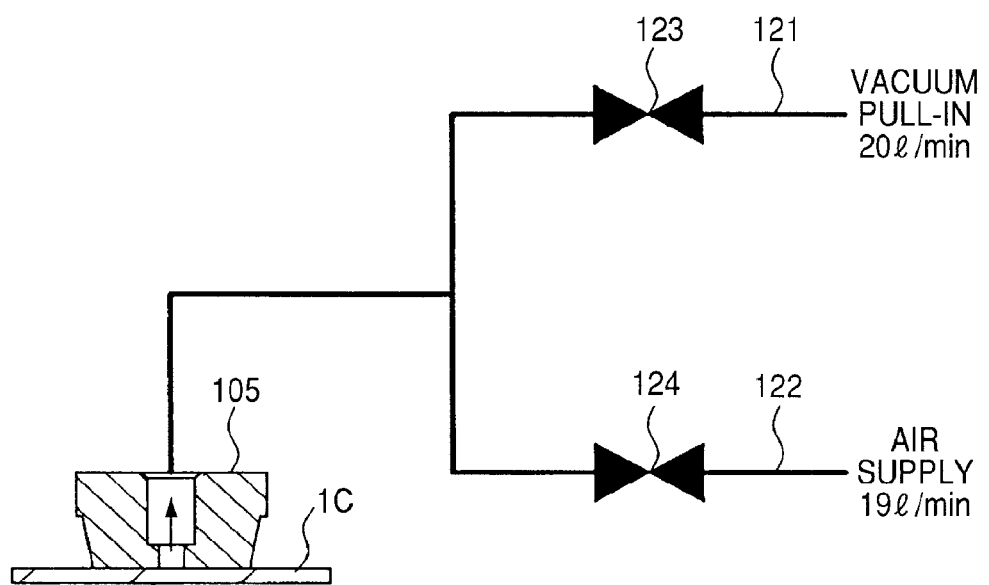
FIG. 34 is an explanatory drawing illustrating an example of a vacuum supply line for supplying reduced pressure to a vacuuming collet used in the fabrication of a semiconductor device in a second embodiment of the invention.

FIG. 34 is an explanatory drawing of a vacuum supply line for supplying reduced pressure to the vacuuming collet 105 in the second embodiment. Also, in the second embodiment, the vacuum supply line is formed of two systems. However, what is supplied through the pipe 122 is not a vacuum but air. The intensity of air supplied through the pipe (first air supply system) 122 is set so as to supply an appropriately smaller flow rate as compared with the pull-in flow rate on the vacuum side (the pipe 121) to control the vacuum pressure. When the vacuum pull-in flow rate of the pipe 121 is approximately 20 L (liters)/min, for example, air is supplied through the pipe 122 at approximately 19 L (liters)/min to reduce the vacuum pressure. When a chip 1C is unstuck from a dicing tape 4 and transported to a mounting position on a wiring substrate 11, the valve 123 is opened and the valve 124 is closed as in the first embodiment. Thus, the vacuuming collet 105 is provided with a vacuum (−80 kPa or so) that provides suction force when the chip 1C is unstuck from the dicing tape 4 and transported to the mounting position on the wiring substrate 11. Immediately after the chip 1C is transported to the mounting position on the wiring substrate 11, both the valves 123, 124 are opened. Thus, both a vacuum and air are supplied. Since the pull-in flow rate of the vacuum supplied through the pipe 121 is higher than the supply flow rate of the air supplied through the pipe 122, the vacuuming collet 105 is consequently supplied with suction force (vacuum). The intensity of suction force (vacuum) supplied to the vacuuming collet 105 at this time is sufficient to prevent warpage from being caused in the chip 1C and the chip 1C from dropping from the vacuuming collet 105. It is −10 kPa to 0 kPa or so, preferably, −1 kPa to 0 kPa or so. When the thickness of a chip 1C is approximately 75 μm or above, the intensity of suction force is preferably −5 kPa to 0 kPa or so. Thus, the force of the vacuuming collet 105 for vacuuming the chip 1C is reduced, and the warpage caused in the chip 1C can be eliminated. As a result, the formation of a void KH can be suppressed as in the first embodiment. (Refer to FIG. 28 for the void KH.) Thus, it can be possible to prevent a chip 1C from being broken away from a wiring substrate 11 after the chip 1C is mounted.

Third Embodiment

The third embodiment is so constructed that the thermocompression bonding step as the pellet bonding step for a chip 1C, described in relation to the first and second embodiments is divided into two stages: a temporary pressure bonding step for bonding only part of a chip 1C by thermocompression; and a proper pressure bonding step for bonding the whole of the chip 1C by thermocompression. This is the same with the pellet bonding step for the second chip 14.

Figure 35:
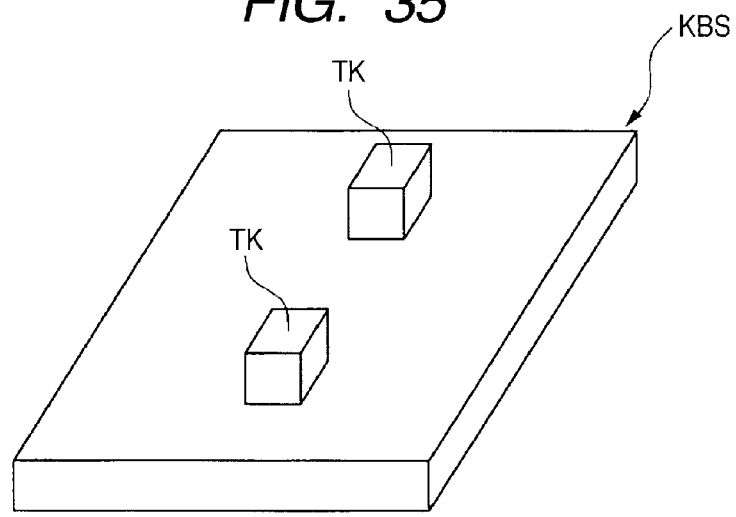
FIG. 35 is a perspective view of a substantial part of a bonding stage used in a temporary pressure bonding step for semiconductor chips in a fabrication process for a semiconductor device in a third embodiment of the invention.
Figure 36:
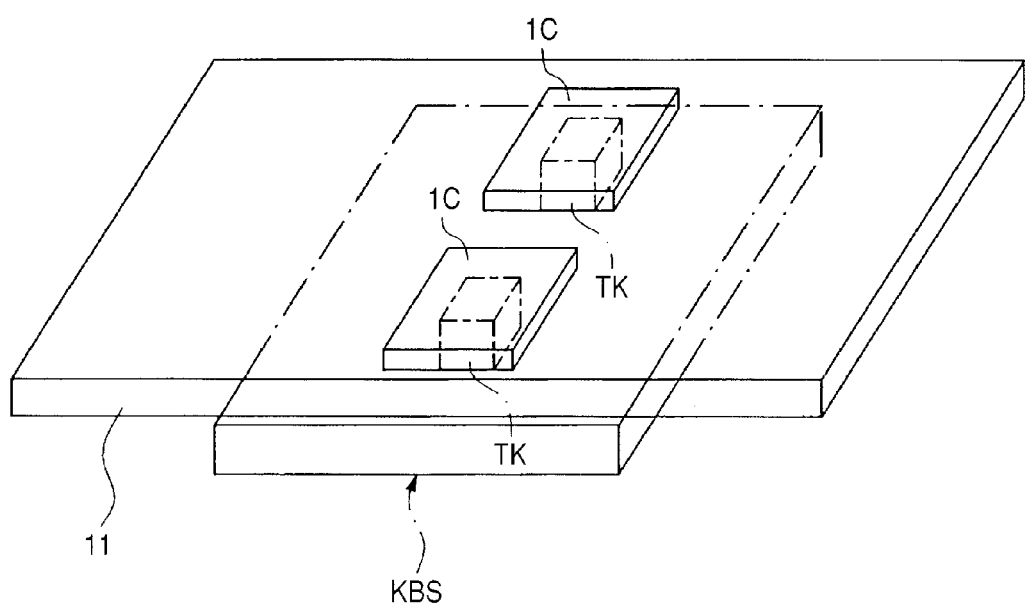
FIG. 36 is a perspective view of a substantial part illustrating the way a wiring substrate and semiconductor chips are disposed over the bonding stage illustrated in FIG. 35.

FIG. 35 is a perspective view of a substantial part of a bonding stage KBS used at the above temporary pressure bonding step. FIG. 36 is a perspective view of a substantial part illustrating the way a wiring substrate 11 and chips 1C are placed over the bonding stage KBS.

Figure 37:
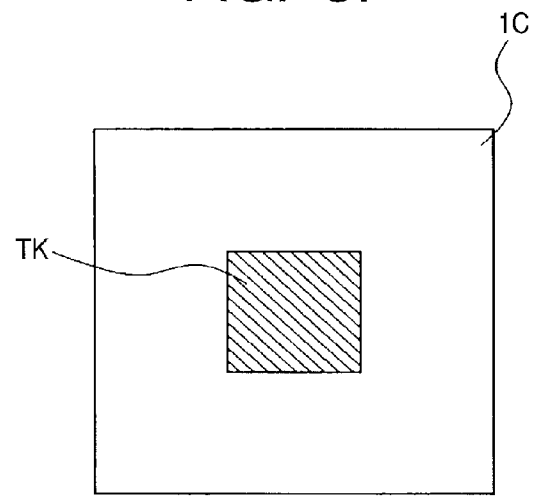
FIG. 37 is a plan view illustrating in close-up a chip disposed over the bonding stage illustrated in FIG. 35.
Figure 38:
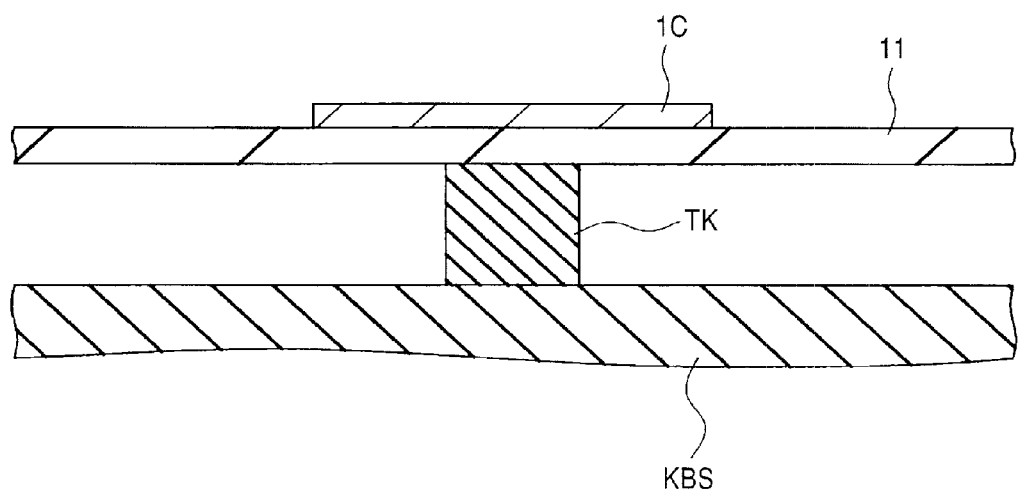
FIG. 38 is a sectional view of a substantial part illustrating in close-up an area in proximity to a projection provided on a bonding stage in a situation in which a wiring substrate and a chip are disposed over the bonding stage illustrated in FIG. 35.

The bonding stage KBS has protrusions TK on its surface opposed to the wiring substrate 11 and the chips 1C. FIG. 37 is a plan view illustrating in close-up a chip 1C placed over the bonding stage (first bonding stage) KBS. FIG. 38 is a sectional view of a substantial part illustrating in close-up an area in proximity to a protrusion (pressure applying jig) TK in a situation in which a wiring substrate 11 and a chip 1C are placed over the bonding stage KBS. As illustrated in FIG. 37 and FIG. 38, this protrusion TK applies pressure to an area (temporary pressure bonding area) in the center of the rear surface of a chip 1C through a wiring substrate 11 at the temporary pressure bonding step for the chip 1C. The area hatched in FIG. 37 refers to an area to which pressure is applied by the protrusion TK. In the third embodiment, the protrusion TK is formed beforehand so that the following is implemented: the area to which pressure is applied by the protrusion TK is 10% to 40% or so, preferably, 25% or so of the rear surface of the chip 1C. Thus, even though warpage is caused in a chip 1C by vacuum chuck by the vacuuming collet 105, the following can be implemented. (Refer to FIG. 24 for this warpage.) Pressure is concentratedly applied to the central portion of the chip 1C where a void KH is prone to be formed after the chip 1C is mounted (bonded) over the wiring substrate 11. (Refer to FIG. 28 for this void KH.) As a result, warpage caused in the chip 1C is eliminated, and the central portion is thermocompression bonded to the wiring substrate 11. That is, the formation of a void KH can be prevented. The area in the chip 1C to which load is applied at this time is the area hatched in FIG. 37, and the area is small as compared with the entire rear surface of the chip 1C. Therefore, even though a load is low as compared with cases where the entire rear surface of a chip 1C is thermocompression bonded, a sufficient load can be applied per unit area. Consequently, thermocompression bonding can be effectively carried out.

Following the above-mentioned temporary pressure bonding step, the proper pressure bonding step is carried out to bond the entire rear surface of the chip 1C to the wiring substrate 11 by thermocompression. At this proper pressure bonding step, warpage in the chip 1C has been already eliminated through the above-mentioned temporary pressure bonding step. Therefore, the entire rear surface of the chip 1C can be thermocompression bonded to the wiring substrate 11 with reliability.

The control method for the suction force of the vacuuming collet 105 for vacuuming chips 1C, described in relation to the first and second embodiments, may be combined with the above-mentioned pellet bonding step of the third embodiment. In this case, the formation of a void KH can be more effectively suppressed.

Fourth Embodiment

Figure 39:
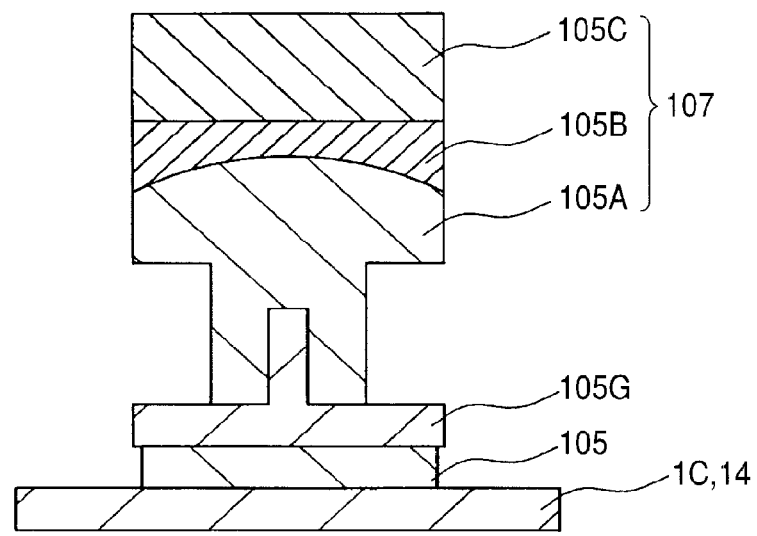
FIG. 39 is a sectional view of a substantial part, explaining the structure of a vacuuming collet used in the fabrication of a semiconductor device in a fourth embodiment of the invention.

FIG. 39 is a sectional view of a substantial part of a bonding head 107 used in the fourth embodiment.

As illustrated in FIG. 39, the bonding head 107 in the fourth embodiment is formed of: a vacuuming collet 105 that is brought into contact with the chip 1C or second chip 14, described in relation to the first embodiment, during a pellet bonding step; a collet holder 105G for holding the vacuuming collet 105; an inclination adjusting mechanism (head section) 105A on which the collet holder 105G is installed; a supporting seat (supporting seat section) 105B brought into contact with the inclination adjusting mechanism 105A; a magnet 105C that holds the head section through the supporting seat 105B by magnetic force; and the like. A support section for holding the inclination adjusting mechanism 105A is formed of the supporting seat 105B and the magnet 105C.

The inclination adjusting mechanism 105A formed of a magnetic metal, such as high-speed tool steel and alloy high-speed tool steel, has its surface, brought into contact with the supporting seat 105B, spherically machined. The supporting seat 105B is also formed of a magnetic metal, such as high-speed tool steel and alloy high-speed tool steel. It has its face (first surface) brought into contact with the inclination adjusting mechanism 105A spherically machined in agreement with the shape of the spherically machined surface (second surface) of the inclination adjusting mechanism 105A. The magnet 105C is formed of, for example, a neodymium magnet. It holds the inclination adjusting mechanism 105A through the supporting seat 105B with such magnetic force that the inclination adjusting mechanism 105A can be moved along the spherically machined surface, for example, a magnetic force of 5N or so. That is, when a force of approximately 5N or above is applied to the inclination adjusting mechanism 105A at the pellet bonding step, the inclination adjusting mechanism 105A is moved along the above-mentioned spherically machined surface. The above-mentioned spherically machined surfaces of the inclination adjusting mechanism 105A and the supporting seat 105B are formed with such a curvature that when a force of approximately 5N or above is applied to the inclination adjusting mechanism 105A, the inclination adjusting mechanism 105A can be moved.

The spherically machined surface of the inclination adjusting mechanism 105A and the spherically machined surface of the supporting seat 105B may be subjected to dimpling operation to form multiple dimples (recesses) there. This reduces the area of contact between the inclination adjusting mechanism 105A and the supporting seat 105B. As a result, the friction between them is reduced, and it is possible to easily move the inclination adjusting mechanism 105A. Also, this dimpling operation enhances the surface hardness of the spherically machined surface of the inclination adjusting mechanism 105A and the spherically machined surface of the supporting seat 105B. Thus, their abrasion resistance can be enhanced.

Figure 40:
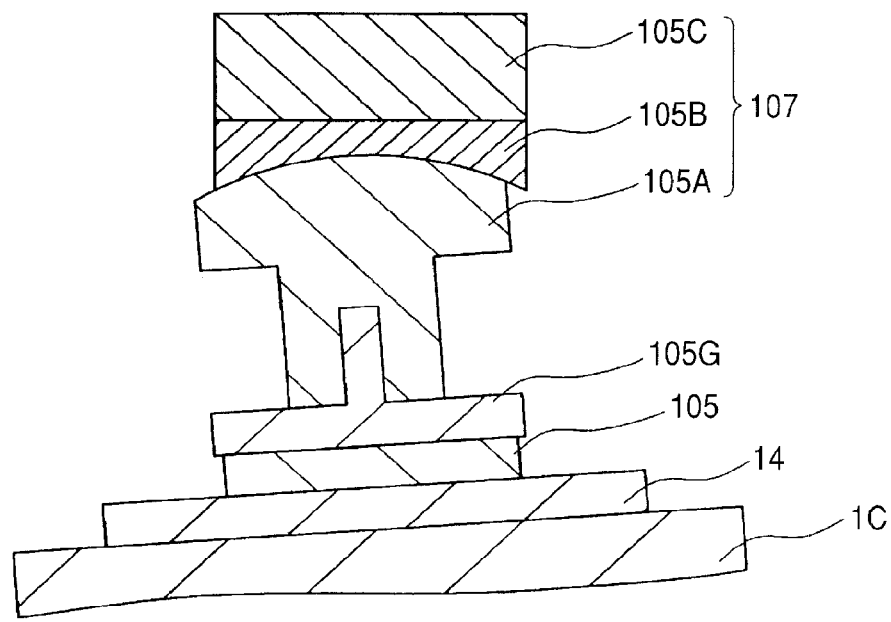
FIG. 40 is a sectional view of a substantial part, explaining the structure of a vacuuming collet used in the fabrication of a semiconductor device in the fourth embodiment of the invention.

If the rear surface of a chip 1C or a second chip is not parallel with the mounting surface in a mounting area when the chip 1C or the second chip 14 is mounted, the following problem arises: thermocompression is not evenly carried out throughout the rear surface of the chip 1C or the second chip 14; and there is the possibility that such a void KH as descried in relation to the first embodiment is formed. (Refer to FIG. 28 for this void KH.) This is pronounced especially when the second chip 14 is mounted. In this case, the mounting surface is provided over the chip 1C in the first layer, and the second chip must be parallel with the chip 1C, not with the wiring substrate 11 over which the chip 1C is mounted. If the chip 1C is mounted as is inclined, parallelism cannot be ensured between the chips when the second chip 14 is mounted. The fourth embodiment is constructed so as to solve this problem. The inclination adjusting mechanism 105A can be moved by load. Therefore, when the chip 1C and the second chip 14 are brought into contact with a mounting area, the head section 105A is moved by load applied through the chip 1C and the second chip 14. The rear surfaces of the chip 1C and the second chip 14 follow the mounting surface in a mounting area and are brought into parallel with the mounting surface. FIG. 40 is a sectional view illustrating in close-up substantial parts of the bonding head 107, a second chip 14, and a chip 1C when the second chip 14 is mounted over the chip 1C. According to the fourth embodiment, that is, the chip 1C and the second chip 14 can be mounted without forming such a void KH as described in relation to the first embodiment.

When the chip 1C and the second chip 14 are mounted, there may be limitation on the load applied to the chip 1C and the second chip 14. This can be coped with by taking the following measure: such a magnet 105C as to hold the inclination adjusting mechanism 105A through the supporting seat 105B with so small a magnetic force as 1N, for example, is selected; and the curvature of the spherically machined surfaces of the inclination adjusting mechanism 105A and the supporting seat 105B are so set that the inclination adjusting mechanism 105A can be moved in accordance with this magnetic force.

The control method for the suction force of the vacuuming collet 105 for vacuuming chips 1C, described in relation to the first and second embodiments, may be combined with the above-mentioned bonding head 107 of the fourth embodiment. Or, the method in which the pellet bonding step for chips 1C is divided into two stages, the temporary pressure bonding step and the proper pressure bonding step, described in relation to the third embodiment, may be combined with the bonding head 107. In these cases, the formation of a void KH can be more effectively suppressed.

Fifth Embodiment

Figure 41:
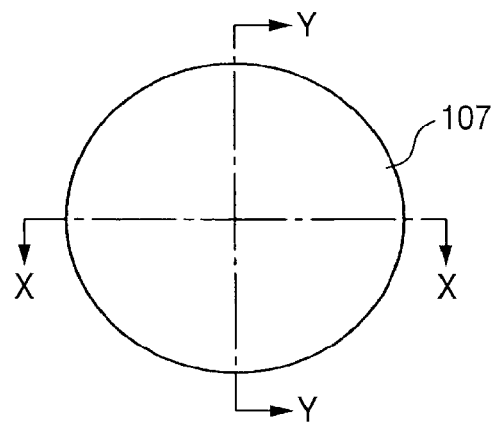
FIG. 41 is a plan view explaining the structure of a vacuuming collet used in the fabrication of a semiconductor device in a fifth embodiment of the invention.
Figure 42:
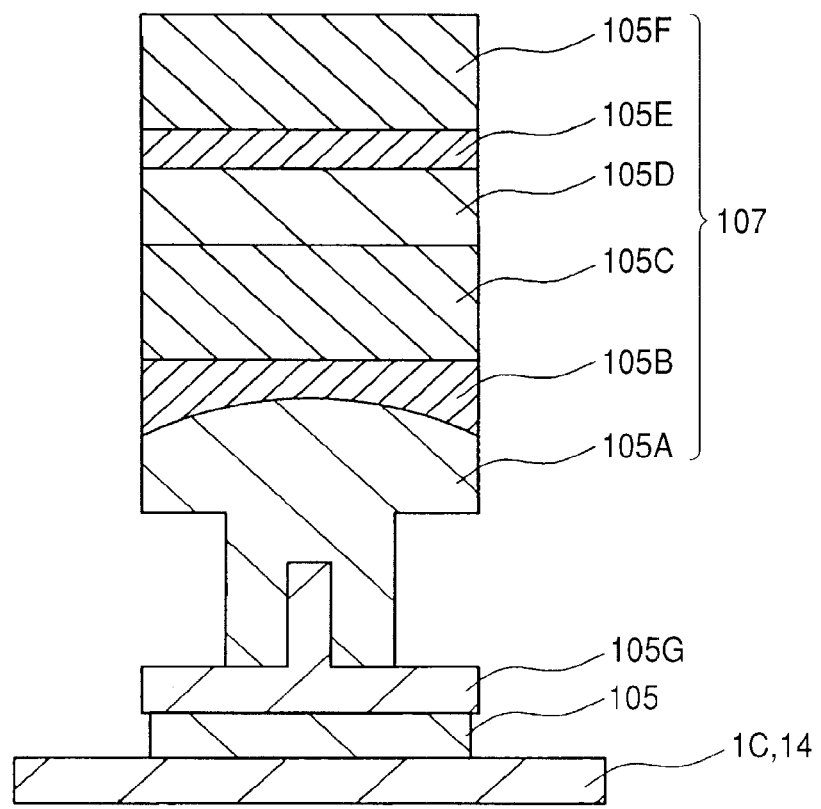
FIG. 42 is a sectional view of a substantial part, explaining the structure of a vacuuming collet used in the fabrication of a semiconductor device in the fifth embodiment of the invention.
Figure 43:
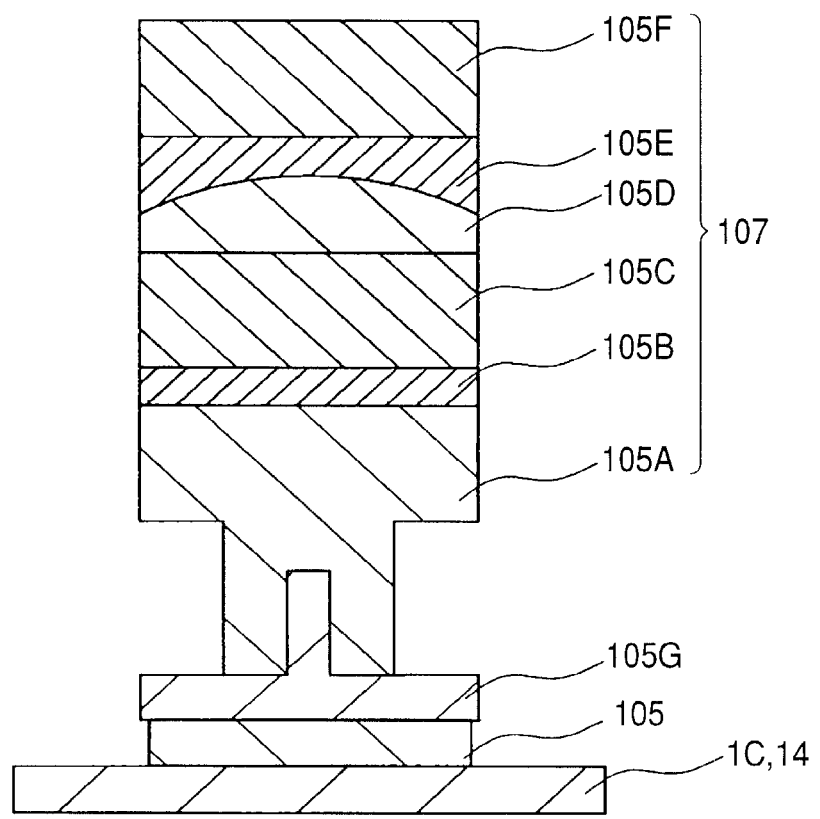
FIG. 43 is a sectional view of a substantial part, explaining the structure of a vacuuming collet used in the fabrication of a semiconductor device in the fifth embodiment of the invention.

FIG. 41 is a plan view of the bonding head 107 in the fifth embodiment as viewed from the inclination adjusting mechanism 105A side; FIG. 42 is a sectional view of a substantial part illustrating a section of the bonding head 107 taken along line X-X of FIG. 41; and FIG. 43 is a sectional view of a substantial part illustrating a section of the bonding head 107 taken along line Y-Y of FIG. 41. FIG. 42 and FIG. 43 also show a chip 1C or a second chip 14 vacuumed and held by the vacuuming collet 105. Line X-X is orthogonal to line Y-Y.

As illustrated in FIG. 42 and FIG. 43, the bonding head 107 of the fifth embodiment is formed of: the inclination adjusting mechanism 105A, the supporting seat (first supporting seat section) 105B, the magnet (first magnet) 105C, an inclination adjusting mechanism (first magnetic material section) 105D, a supporting seat (second supporting seat section) 105E, a magnet (second magnet) 105F, and the like. A first support section for holding the inclination adjusting mechanism 105A is formed of the supporting seat 105B, magnet 105C, and inclination adjusting mechanism 105D; and a second support section for holding the first support section is formed of the supporting seat 105E and the magnet 105F.

The inclination adjusting mechanism 105A is formed of a magnetic metal, such as high-speed tool steel and alloy high-speed tool steel, similarly with the inclination adjusting mechanism 105A described in relation to the fourth embodiment. (Refer to FIG. 39 for the inclination adjusting mechanism 105A in the fourth embodiment.) It is brought into contact with the chip 1C or second chip 14 described in relation to the first embodiment at the pellet bonding step. The surface (second surface) of the inclination adjusting mechanism 105A brought into contact with the supporting seat 105B is curvedly machined at the section taken along line X-X (first direction) and delineates a curve with a first curvature. The supporting seat 105B is brought into contact with the inclination adjusting mechanism 105A, similarly with the supporting seat 105B described in relation to the fourth embodiment. It is formed of a magnetic metal (first magnetic material), such as high-speed tool steel and alloy high-speed tool steel. Its face (first surface) brought into contact with the inclination adjusting mechanism 105A is curvedly machined in accordance with the shape of the curvedly machined surface of the inclination adjusting mechanism 105A. The magnet 105C is formed of, for example, a neodymium magnet similarly with the magnet 105C described in relation to the fourth embodiment. It holds the inclination adjusting mechanism 105A through the supporting seat 105B with such magnetic force that the inclination adjusting mechanism 105A can be moved along the curvedly machined surface, for example, a magnetic force (first magnetic force) of 5N or so. The inclination adjusting mechanism 105D is formed of a magnetic metal, such as high-speed tool steel and alloy high-speed tool steel, and is placed on the magnet 105C in contact with the magnet 105C. Its surface brought into contact with the supporting seat 105E is curvedly machined at the section taken along line Y-Y (second direction) and delineates a curve with a second curvature. The supporting seat 105E is formed of a magnetic metal (second magnetic material), such as high-speed tool steel and alloy high-speed tool steel, like the supporting seat 105B, and is brought into contact with the inclination adjusting mechanism 105D. Its face (third surface) brought into contact with the inclination adjusting mechanism 105D is curvedly machined in accordance with the shape of the curvedly machined surface of the inclination adjusting mechanism 105D. The magnet 105F is formed of, for example, a neodymium magnet like the magnet 105C. It holds the inclination adjusting mechanism 105D through the supporting seat 105E with such magnetic force that the inclination adjusting mechanism 105D can be moved along the curvedly machined surface, for example, a magnetic force (second magnetic force) of 5N or so. When a force of 5N or above is applied to the inclination adjusting mechanism 105A and the inclination adjusting mechanism 105D at the pellet bonding step, they are moved along the respective curvedly machined surfaces. The curvedly machined surfaces of the inclination adjusting mechanism 105A, supporting seat 105B, inclination adjusting mechanism 105D, and supporting seat 105E are formed with such a curvature that the following is implemented: when a force of 5N or above is applied to the inclination adjusting mechanism 105A and the inclination adjusting mechanism 105D, the inclination adjusting mechanism 105A and the inclination adjusting mechanism 105D can be moved.

The curvedly machined surface of the inclination adjusting mechanism 105A, the curvedly machined surface of the supporting seat 105B, the curvedly machined surface of the inclination adjusting mechanism 105D, and the curvedly machined surface of the supporting seat 105E may be subjected to dimpling operation to form multiple dimples (recesses) there. This reduces the area of contact between the inclination adjusting mechanism 105A and the supporting seat 105B and the area of contact between the inclination adjusting mechanism 105D and the supporting seat 105E. As a result, the friction at the individual contact faces is reduced, and it is possible to easily move the inclination adjusting mechanism 105A. Also, this dimpling operation enhances the surface hardness of the curvedly machined surface of the inclination adjusting mechanism 105A, the curvedly machined surface of the supporting seat 105B, the curvedly machined surface of the inclination adjusting mechanism 105D, and the curvedly machined surface of the supporting seat 105E. Thus, their abrasion resistance can be enhanced.

The constructions of the other members are the same as in the fourth embodiment.

In the fifth embodiment, the inclination adjusting mechanism 105A and the inclination adjusting mechanism 105D can be respectively moved in the direction of line X-X and direction of line Y-Y illustrated in FIG. 41 by load. For this reason, when the chip 1C and the second chip 14 are brought into contact with amounting area, the inclination adjusting mechanism 105A and the inclination adjusting mechanism 105D are moved by load applied through the chip 1C and the second chip 14. Then, the rear surfaces of the chip 1C and the second chip 14 follow the mounting surface in the mounting area, and are brought into parallel with the mounting surface. According to the fifth embodiment, that is, the chip 1C and the second chip 14 can be mounted without forming such a void KH as described in relation to the first embodiment. (Refer to FIG. 28 for this void KH.)

When the chip 1C and the second chip 14 are mounted, there may be limitation on the load applied to the chip 1C and the second chip 14. This can be coped with by taking the following measure: such a magnet 105C as to hold the inclination adjusting mechanism 105A through the supporting seat 105B with so small a magnetic force as 1N, for example, and such a magnet 105F as to hold the inclination adjusting mechanism 105D through the supporting seat 105E with so small a magnetic force as 1N, for example, are selected; and the curvature of the following curvedly machine surfaces is so set that the inclination adjusting mechanism 105A and the inclination adjusting mechanism 105D can be moved in accordance with this magnetic force: the curvedly machined surface of the inclination adjusting mechanism 105A, the curvedly machined surface of the supporting seat 105B, the curvedly machined surface of the inclination adjusting mechanism 105D, and the curvedly machined surface of the supporting seat 105E.

The control method for the suction force of the vacuuming collet 105 for vacuuming chips 1C, described in relation to the first and second embodiments, may be combined with the above-mentioned bonding head 107 of the fifth embodiment. Or, the method in which the pellet bonding step for chips 1C is divided into two stages, the temporary pressure bonding step and the proper pressure bonding step, described in relation to the third embodiment, may be combined with the bonding head 107. In these cases, the formation of a void KH can be more effectively suppressed.

The same effects as in the fourth embodiment can also be obtained by the fifth embodiment.

Sixth Embodiment

In the description of the first embodiment, a dicing tape 4 is plunged up from the rear surface with the first block 110A, second block 110B, and third block 110C, and a chip 1C is unstuck from the dicing tape with the vacuuming collet 105. (The first block 110A, second block 110B, and third block 110C will be hereafter collectively referred to as a multistage plunge-up jig.) In the sixth embodiment, aside from such a multistage plunge-up jig, multiple plunge-up pins (plunge-up jigs) 131, illustrated in FIG. 44, or a horn (plunge-up jig) 132, illustrated in FIG. 45, that applies a longitudinal vibration of predetermined frequency and wavelength to a dicing tape 4 may be used. Though not shown in drawings, both the multiple plunge-up pins 131 and the horn 132 are housed in a vacuum chuck piece like the vacuum chuck piece 102 described in relation to the first embodiment. (Refer to FIG. 9 to FIG. 11 for the vacuum chuck piece 102 in the first embodiment.) This vacuum chuck piece plunges up a dicing tape 4 in a situation that it vacuum chucks the dicing tape 4.

When a chip 1C is approximately 100 µm or above on a side, for example, the multistage plunge-up jig described in relation to the first embodiment plunges up a dicing tape 4 as follows: it plunges it up by 0.6 mm to 1.5 mm or so, preferably, 1.2 mm or so in total at a speed of 1 mm/sec to 100 mm/sec or so. When a chip 1C is less than 100 µm or so, it plunges up a dicing tape 4 by 0.6 mm to 1.5 mm or so, preferably, 1.2 mm in total at a speed of 1 mm/sec to 100 mm/sec or so, preferably, 30 mm/sec or so.

Figure 44:
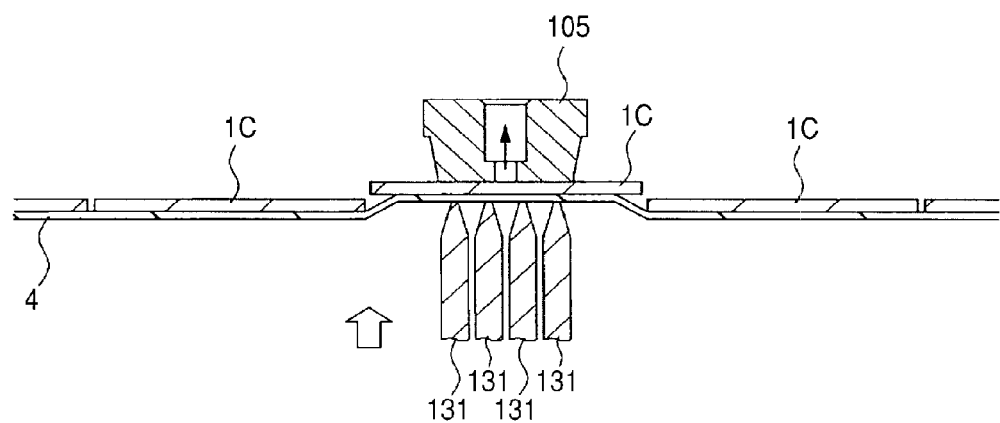
FIG. 44 is an enlarged sectional view of an area in proximity to the upper face of a vacuum chuck piece, explaining a method for unsticking a semiconductor chip when a plunge-up pin is used.

When a chip 1C is approximately 100 µm or above on a side, for example, such multiple plunge-up pins 131 as illustrated in FIG. 44 plunge up a dicing tape 4 as follows: they plunge it up by 0.05 mm to 0.6 mm or so, preferably, 0.3 mm or so at a speed of 1 mm/sec to 30 mm/sec or so. When a chip 1C is less than 100 µm or so, for example, they plunge up a dicing tape 4 by 0.05 mm to 0.6 mm or so, preferably, 0.3 mm or so at a speed of 1 mm/sec to 30 mm/sec or so, preferably, 5 mm/sec or so. When a dicing tape 4 is plunged up, the plunge-up pins 131 slide and thereby make it easier to unstick a chip 1C to be unstuck from the dicing tape 4.

Figure 45:
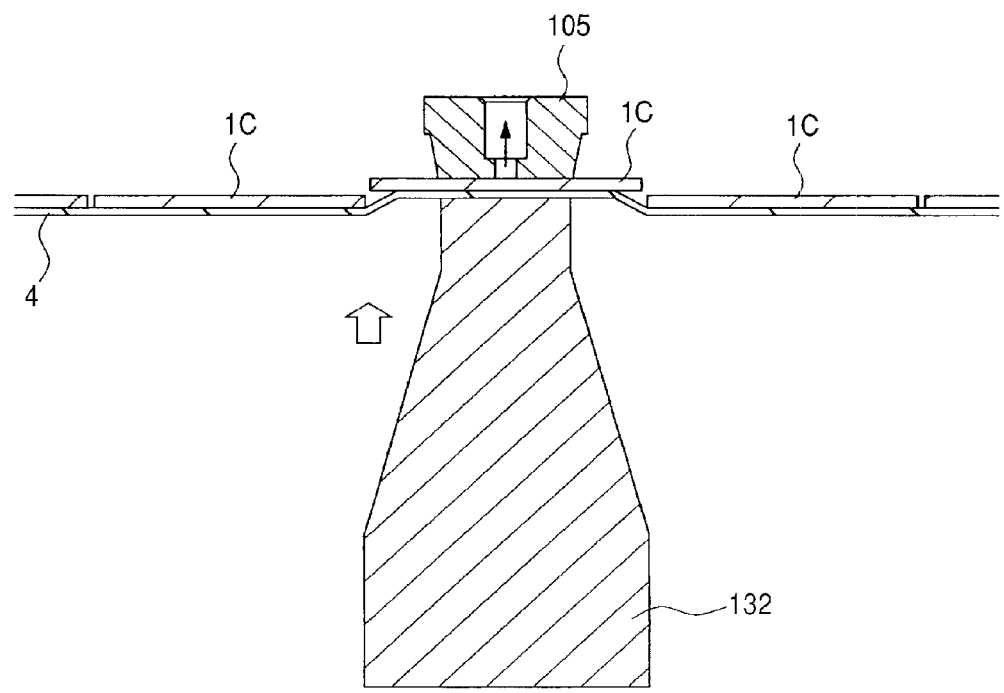
FIG. 45 is an enlarged sectional view of an area in proximity to the upper face of a vacuum chuck piece, explaining a method for unsticking a semiconductor chip when a horn for emitting ultrasonic waves is used.

When a chip 1C is approximately 100 µm or above on a side, for example, such a horn 132 as illustrated in FIG. 45 plunges up a dicing tape 4 by 0.05 mm to 0.6 mm or so, preferably, 0.3 mm or so in total at a speed of 1 mm/sec to 100 mm/sec or so. When a chip 1C is less than 100 µm or so on a side, it plunges up a dicing tape 4 by 50 µm to 600 µm or so, preferably, 300 µm or so at a speed of 1 mm/sec to 100 mm/sec, preferably, 20 mm or so. When a dicing tape 4 is plunged up, the horn 132 applies a longitudinal vibration (ultrasonic wave) to the dicing tape 4 to make it easy to unstick a chip 1C to be unstuck from the dicing tape 4. This longitudinal vibration is, for example, 1 kHz to 100 kHz or so in frequency and 1 µm to 50 µm or so, preferably, 10 µm to 20 µm or so in amplitude (first amplitude).

Figure 46:
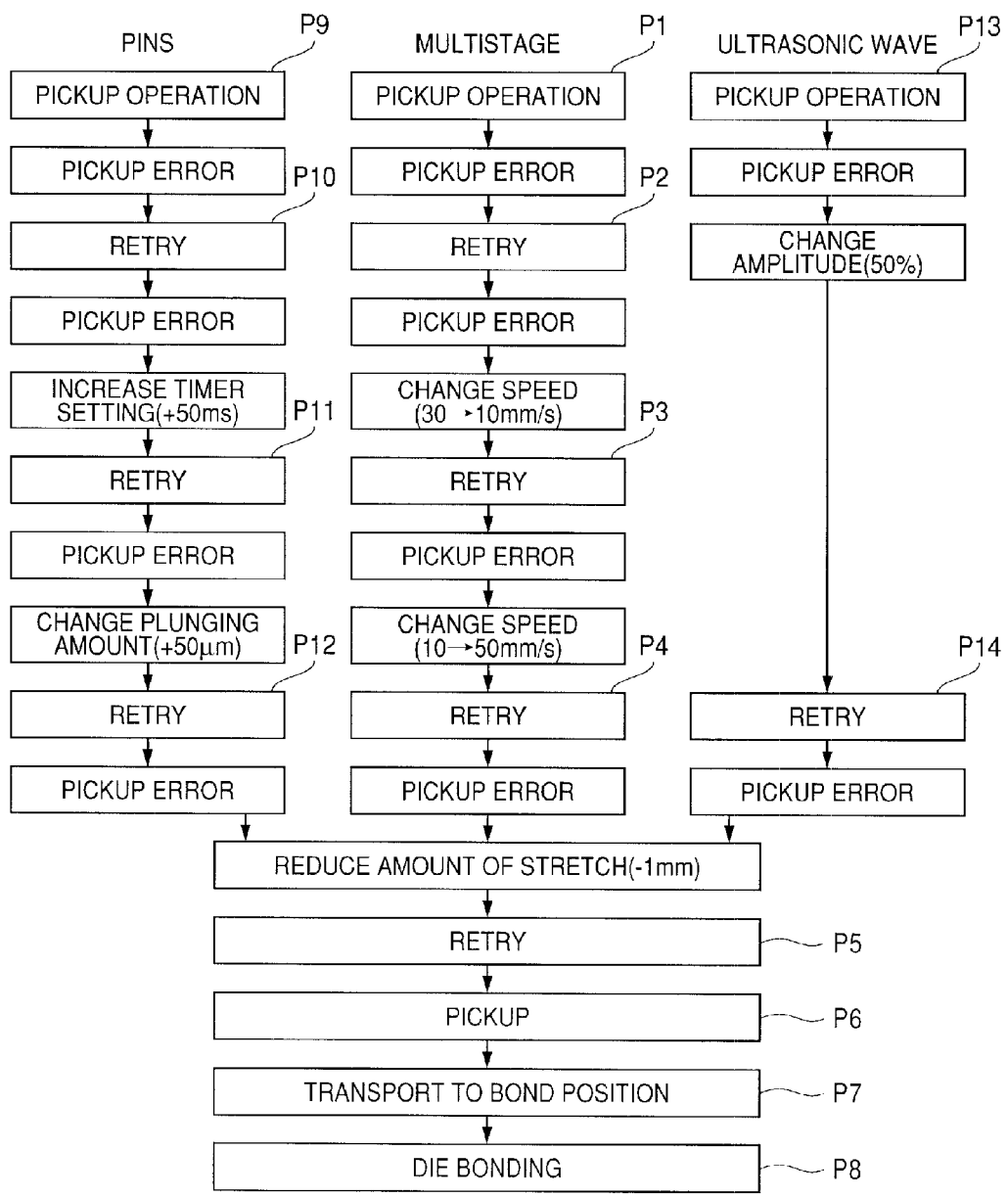
FIG. 46 is a flowchart illustrating how to cope with a failure to pick up a chip from a dicing tape that occurs in the fabrication process for a semiconductor device in a sixth embodiment of the invention.

When a chip 1C is unstuck from a dicing tape 4, the operation of unsticking the chip 1C from the dicing tape 4 can fail. (This will be hereafter referred to as an error in picking up a (the) chip 1C.) The sixth embodiment is for coping with such an error in picking up a chip 1C that has occurred. FIG. 46 is a flowchart illustrating a method for coping with an error in picking up a chip 1C from a dicing tape that has occurred with respect to each of the following cases: a case where a multistage plunge-up jig is used, a case where plunge-up pins 131 are used, and a case where a horn 132 is used.

When the multistage plunge-up jig, described in relation to the first embodiment, is used, first, the vacuuming collet 105 performs the operation of unsticking a chip 1C to be unstuck from a dicing tape 4 (pickup operation) (Step P1). If an error in picking up the chip 1C to be unstuck occurs here, the pickup operation is performed again under the same operating conditions (Step P2). If a pickup error consecutively occurs more than once (e.g., three times) also in the pickup, operation under the same operating conditions (hereafter, also referred to as retry), the following measure is taken: the plunging speed of the multistage plunge-up jig is reduced from 30 mm/sec or so to 10 mm/sec or so and a retry is performed (Step P3). If an error in picking up the chip 1C to be unstuck occurs here, the pickup operation may be performed again under the same operating conditions. If a pickup error occurs under such conditions, the plunging speed of the multistage plunge-up jig is reduced from 10 mm/sec or so to 50 mm/sec or so and a retry is performed (Step P4). If an error in picking up the chip 1C to be unstuck occurs here, the pickup operation may be performed again under the same operating conditions. If a pickup error occurs under such conditions, the amount of stretch of the dicing tape 4 is reduced by 1 mm or so and a retry is performed (Step P5). By reducing the amount of stretch of the dicing tape 4 as mentioned above, the tension of the dicing tape 4 is reduced. This enhances the efficiency with which the above-mentioned vacuum chuck piece vacuums the dicing tape 4. As a result, even when the multistage plunge-up jig plunges up the dicing tape 4, the dicing tape 4 can be kept vacuumed by the vacuum chuck piece. Therefore, it is possible to more easily unstick the chip 1C to be unstuck from the dicing tape 4. If a pickup error Occurs again under such conditions, the pickup operation may be performed again under the same operating conditions. If a pickup error further occurs, the pickup operation may be performed again taking Steps P2 to P4 mentioned above. When the chip 1C is successfully picked up (Step P6), the chip 1C is transported to a mounting position (Step P7). Then, the chip 1C is mounted using the method described in relation to the first to fifth embodiments (Step P8), and is molded with plastic to fabricate a semiconductor device in the sixth embodiment.

When the multiple plunge-up pins 131 illustrated in FIG. 44 are used, first, the vacuuming collet 105 performs the operation of unsticking a chip 1C to be unstuck from a dicing tape 4 (pickup operation) (Step P9). If an error in picking up the chip 1C to be unstuck occurs here, the pickup operation is performed again under the same operating conditions (Step P10). If a pickup error consecutively occurs more than once (e.g., three times) also in the pickup operation under the same operating conditions (hereafter, also referred to as retry), the following measure is taken: the time for which the plunge-up pins 131 slide on the dicing tape 4 is increased by 0.05 seconds (50 msec) or so and a retry is performed (Step P11). If an error in picking up the chip 1C to be unstuck occurs here, the pickup operation may be performed again under the same operating conditions. If a pickup error occurs under such conditions, the plunging amount of the plunge-up pins 131 is increased by 50 μm or so and a retry is performed (Step P12). If an error in picking up the chip 1C to be unstuck occurs here, the pickup operation may be performed again under the same operating conditions. If a pickup error occurs under such conditions, the amount of stretch of the dicing tape 4 is reduced by 1 mm or so as in the above-mentioned case where the multistage plunge-up jig is used, and a retry is performed (Step P5). By reducing the amount of stretch of the dicing tape 4 as mentioned above, the tension of the dicing tape 4 is reduced. This enhances the efficiency with which the above-mentioned vacuum chuck piece vacuums the dicing tape 4. As a result, even when the plunge-up pins 131 plunge up the dicing tape 4, the dicing tape 4 can be kept vacuumed by the vacuum chuck piece. Therefore, it is possible to more easily unstick the chip 1C to be unstuck from the dicing tape 4. If a pickup error occurs again under such conditions, the pickup operation may be performed again under the same operating conditions. If a pickup error further occurs, the pickup operation may be performed again taking Steps P10 to P12 mentioned above. The subsequent steps are the same as in the above-mentioned case where the multistage plunge-up jig is used.

When the horn 132 illustrated in FIG. 45 is used, first, the vacuuming collet 105 performs the operation of unsticking a chip 1C to be unstuck from a dicing tape (pickup operation) (Step P13). If a pickup error occurs under such conditions, the amplitude of the longitudinal vibration (ultrasonic wave) applied to the dicing tape by the horn 132 is reduced to 50% or below and a retry is performed (Step P14). If a pickup error occurs under such conditions, the amount of stretch of the dicing tape 4 is reduced by 1 mm or so as in the above-mentioned cases where the multistage plunge-up jig is used and the plunge-up pins 131 are used, and a retry is performed (Step P5). By reducing the amount of stretch of the dicing tape 4 as mentioned above, the tension of the dicing tape 4 is reduced. This enhances the efficiency with which the above-mentioned vacuum chuck piece vacuums the dicing tape 4. As a result, even when the horn 132 plunges up the dicing tape 4, the dicing tape 4 can be kept vacuumed by the vacuum chuck piece. Therefore, it is possible to more easily unstick the chip 1C to be unstuck from the dicing tape A. If a pickup error occurs again under such conditions, the pickup operation may be performed again following Step P14 mentioned above. The subsequent steps are the same as in the above-mentioned case where the multistage plunge-up jig is used.

Seventh Embodiment

When a chip 1C to be unstuck is unstuck from a dicing tape 4 using the horn 132 described in relation to the sixth embodiment, the following can take place. (Refer to FIG. 45 for the horn 132 in the sixth embodiment.) When the vacuuming collet 105 makes a pickup error, the chip 1C may have been already unstuck partway. In such a case, the adhesive force between the chip 1C and the dicing tape 4 has been altered from its initial state. If the horn 132 plunges up the dicing tape under the same plunging conditions, vibration is excessively applied and the chip 1C to be unstuck can be displaced on the dicing tape 4. In this case, there is the possibility that the accuracy of the position in which the vacuuming collet 105 vacuums a chip is degraded. When the thickness of a chip 1C is reduced, the anti-adhesion strength differs even if the longitudinal vibration (ultrasonic wave) applied from the horn 132 is identical. For this reason, the separation can proceed only halfway and a pickup error can occur. The seventh embodiment is for coping with an error in picking up a chip 1C when such a horn 132 is used.

As an example, it will be assumed that a pickup error has occurred under some conditions for the longitudinal vibration (ultrasonic wave) when the horn 132 described in relation to the sixth embodiment is used. (The conditions are as follows: the frequency should be 1 kHz to 100 kHz or so and the amplitude should be 1 μm to 50 μm or so, preferably, 10 μm to 20 μm or so.) In this case, a retry is performed in accordance with Step P14 described in relation to the sixth embodiment with reference to FIG. 46. This retry is performed with the amplitude of the vibration applied from the horn 132 reduced by a predetermined amount, for example, reduced to 5 μm or so. This can prevent a vibration from being excessively applied to a chip 1C to be unstuck and the chip 1C from being displaced on the dicing tape 4. Therefore, the vacuuming collet 105 can vacuum a chip 1C with high positional accuracy. When it is presupposed that a retry is performed, the amplitude of the vibration applied from the horn 132 in the initial pickup operation (Step P13) is set small. Thus, a vibration can be prevented from being excessively applied to a chip 1C to be unstuck in the initial pickup operation.

Figure 47:
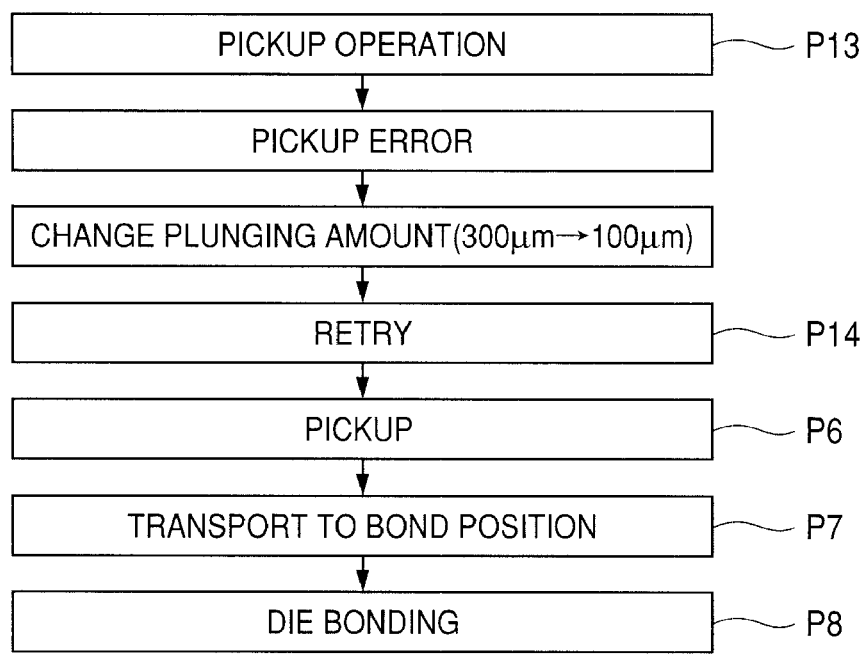
FIG. 47 is a flowchart of substantial steps illustrating how to cope with a failure to pick up a chip from a dicing tape that occurs in the fabrication process for a semiconductor device in a seventh embodiment of the invention.

Instead of reducing the amplitude of the vibration applied from the horn 132 as mentioned above, the plunging amount of the horn 132 is reduced by predetermined amount, for example, reduced to 100 μm or so, and a retry is performed (Step P14). (Refer to FIG. 47.) Thus, only the plunging amount is changed with the plunging speed unchanged; therefore, the time for which a vibration is applied to the chip 1C can be reduced. By reducing the vibration application time, a vibration can be prevented from being excessively applied to a chip 1C to be unstuck. Therefore, the chip 1C can be prevented from being displaced on the dicing tape 4, and the vacuuming collet 105 can vacuum the chip 1C with high positional accuracy. When it is presupposed that a retry is performed as in the above-mentioned case where means for reducing the amplitude of the vibration applied from the horn 132 is used, the amplitude of the vibration applied from the horn 132 in the initial pickup operation (Step P13) is set small. Thus, a vibration can be prevented from being excessively applied to a chip 1C to be unstuck in the initial pickup operation.

The step (Step P6) for picking up a chip 1C and Steps P7 and P8 subsequent thereto are the same as Steps P6 to P8 described in relation to the sixth embodiment.

Eighth Embodiment

The eighth embodiment is for coping with warpage (deformation) in a chip 1C when the horn 132 is used.

Figure 48:
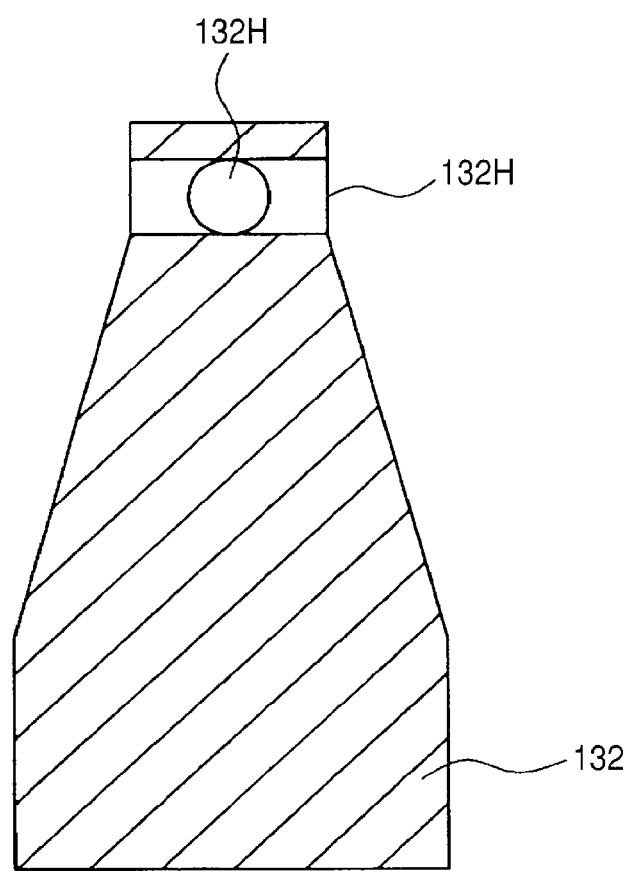
FIG. 48 is a sectional view of a substantial part of a horn used in the fabrication of a semiconductor device in an eighth embodiment of the invention.
Figure 49:
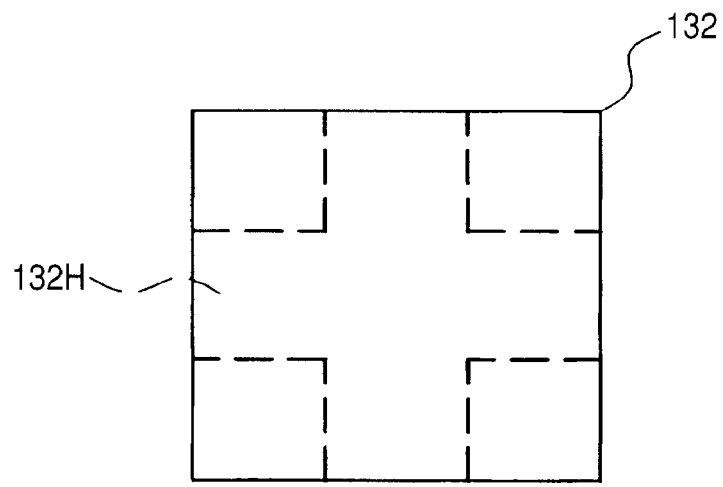
FIG. 49 is a plan view illustrating the tip of the horn illustrated in FIG. 48.
Figure 50:
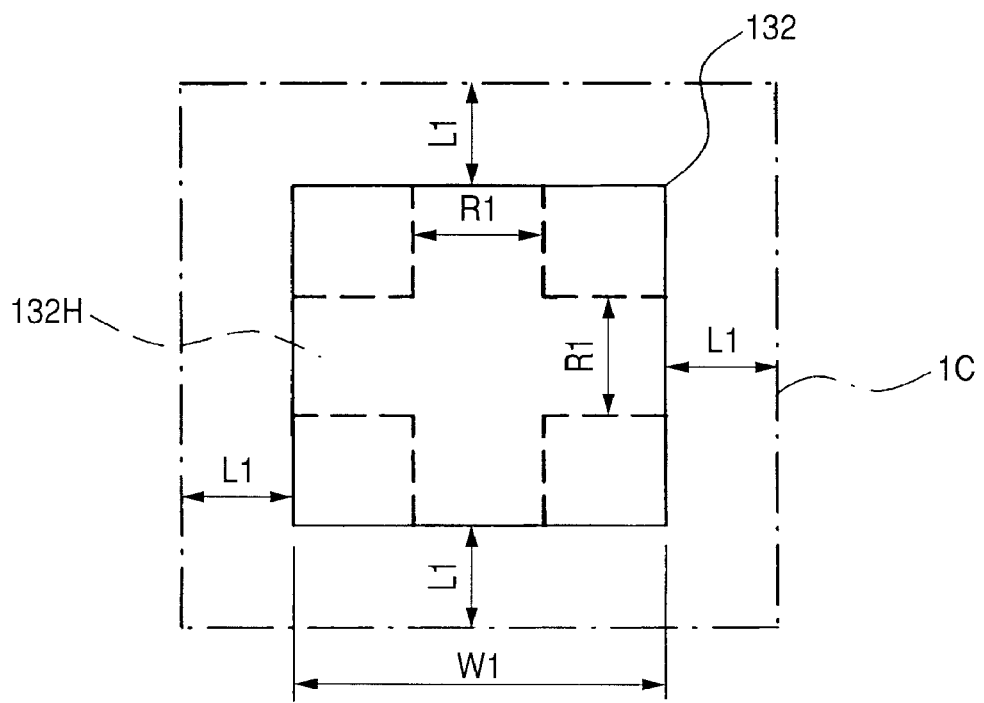
FIG. 50 is a plan view illustrating the comparison between the tip of the horn illustrated in FIG. 48 and FIG. 49 and a chip to be unstuck for size.

FIG. 48 is a sectional view of a substantial part of a horn 132 in the eighth embodiment; FIG. 49 is a plan view of the horn 132 as viewed from its tip brought into contact with a dicing tape 4; and FIG. 50 is a plan view illustrating the comparison between the tip of the horn 132 and a chip 1C to be unstuck from the dicing tape 4 for size.

An experiment conducted by the present inventors revealed that the following takes place when a chip 1C is unstuck from a dicing tape 4 by applying a longitudinal vibration (ultrasonic wave) using the horn 132. (Refer to FIG. 45.) The separation proceeds relatively faster in an area closer to the central part of the chip 1C and slower in an area closer to the peripheral portion of the chip 1C. In this case, heat produced by vibration is applied to the chip 1C. In case of a DAF product, there is the possibility that the following problem arises: the chip 1C is bonded at its central portion, where the separation has proceeded, by that heat and cannot be unstuck. In the eighth embodiment, to cope with this, the horn 132 is provided at its tip with a side hole (air gap) 132H as illustrated in FIG. 48 to FIG. 50. When the tip of the horn 132 is rectangle and 9 mm on a side W1 in a plane, for example, the eighth embodiment is so constructed that the side hole 132H is formed in the center of a side face of the horn 132 in a plane and its radius R1 is 1 mm to 3 mm or so. The distance L1 from the periphery of the tip of the horn 132 to the periphery of the chip 1C is 1 mm to 2 mm or so in a plane. By providing such a side hole 132H, a longitudinal vibration (ultrasonic wave) is made less prone to be transmitted to the tip of the horn 132 corresponding to the side hole 132H in a plane during the operation of picking up a chip 1C. This makes it possible to facilitate the separation at the peripheral portion of the chip 1C and to suppress heat production at its central portion to prevent adhesion. Even when the chip 1C cannot be unstuck only at its central portion by application of a longitudinal vibration (ultrasonic wave), the area of adhesion between the chip 1C and the dicing tape 4 is reduced. Therefore, it can be unstuck by vacuuming by the vacuuming collet 105. (Refer to FIG. 45.)

Even if a pickup error occurs, a retry can be performed in accordance with Steps P13 and P14 described in relation to the sixth and seventh embodiments. (Refer to FIG. 46 and FIG. 47 for these steps.)

The step for picking up a chip 1C and the subsequent steps are the same as Steps P6 to P8 described in relation to the sixth embodiment.

Ninth Embodiment

The ninth embodiment is also for coping with warpage (deformation) in a chip 1C when the horn 132 is used, like the eighth embodiment.

Figure 51:
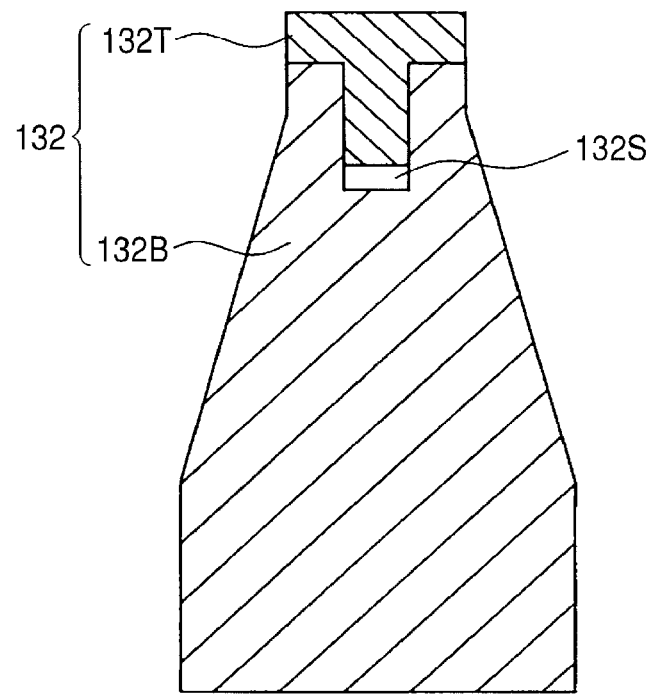
FIG. 51 is a sectional view of a substantial part of a horn used in the fabrication of a semiconductor device in a ninth embodiment of the invention.
Figure 52:
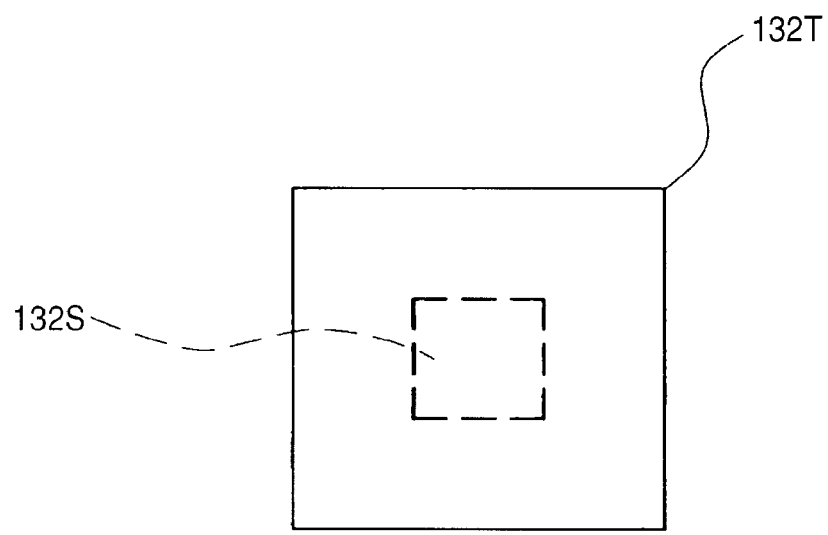
FIG. 52 is a plan view illustrating the tip of the horn illustrated in FIG. 51.

FIG. 51 is a sectional view of a substantial part of a horn 132 in the ninth embodiment; FIG. 52 is a plan view of the horn 132 as viewed from its tip brought into contact with a dicing tape 4; and FIG. 53 is a plan view illustrating the comparison between the tip of the horn 132 and a chip 1C to be unstuck from the dicing tape 4 for size.

Figure 53:
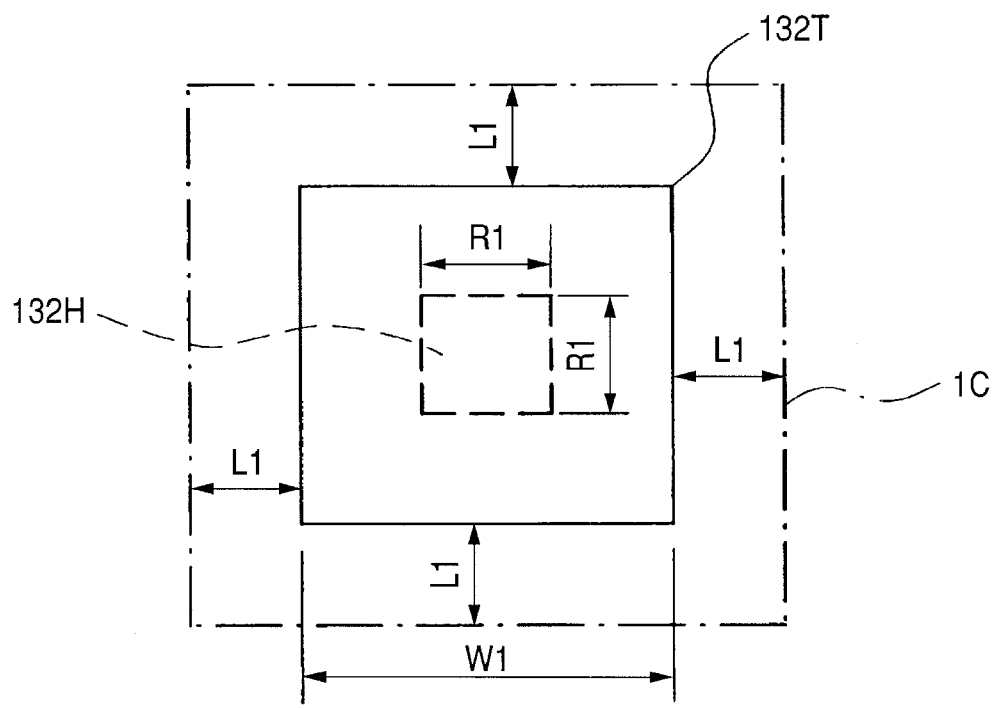
FIG. 53 is a plan view illustrating the comparison between the tip of the horn illustrated in FIG. 51 and FIG. 52 and a chip to be unstuck for size.

In the ninth embodiment, as illustrated in FIG. 51 to FIG. 53, the horn 132 is formed of a tip member (first member) 132T and a base member (second member) 132B. The tip member 132T and the base member 132B are so formed that an air gap 132S is formed in the area between them in a plane. For this purpose, the tip member 132T has T-shaped sections so that it is inserted into the base member 132B. When the air gap 132S is in rectangular planar shape and the tip member 132T is rectangle and 9 mm on a side W1 in a plane, for example, in the ninth embodiment, the radius (length of a side) R1 of the air gap 1325 is 1 mm to 3 mm or so. The distance L1 from the periphery of the tip of the horn 132 to the periphery of the chip 1C is 1 mm to 2 mm or so in a plane. By forming the horn 132 of the tip member 132T and the base member 132B that form such an air gap 132S, the following can be implemented: a longitudinal vibration (ultrasonic wave) is made less prone to be transmitted to the tip of the horn 132 corresponding to the air gap 132S in a plane during the operation of picking up a chip 1C, similarly with the eighth embodiment in which the side hole 132H is formed. This makes it possible to facilitate the separation at the peripheral portion of the chip 1C and suppress the progress of separation at its central portion, as in the eighth embodiment, to prevent warpage.

The air gap 132S may be in the planar shape of a circle (not shown) 1 mm to 3 mm or so in radius R1.

The same effects as in the eighth embodiment can also be obtained by the ninth embodiment.

10th Embodiment

When the wiring substrates 11 illustrated in drawings (e.g., FIG. 31 to FIG. 33) related to the first embodiment are handled as follows: when they are transported to places where various steps, including a step for mounting chips 1C and second chips 14, a step for connecting Au wires 15, and a step for plastic molding using molding resin 17, are carried out, a number of them are housed in a predetermined magazine in a lump. The wiring substrate 11 may be subjected to heat treatment as is housed in this magazine. (An example of such heat treatment is baking carried out after it is sealed with molding resin 17.) (Refer to FIG. 33.) The magazine can be deformed by heat during heat treatment, and variation can be produced in the dimensions of the magazine. When a wiring substrate 11 is unloaded from a magazine, the unloading position for the wiring substrate 11 is determined relative to the dimensions of the magazine. Therefore, if such a magazine having variation in dimensions is used again, the unloading position for a wiring substrate 11 can deviate. In this case, there is the possibility that when a wiring substrate 11 is unloaded from the magazine, the wiring substrate 11 collides with some other member and the wiring substrate 11 is broken. Especially, when multiple chips 1C and second chips 14 are mounted over a wiring substrate 11, the following can take place: if one wiring substrate 11 is broken, all the chips 1C and second chips 14 mounted over it go to waste. The 10th embodiment is for preventing breakage of a wiring substrate 11 when it is unloaded from a magazine.

Figure 54:
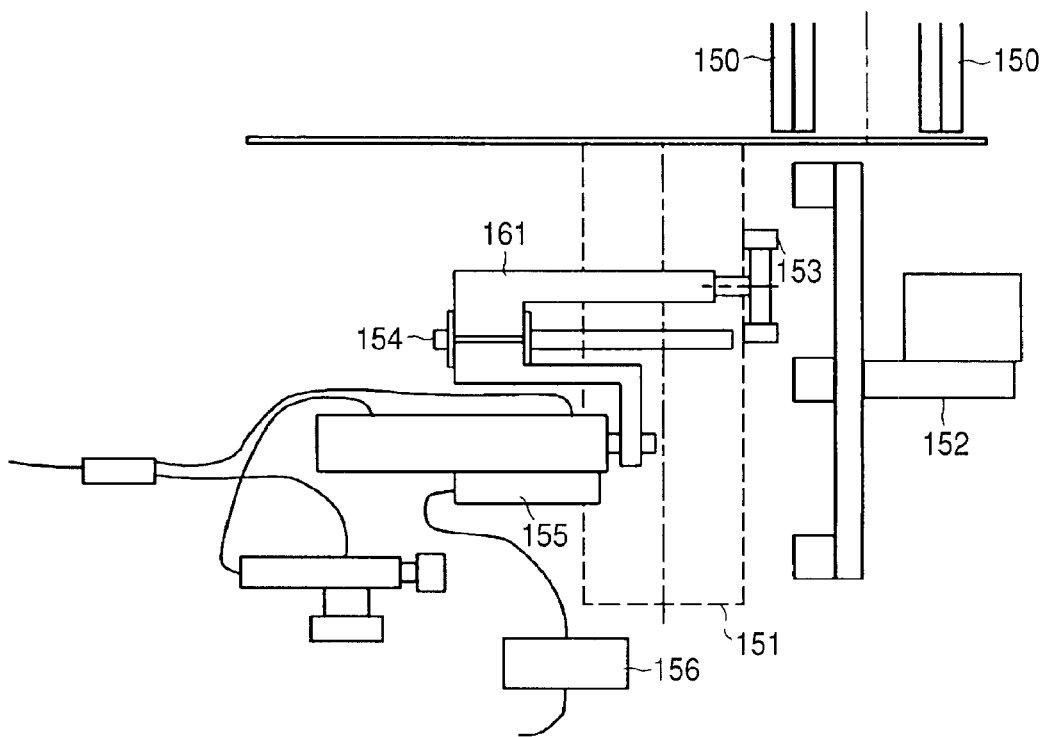
FIG. 54 is a top view of a dimensional measurement jig for magazines used in the fabrication of a semiconductor device in a 10th embodiment of the invention.
Figure 55:
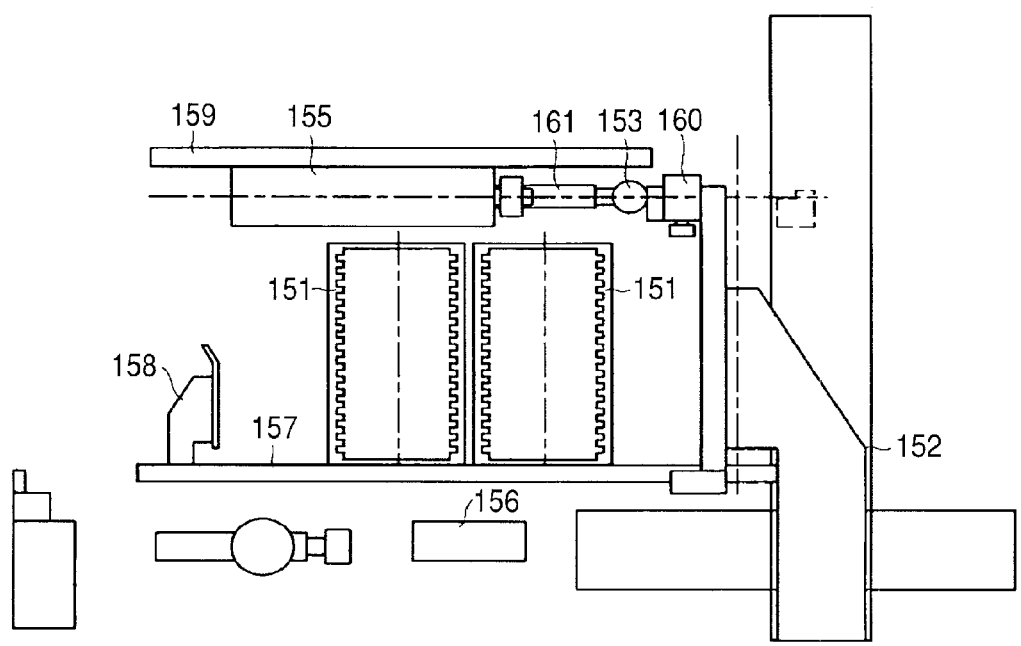
FIG. 55 is a side view of a dimensional measurement jig for magazines used in the fabrication of a semiconductor device in the 10th embodiment of the invention.
Figure 56:
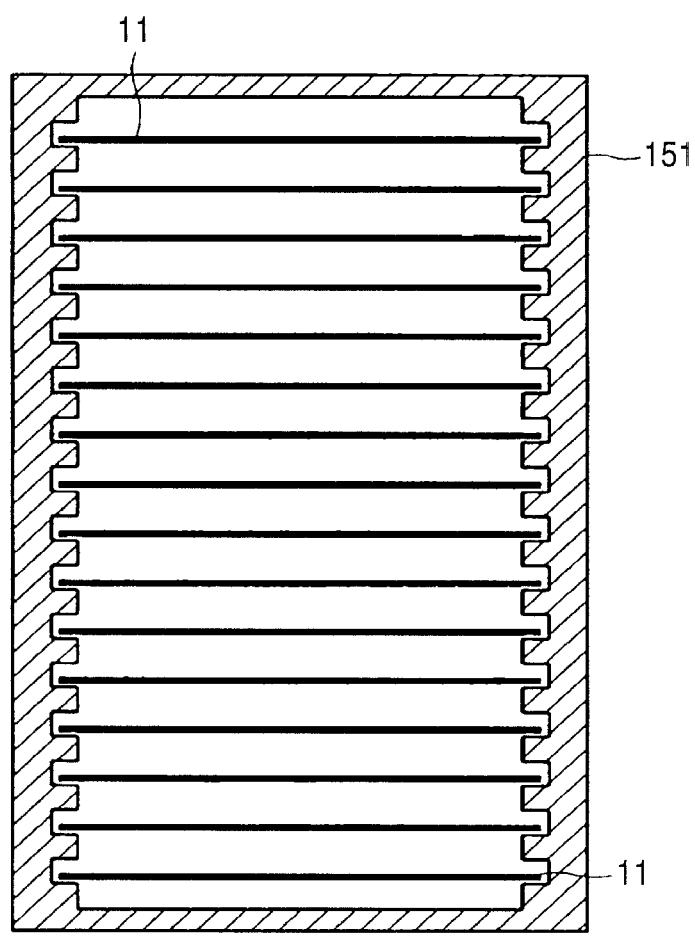
FIG. 56 is a side view of a magazine used in the fabrication of a semiconductor device in the 10th embodiment of the invention.

FIG. 54 and FIG. 55 are respectively a top view and a side view of a wiring substrate feed mechanism in the 10th embodiment. This wiring substrate feed mechanism unloads a wiring substrate 11 from a magazine (housing jig) 151 and feeds it onto transport rails (transport track) 150. FIG. 56 is a side view of the magazine 151.

As illustrated in FIG. 54 and FIG. 55, the wiring substrate feed mechanism is constructed of: a magazine transporting jig 152 that holds a magazine 151 and moves up and down in the vertical direction in FIG. 55 (hereafter, referred to a Z direction) and moves in parallel in the horizontal direction in FIG. 54; a dimensional measurement jig including a retaining jig 153, a linear guide 154, and a drive mechanism 155; a data storage mechanism 156; a stage 157, a fixing jig 158 that presses against a magazine 151 on the stage 157 and fixes its set position; a top plate 159; a fixing jig 160 that holds down a magazine 151 held in the magazine transporting jig 152 and fixes it; and the like.

The retaining jig 153 and drive mechanism 155 that form the dimensional measurement jig are coupled with each other through a coupling member 161. The coupling member 161 is so structured that it can be moved in parallel along the linear guide 154 in the horizontal direction in FIG. 54. That is, the retaining jig 153 is moved in parallel along the linear guide 154 in the horizontal direction in FIG. 54 in conjunction with the operation of the drive mechanism 155. The drive mechanism 155 and the linear guide 154 are fixed on the top plate 159 whose installation position is fixed. The installation position of the stage 157 is also fixed.

The data storage mechanism 156 records the amount of movement of the retaining jig 153 corresponding to the amount of operation of the drive mechanism 155. Fine adjustment of the position in which a magazine 151 is held by the magazine transporting jig 152, described later, is carried out based on the amount of movement of the retaining jig 153 recorded in the data storage mechanism 156.

As illustrated in FIG. 56, the magazine 151 has such structure that it can house wiring substrates 11 in multiple stages in it, and has an opening. When the magazine is transported to a position where a wiring substrate 11 is fed onto the transport rails 150, by the magazine transporting jig 152, the opening is opposed to the transport rails 150 and the wiring substrate 11 is unloaded through the opening.

Figure 57:
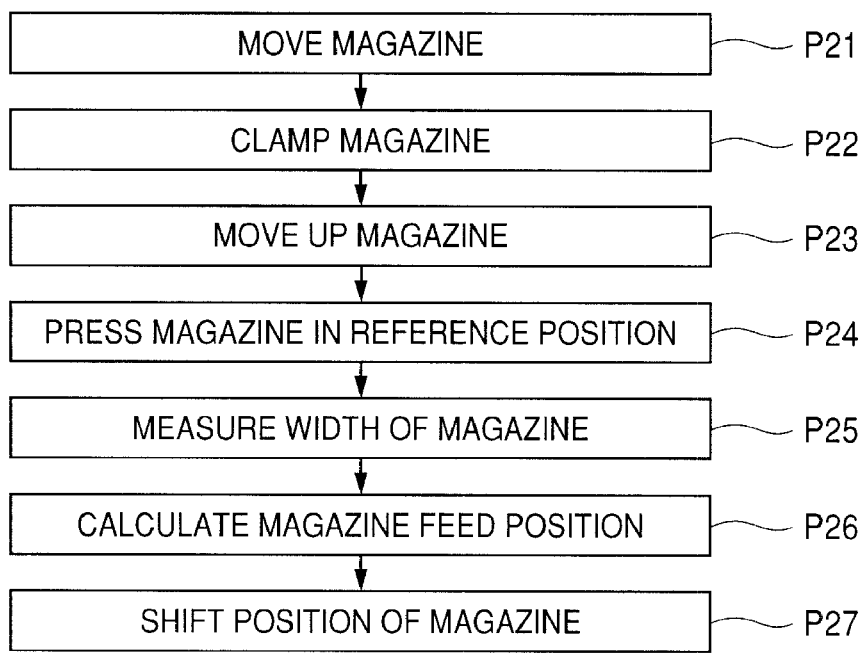
FIG. 57 is a flowchart illustrating the steps from the step of measuring the dimensions of a magazine used in the fabrication of a semiconductor device in the 10th embodiment of the invention to the step of moving the magazine to a wiring substrate unloading position with variation in the dimensions of the magazine taken into account.

FIG. 57 is a flowchart illustrating steps from a step at which the dimensions of a magazine 151 are measured to a step at which the magazine 151 is moved to a wiring substrate 11 feed position with variation in the dimensions of the magazine 151 taken into account. FIG. 58, FIG. 60, FIG. 64, FIG. 67, FIG. 69, FIG. 71, and FIG. 73 are top views of the dimensional measurement jig, explaining in detail the steps in the flowchart illustrated in FIG. 57. FIG. 59, FIG. 61, FIG. 62, FIG. 63, FIG. 65, FIG. 66, FIG. 68, FIG. 70, FIG. 72, FIG. 74, FIG. 75, FIG. 76, and FIG. 77 are side views of the dimensional measurement jig, explaining in detail the steps in the flowchart illustrated in FIG. 57. Description will be given to a step at which variation in the dimensions of a magazine 151 is measured and a step at which the magazine 151 is moved to the wiring substrate 11 feed position with the variation taken into account with reference to FIG. 57 to FIG. 77.

Figure 58:
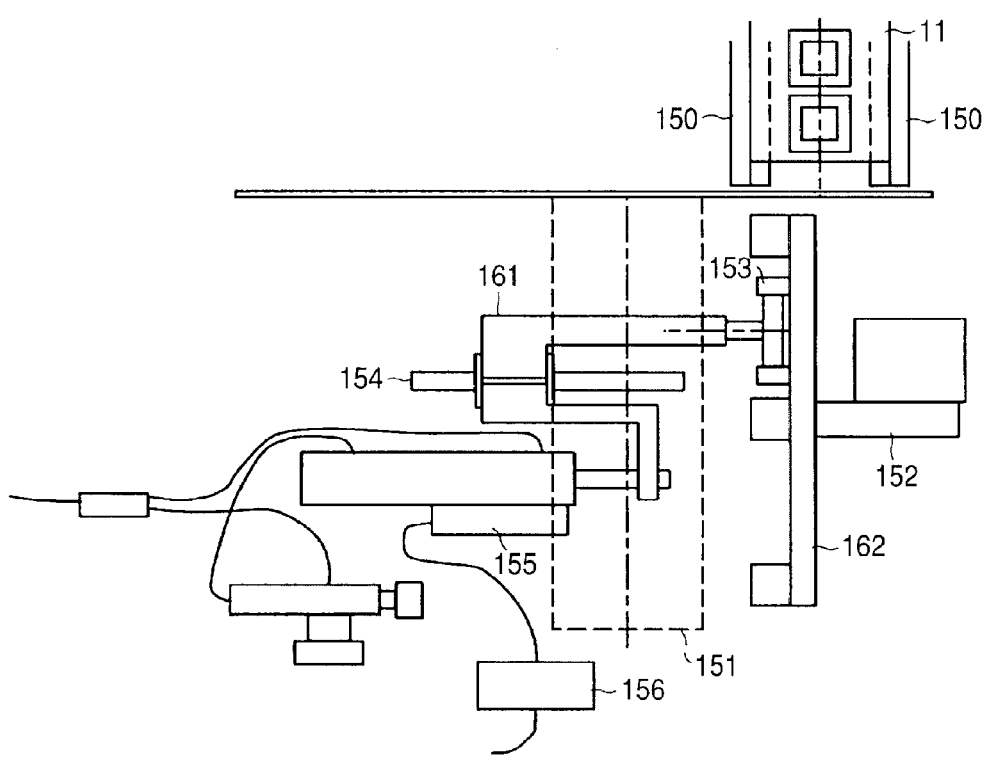
FIG. 58 is a top view of a dimensional measurement jig for magazines, explaining the details of the steps in the flowchart illustrated in FIG. 57.
Figure 59:
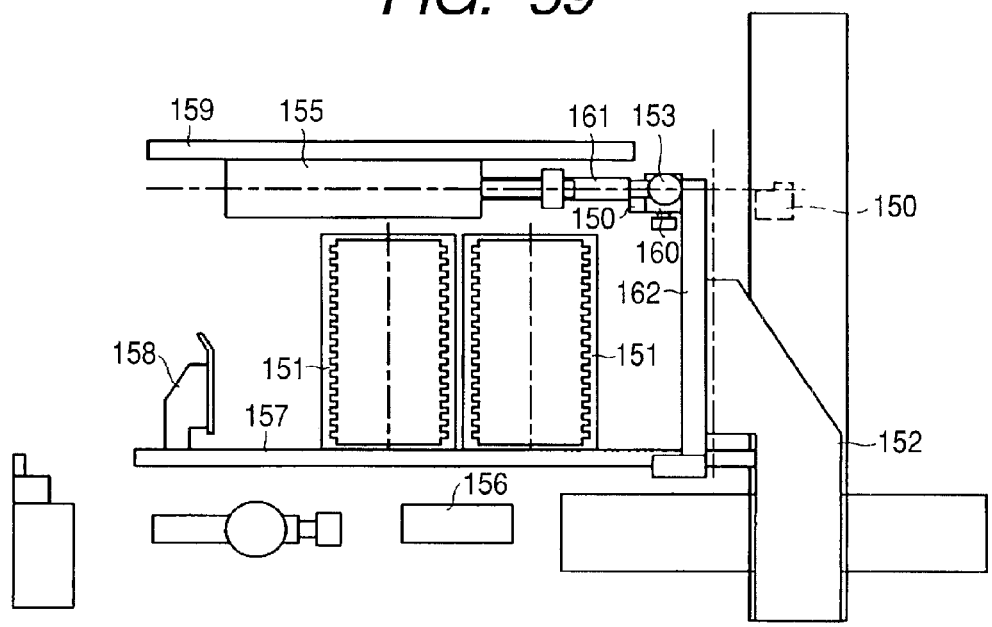
FIG. 59 is a side view of a dimensional measurement jig for magazines, explaining the details of the steps in the flowchart illustrated in FIG. 57.

As illustrated in FIG. 58 and FIG. 59, a magazine 151 with wiring substrates 11 (not shown) housed therein is fed onto the stage 157 (Step P21). If the distance from the magazine 151 to a back plate 162 is larger than the width of the magazine 151 at this time, the following problem can arise. (The width of the magazine is located in the horizontal direction in FIG. 58 and FIG. 59.) When the fixing jig 158 presses against the magazine 151 at a subsequent step, the magazine 151 can be toppled down. To prevent this, the magazine 151 is placed on the stage 157 so that the distance from the magazine 151 to the back plate 162 is equal to or smaller than the width of the magazine 151. The drive mechanism 155 is driven to move the retaining jig 153 to the back plate 162 of the magazine transporting jig 152. This makes it possible to obtain the coordinate in the horizontal direction in FIG. 58 and FIG. 59 at which the back plate 162 is positioned when the magazine 151 is fed onto the stage 157. (The horizontal direction in FIG. 58 and FIG. 59 will be hereafter referred to as Y direction (third direction).) (The above coordinate will be hereafter referred to as first Y-coordinate.) This first Y-coordinate is recorded in the data storage mechanism 156.

Figure 60:
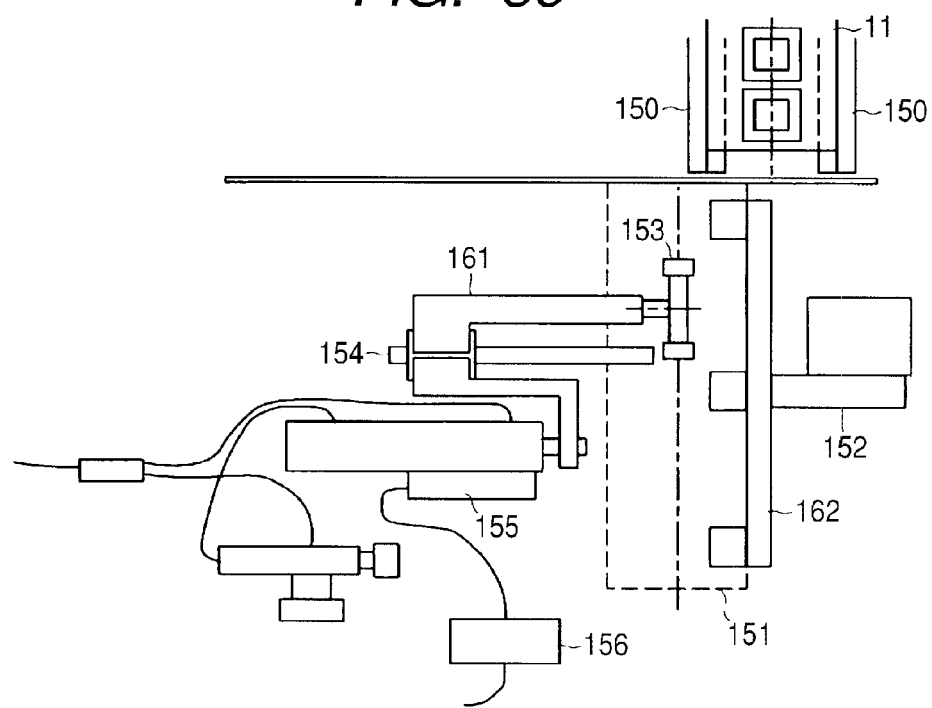
FIG. 60 is a top view of a dimensional measurement jig for magazines, explaining the details of the steps in the flowchart illustrated in FIG. 57.
Figure 61:
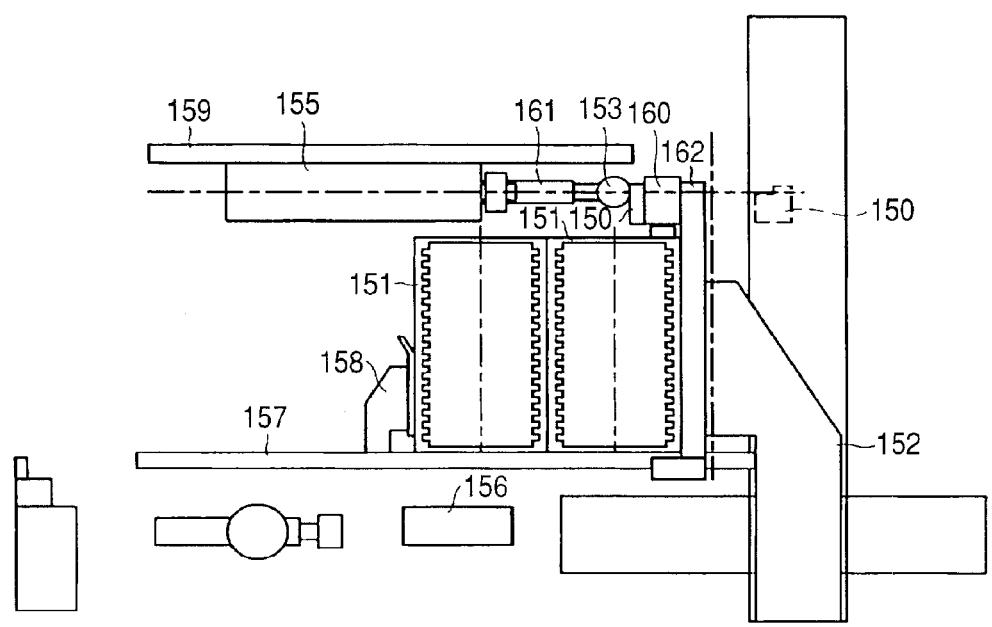
FIG. 61 is a side view of a dimensional measurement jig for magazines, explaining the details of the steps in the flowchart illustrated in FIG. 57.
Figure 62:
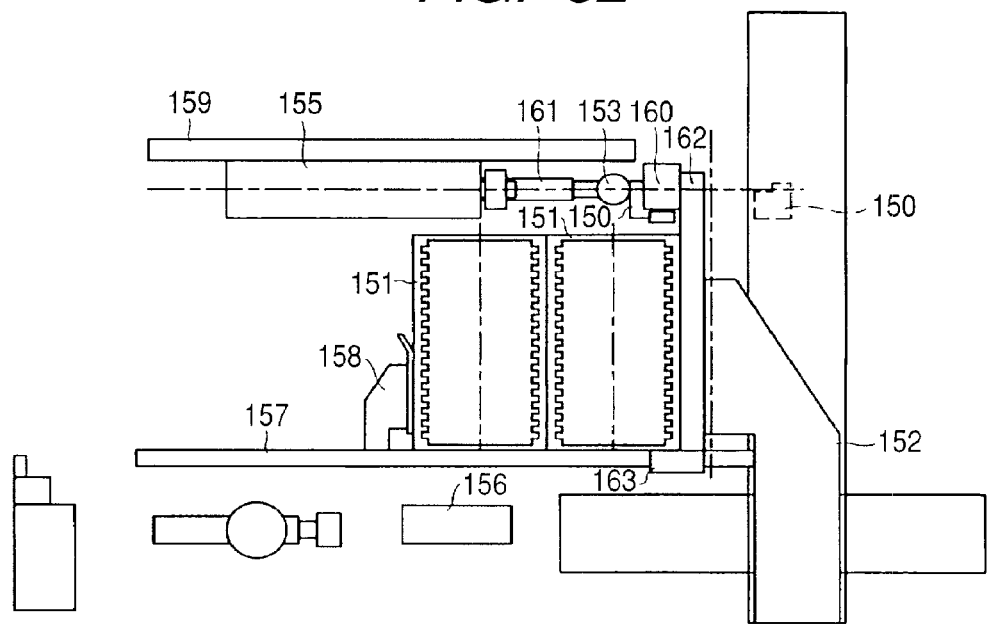
FIG. 62 is a side view of a dimensional measurement jig for magazines, explaining the details of the steps in the flowchart illustrated in FIG. 57.
Figure 63:
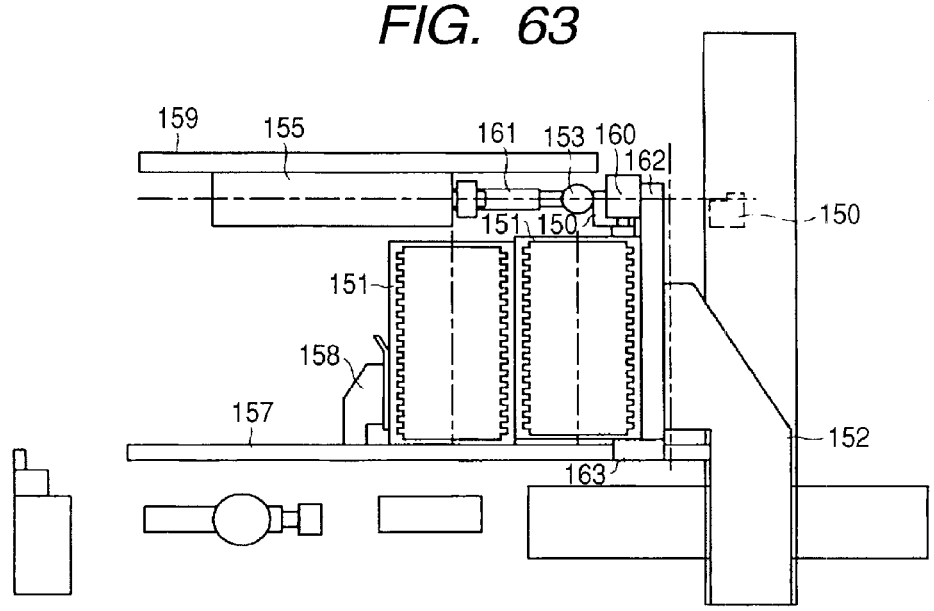
FIG. 63 is a side view of a dimensional measurement jig for magazines, explaining the details of the steps in the flowchart illustrated in FIG. 57.

As illustrated in FIG. 60 and FIG. 61, subsequently, the drive mechanism 155 is driven to return the retaining jig 153 to the original position, and then the magazine 151 is pressed against the back plate 162 of the magazine transporting jig 152 by the fixing jig 158. As illustrated in FIG. 62, subsequently, the lower part holding jig 163 of the magazine transporting jig 152 moves up the magazine transporting jig 152 to a position in which it is brought into contact with the bottom of the magazine 151. As illustrated in FIG. 63, subsequently, the magazine transporting jig 152 is further moved up to move up the magazine 151. Thus, the magazine 151 is clamped between the lower part holding jig 163 and the fixing jig 160, and the magazine 151 is thereby fixed (Step P22).

Figure 64:
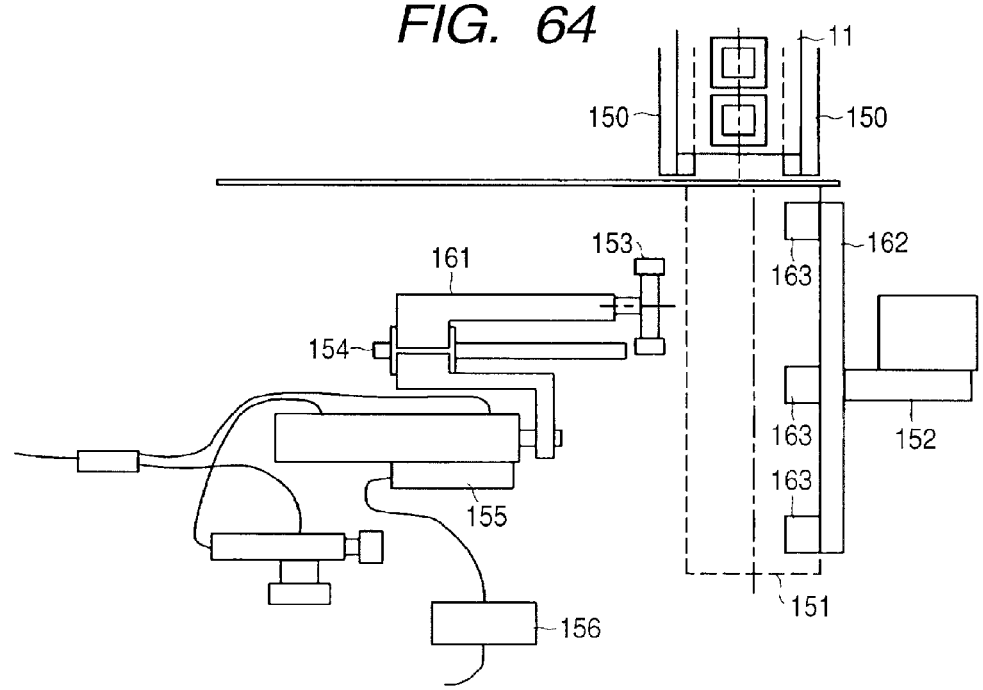
FIG. 64 is a top view of a dimensional measurement jig for magazines, explaining the details of the steps in the flowchart illustrated in FIG. 57.
Figure 65:
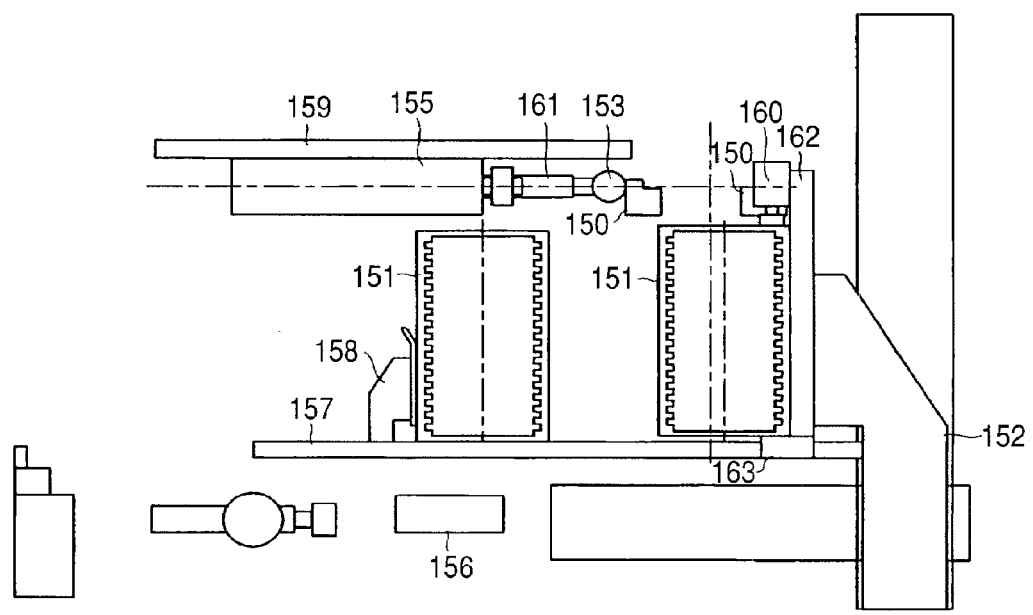
FIG. 65 is a side view of a dimensional measurement jig for magazines, explaining the details of the steps in the flowchart illustrated in FIG. 57.
Figure 66:
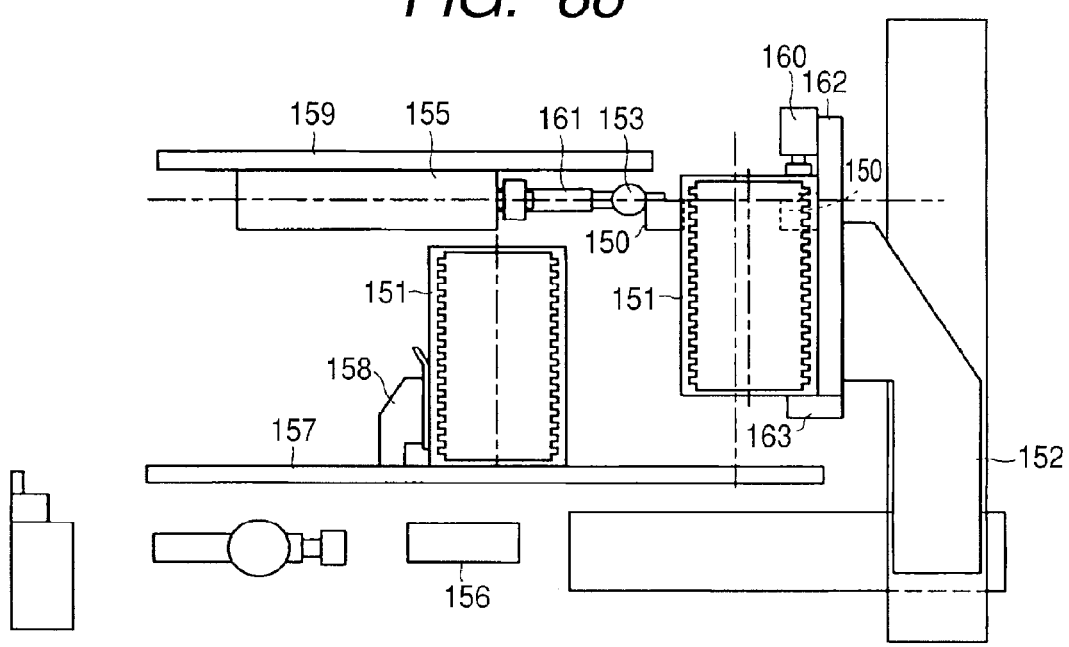
FIG. 66 is a side view of a dimensional measurement jig for magazines, explaining the details of the steps in the flowchart illustrated in FIG. 57.

As illustrated in FIG. 64 and FIG. 65, subsequently, the magazine transporting jig 152 and the fixing jig 160 are moved to the origin in the Y direction with the magazine 151 clamped between the lower part holding jig 163 and the fixing jig 160. This origin is a preset position that provides a benchmark when a wiring substrate 11 is fed from a magazine 151 to the transport rails 150. The coordinate in the Y direction of the back plate 162 at the origin is recorded beforehand in the data storage mechanism 156. (This coordinate will be hereafter referred to as second Y-coordinate.) The opening of the magazine 151 is open toward the X direction (fourth direction) that is orthogonal to the Y direction in FIG. 64 and in which the transport rails 150 are extended. As illustrated in FIG. 66, subsequently, the magazine transporting jig 152 is moved up to a height (dimensional measurement position) at which a wiring substrate 11 can be fed from a magazine 151 onto the transport rails 150 (Step P23).

Figure 67:
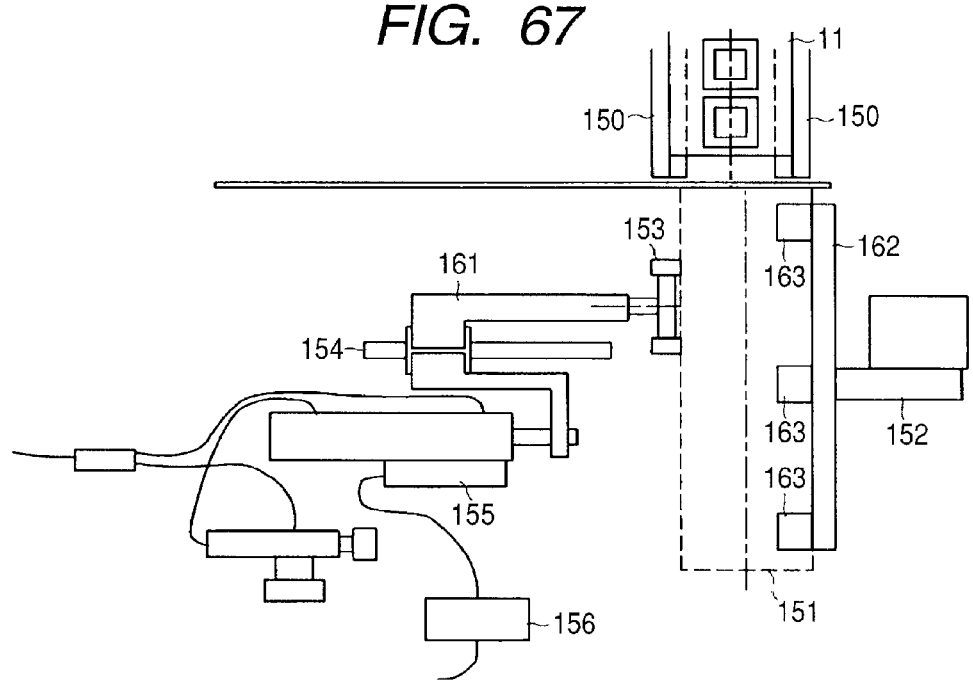
FIG. 67 is a top view of a dimensional measurement jig for magazines, explaining the details of the steps in the flowchart illustrated in FIG. 57.
Figure 68:
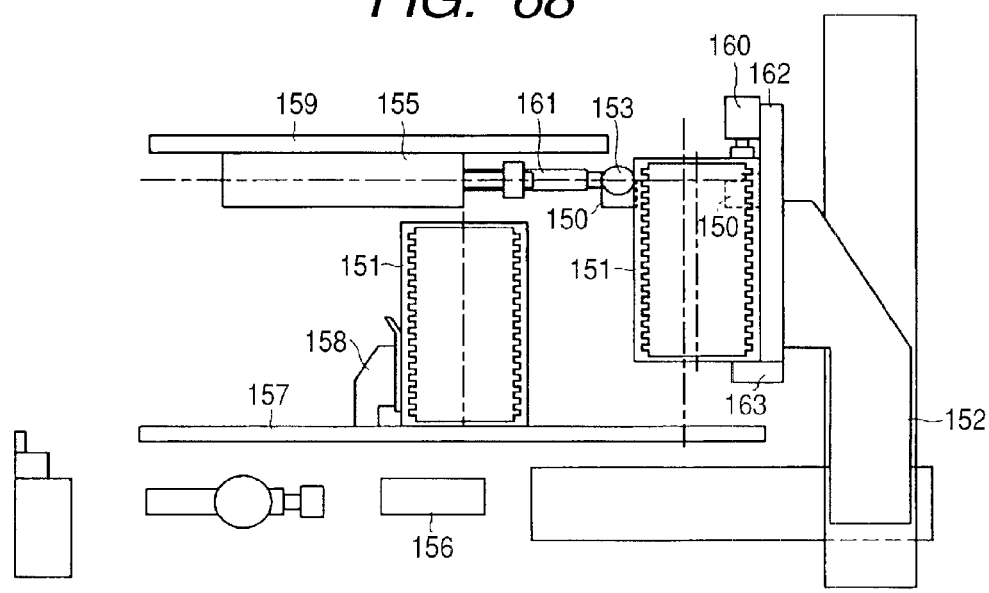
FIG. 68 is a side view of a dimensional measurement jig for magazines, explaining the details of the steps in the flowchart illustrated in FIG. 57.

As illustrated in FIG. 67 and FIG. 68, subsequently, the drive mechanism 155 is driven to press the retaining jig 153 against a side face of the magazine 151 held by the magazine transporting jig 152 (Step P24). This makes it possible to obtain the coordinate of this side face of the magazine 151 in the Y direction. (This coordinate will be hereafter referred to as third Y-coordinate.)

Figure 69:
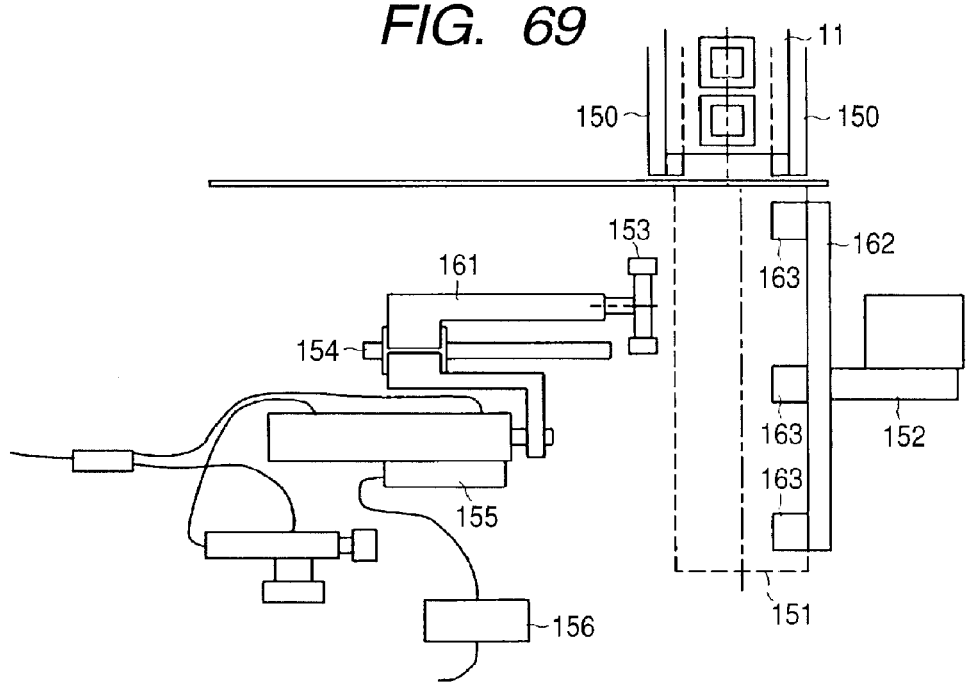
FIG. 69 is a top view of a dimensional measurement jig for magazines, explaining the details of the steps in the flowchart illustrated in FIG. 57.
Figure 70:
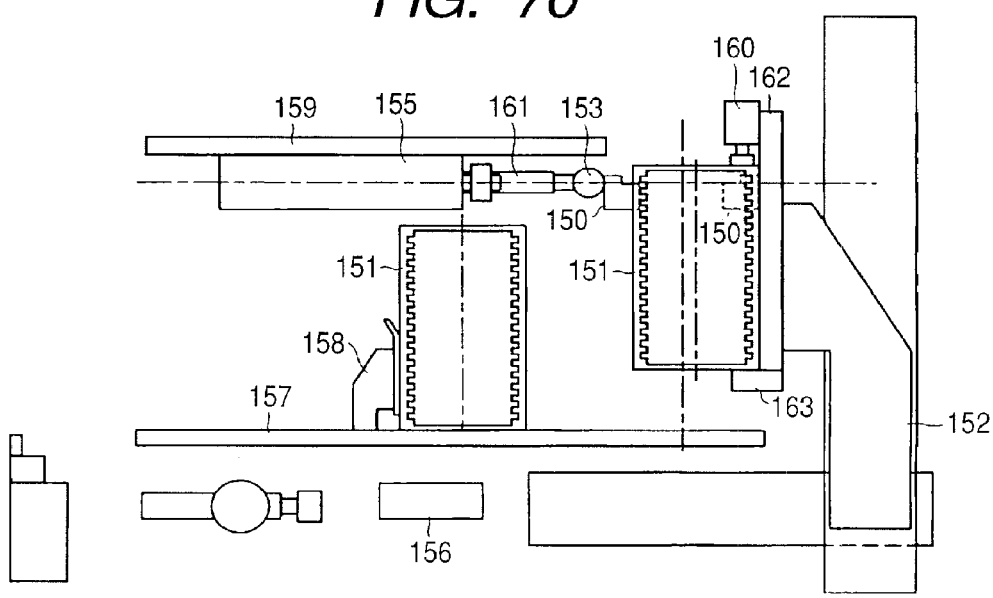
FIG. 70 is a side view of a dimensional measurement jig for magazines, explaining the details of the steps in the flowchart illustrated in FIG. 57.

Subsequently, the amount of movement of the magazine transporting jig 152 from the first Y-coordinate to the second Y-coordinate in the first Y direction is obtained from the above-mentioned first Y-coordinate and second Y-coordinate. In the 10th embodiment, the sign to the value of amount of movement in the first Y direction differs depending on how to set the first Y-coordinate, second Y-coordinate, and third Y-coordinate. When the Y-coordinate is so set that it is increased as it goes to the right in FIG. 58 to FIG. 68, the amount of movement in the first Y direction takes a positive numeric value. When the Y-coordinate is so set that it is reduced as it goes to the right in FIG. 58 to FIG. 68, the amount of movement in the first Y direction takes a negative numeric value. The width (first width) of the magazine 151 is obtained from the first Y-coordinate, third Y-coordinate, and amount of movement in the first Y direction. That is, the absolute value of a numeric value obtained from the calculation of the first Y-coordinate+the amount of movement in the first Y direction−the third Y-coordinate is equivalent to the width of the magazine 151 (Step P25). Subsequently, the drive mechanism 155 is driven to return the retaining jig 153 to the original position as illustrated in FIG. 69 and FIG. 70.

Figure 71:
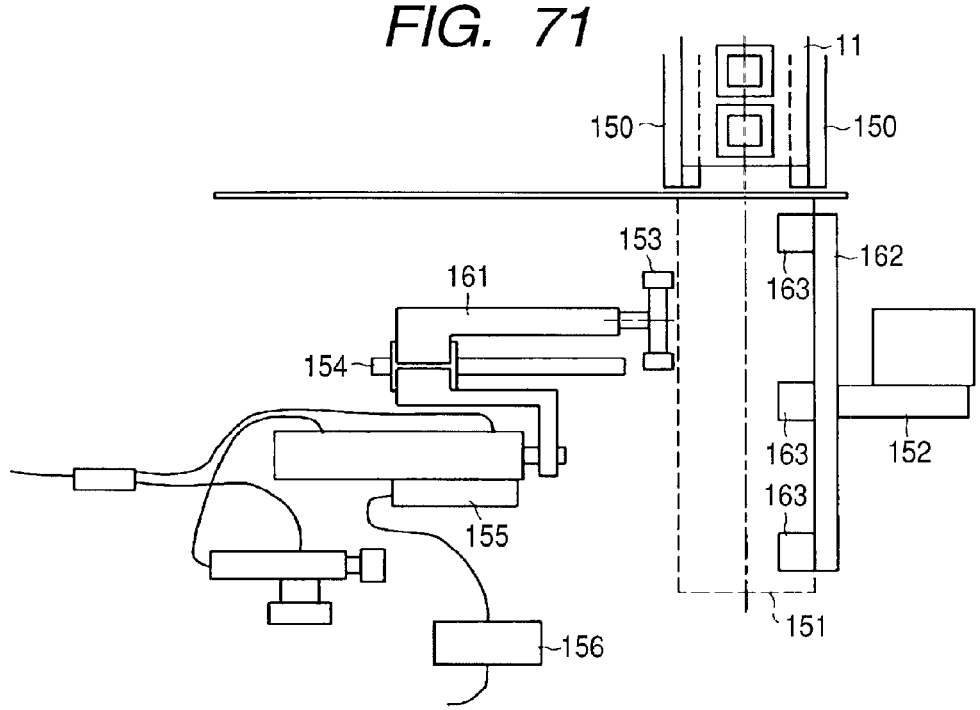
FIG. 71 is a top view of a dimensional measurement jig for magazines, explaining the details of the steps in the flowchart illustrated in FIG. 57.
Figure 72:
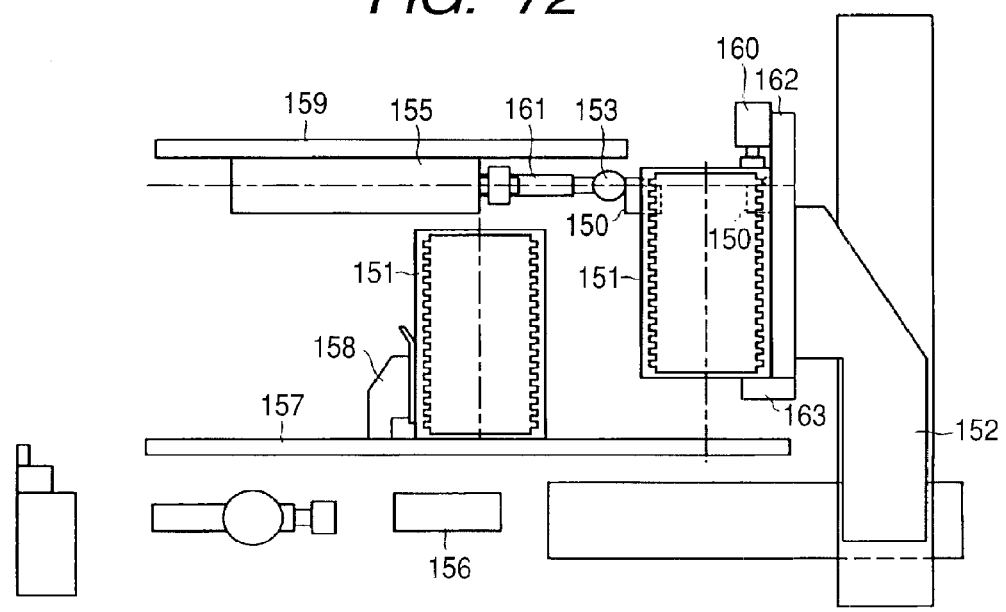
FIG. 72 is a side view of a dimensional measurement jig for magazines, explaining the details of the steps in the flowchart illustrated in FIG. 57.

As illustrated in FIG. 71 and FIG. 72, subsequently, the magazine transporting jig 152 and the fixing jig 160 are moved so that the center of the magazine 151 is aligned with the center of the transport rails 150 in the Y direction. At this time, the amount of movement (first difference) can be obtained from the following: the coordinate of the center of the transport rails 150 in the Y direction, recorded beforehand in the data storage mechanism 156; the width of the magazine 151 obtained at the above-mentioned step; and the coordinate (second Y-coordinate) of the back plate 162 before it is moved. The coordinate of the back plate 162 in the Y direction after it is moved is recorded as a fourth Y-coordinate in the data storage mechanism 156.

Figure 73:
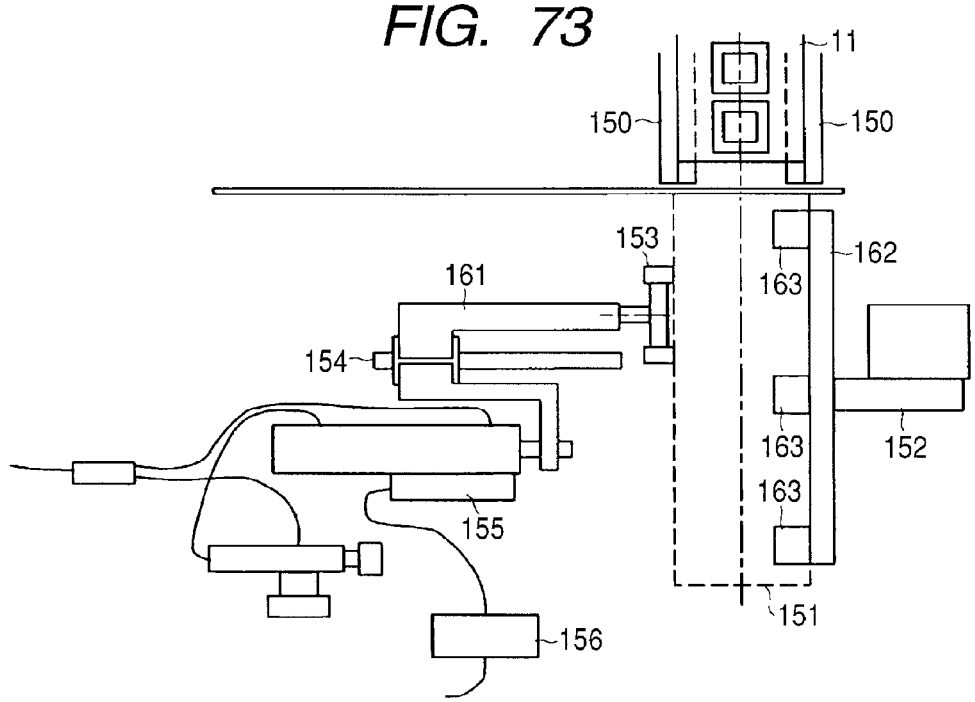
FIG. 73 is a top view of a dimensional measurement jig for magazines, explaining the details of the steps in the flowchart illustrated in FIG. 57.
Figure 74:
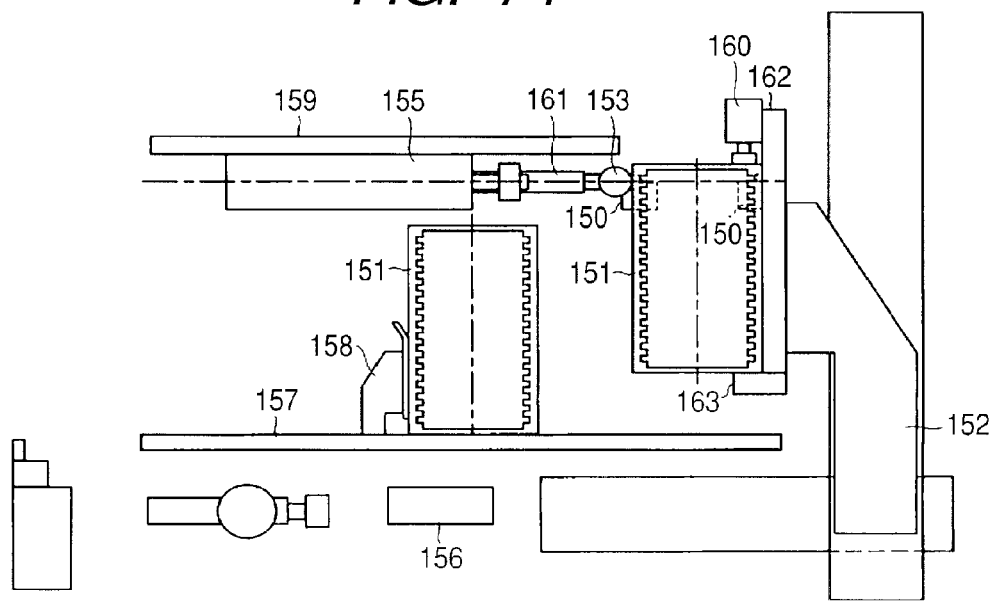
FIG. 74 is a side view of a dimensional measurement jig for magazines, explaining the details of the steps in the flowchart illustrated in FIG. 57.
Figure 75:
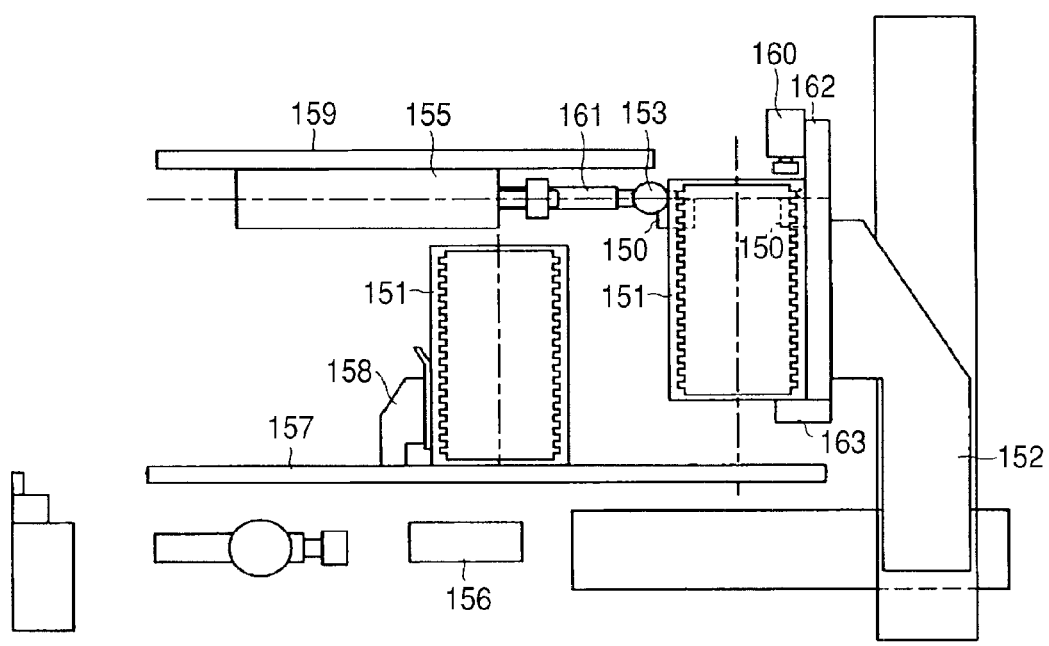
FIG. 75 is a side view of a dimensional measurement jig for magazines, explaining the details of the steps in the flowchart illustrated in FIG. 57.

The magazine 151 can be transported to a position (mounting board unloading position) where a wiring substrate 11 can be fed from the magazine 151 onto the transport rails 150 through the steps so far. However, there is the possibility that the magazine 151 held by the magazine transporting jig 152 has been inclined during the steps so far. In this case, there can be slight positional deviation between the position where a wiring substrate 11 is unloaded from the magazine 151 and the installation position of the transport rails 150. To correct this slight positional deviation, the 10th embodiment takes the following measure: first, the drive mechanism 155 is driven to press the retaining jig 153 against a side face of the magazine 151 held by the magazine transporting jig 152, as illustrated in FIG. 73 and FIG. 74; subsequently, the fixing jig 160 is loosened to correct the inclination of the magazine 151 by press of the retaining jig 153, as illustrated in FIG. 75. If the magazine 151 is not inclined at this time, the posture of the magazine 151 remains unchanged.

Figure 76:
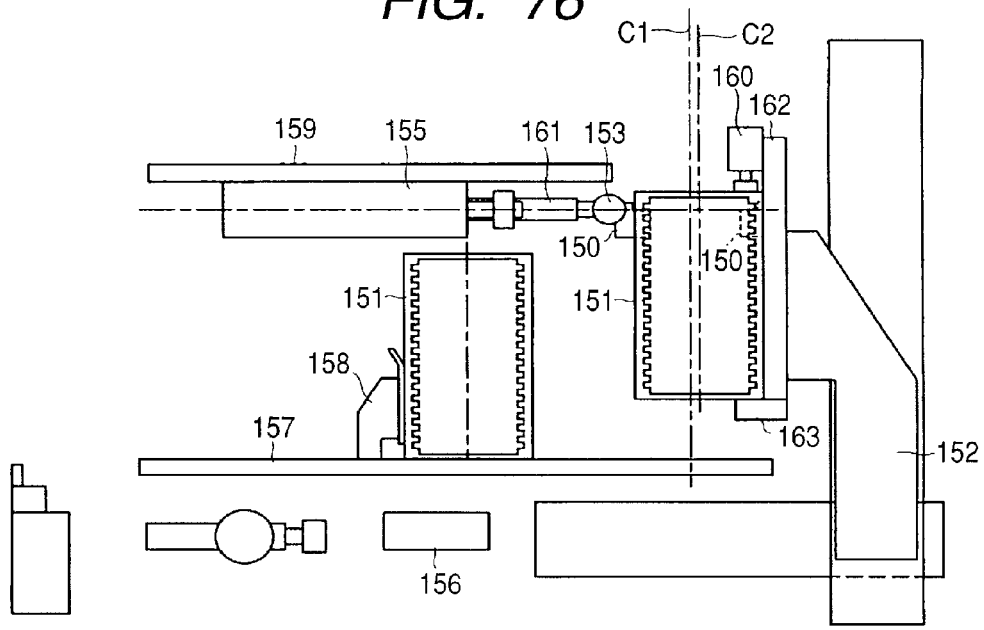
FIG. 76 is a side view of a dimensional measurement jig for magazines, explaining the details of the steps in the flowchart illustrated in FIG. 57.

As illustrated in FIG. 76, subsequently, the fixing jig 160 is tightened to fix the magazine 151. Subsequently, the drive mechanism 155 is driven to press the retaining jig 153 against a side face of the magazine 151 held by the magazine transporting jig 152. This makes it possible to obtain the coordinate in the Y direction of the side face of the magazine 151 whose inclination has been corrected. (This coordinate will be hereafter referred to as a fifth Y-coordinate.) In FIG. 76, the alternate long and short dash line marked with C1 represents the position of the center of the transport rails 150 in the Y direction; and the alternate long and short dash line marked with C2 represents the position of the center of the magazine 151 whose inclination has been corrected in the Y direction.

Subsequently, the amount of movement of the magazine transporting jig 152 from the first Y-coordinate to the fourth Y-coordinate in the second Y direction is obtained from the above-mentioned first Y-coordinate and fourth Y-coordinate. Subsequently, the width of the magazine 151 whose inclination has been corrected is obtained from the first Y-coordinate, fifth Y-coordinate, and amount of movement in the second Y direction (Step P25). That is, the absolute value of a numeric value obtained from the calculation of the first Y-coordinate+ the amount of movement in the second Y direction−the fifth Y-coordinate is equivalent to the width of the magazine 151 whose inclination has been corrected. Subsequently, a corrected amount of movement of the magazine transporting jig 152 and the fixing jig 160 is obtained from the following (Step P26): the coordinate of the center of the transport rails 150 in the Y direction, recorded beforehand in the data storage mechanism 156; and the width of the magazine 151 whose inclination has been corrected, and the coordinate (fourth Y-coordinate) of the back plate 162. This corrected amount of movement is for making the position of the center of the transport rails 150 in the Y direction agree with the position of the center of the magazine 151 whose inclination has been corrected in the Y direction. Subsequently, the drive mechanism 155 is driven to return the retaining jig 153 to the original position.

Figure 77:
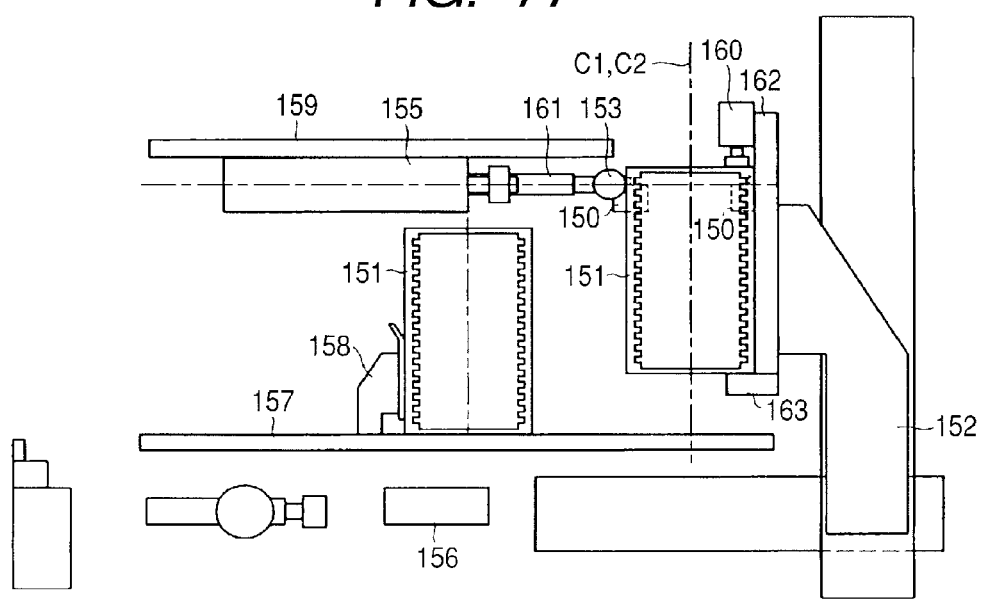
FIG. 77 is a side view of a dimensional measurement jig for magazines, explaining the details of the steps in the flowchart illustrated in FIG. 57.

As illustrated in FIG. 77, subsequently, the magazine transporting jig 152 and the fixing jig 160 are moved based on the corrected amount of movement (Step P27). Thus, the magazine 151 can be transported to a position where a wiring substrate 11 can be fed from the magazine 151 onto the transport rails 150 with favorable positional accuracy and reliability. That is, according to the 10th embodiment, a wiring substrate 11 can be fed from a magazine 151 onto the transport rails 150 without breakage.

After a wiring substrate 11 is unloaded from a magazine 151, it is transported to a position (chip mounting position) where a chip 1C is mounted, following the transport rails 150, for example. Thereafter, the step (first step) for mounting a chip 1C or a second chip 14 over the wiring substrate 11, described in relation to the first to ninth embodiments. Thereafter, the wiring substrate is housed in the original magazine 151 again or in a different magazine 151. In cases where the step for mounting a chip 1C and a second chip 14 has been completed when a wiring substrate 11 is unloaded from a magazine 151, the following procedure is taken: the step (first step) for connecting an Au wire 15, the step (first step) for sealing with molding resin 17, or the like, described in relation to the first to ninth embodiments, is carried out; and then the wiring substrate is housed in the original magazine 151 again or in a different magazine 151. In cases where the step for sealing with molding resin 17 has been completed when a wiring substrate 11 is unloaded from the magazine 151, a step for cutting the wiring substrate 11 to form semiconductor packages may be carried out.

11th Embodiment

The 11th embodiment is so constructed that the following is carried out each time a wiring substrate 11 is unloaded from a magazine 151: the movement of the magazine transporting jig 152 and the fixing jig 160, described in relation to the 10th embodiment, for making the position of the center of the transport rails 150 in the Y direction agree with the position of the center of the magazine 151 whose inclination has been corrected in the Y direction.

Figure 78:
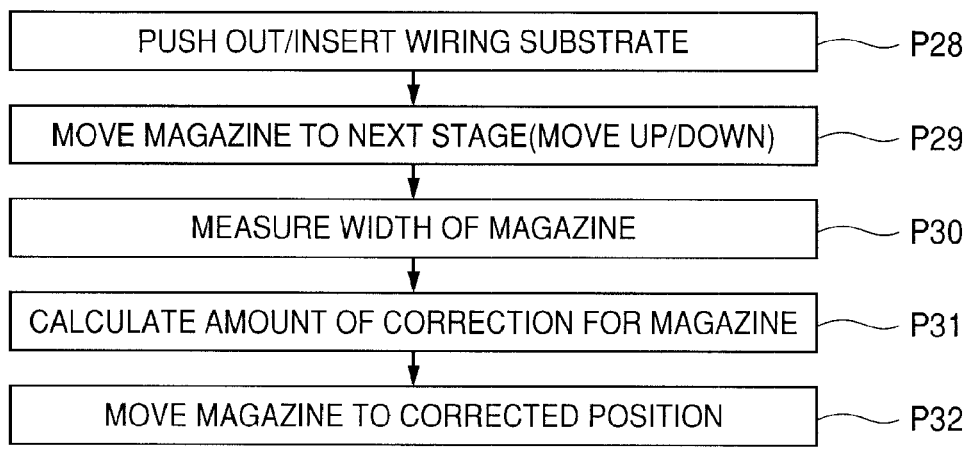
FIG. 78 is a flowchart illustrating the steps from the step of measuring the dimensions of a magazine used in the fabrication of a semiconductor device in an 11th embodiment of the invention to the step of moving the magazine to a wiring substrate unloading position with variation in the dimensions of the magazine taken into account.

The width of a magazine 151 varies from stage to stage in which multiple wiring substrates 11 are housed. FIG. 78 is a flowchart illustrating steps from a step for measuring the dimensions of a magazine 151 with respect to each of its stages in which multiple wiring substrates 11 are housed to a step for moving the magazine 151 to a wiring substrate 11 feed position with variation in width from stage to stage of the magazine 151 taken into account.

First, a wiring substrate (first mounting board) 11 is fed from the magazine 151 onto the transport rails 150 or returned from the transport rails 150 to the magazine 151 (Step P28). Subsequently, the magazine transporting jig 152 is moved up or down to a position where the wiring substrate (second mounting board) 11 in the next stage can be fed from the magazine 151 onto the transport rails 150 (Step P29).

Subsequently, the drive mechanism 155 is driven to press the retaining jig 153 against a side face of the magazine 151 held by the magazine transporting jig 152. Thus, the coordinate of the side face of the magazine 151 in the Y direction can be obtained in the position where the wiring substrate 11 in the next stage is fed onto the transport rails 150. (This coordinate will be hereafter referred to as a sixth Y-coordinate.) (This position will be hereafter referred to as next-stage feed position.)

Subsequently, the width (second width) of the magazine 151 in the next-stage feed position (first housing position) is obtained from the first Y-coordinate and the amount of movement in the second Y direction, described in relation to the 10th embodiment, and the sixth Y-coordinate (Step P30). That is, the absolute value of a numeric value obtained from the calculation of the first Y-coordinate+the amount of movement in the second Y direction–the sixth Y-coordinate is equivalent to the width of the magazine 151 in the next-stage feed position. Subsequently, the amount of movement (second difference) of the magazine transporting jig 152 and the fixing jig 160 for making the position of the center of the transport rails 150 in the Y direction agree with the position of the center of the magazine 151 in the Y direction in the next-stage feed position is obtained from the following (Step P31): the coordinate of the center of the transport rails 151 in the Y direction, recorded beforehand in the data storage mechanism 156; the width of the magazine 151 in the next-stage feed position; and the coordinate (fourth Y-coordinate) of the back plate 162. Subsequently, the drive mechanism 155 is driven to return the retaining jig 153 to the original position.

Subsequently, the magazine transporting jig 152 and the fixing jig 160 are moved based on the amount of movement of the magazine transporting jig 152 and the fixing jig 160, obtained at Step P31 (Step P32). Thus, the magazine 151 can be transported to a position where the wiring substrate 11 in the next stage can be fed from the magazine 151 onto the transport rails 150 with favorable positional accuracy and reliability. This processing of Steps P28 to P32 is carried out each time a wiring substrate 11 is unloaded from a magazine 151. Thus, the wiring substrates 11 housed in the respective stages in the magazine 151 can be fed from the magazine 151 to the transport rails 150 without breakage.

The same effects as in the 10th embodiment can also be obtained by the 11th embodiment.

Up to this point, concrete description has been given to the invention made by the present inventors based on embodiments. However, the invention is not limited to the above-mentioned embodiments, and it may be variously modified without departing from the scope of the invention, needless to add.

An example will be taken. In the above description of the embodiments, a chip is mounted over a wiring substrate. Instead, a chip may be mounted over a metal frame of copper or the like.

The fabrication method of a semiconductor device of the invention is widely applicable to fabrication processes for semiconductor devices including the following step: a step at which a semiconductor wafer stuck to an adhesive tape is divided into multiple semiconductor chips by dicing, and then each semiconductor chip is unstuck from the adhesive tape and mounted in a mounting area of a wiring substrate or the like.

What is claimed is:

1. A fabrication method of a semiconductor device comprising the steps of:
    (a) preparing a semiconductor wafer in which a principal surface thereof is partitioned into a plurality of chip areas by parting areas, an integrated circuit is formed in each of the chip areas, and an adhesive tape is stuck to a rear surface of the semiconductor wafer;
    (b) cutting the semiconductor wafer along the parting areas to divide the semiconductor wafer into a plurality of semiconductor chips, and holding the semiconductor chips by the adhesive tape;
    (c) horizontally applying a first tension to an adhesive face of the adhesive tape with the semiconductor chips stuck thereto and plunging up a first semiconductor chip of the plurality to be unstuck from the adhesive tape with a plunge-up jig, and vacuuming and holding an upper face of the first semiconductor chip by a first predetermined suction force with a vacuuming collet for the purpose of unsticking the first semiconductor chip from the adhesive tape; and
    (d) after the first semiconductor chip unsticks from the adhesive tape, vacuuming and holding the upper face of the first semiconductor chip with the vacuuming collet, and die-bonding a lower face of the first semiconductor chip to a chip mounting area,
    wherein, during the die-bonding in the step (d), the vacuuming and holding are performed by a second predetermined suction force smaller than the first predetermined suction force,
    wherein a changeover from the first predetermined suction force to the second predetermined suction force is carried out before the die-bonding, and
    where the changeover from the first predetermined suction force to the second predetermined suction force is carried out immediately after the first semiconductor chip is transported to the chip mounting area.

2. The fabrication method of a semiconductor device according to claim 1,
    wherein the first predetermined suction force is a suction force sufficient to unstick the first semiconductor chip from the adhesive tape, and
    wherein the second predetermined suction force is sufficient to prevent the first semiconductor chip from dropping from the vacuuming collet.

3. The fabrication method of a semiconductor device according to claim 2, wherein the thickness of the first semiconductor chip is not more than 100 μm.

4. The fabrication method of a semiconductor device according to claim 3, wherein the second predetermined suction force is not more than 10 kPa.

5. The fabrication method of a semiconductor device according to claim 3, wherein the chip mounting area is located over a principal surface of a mounting board or over a different semiconductor chip mounted over the principal surface of the mounting board.

6. The fabrication method of a semiconductor device according to claim 2, wherein, in the step (d), die-bonding is performed by thermocompression.

7. A method of manufacturing a semiconductor device comprising the steps of:
    (a) preparing a semiconductor wafer in which a principal surface thereof is partitioned into a plurality of chip areas by parting areas, an integrated circuit is formed in each of the chip areas, and an adhesive tape is stuck to a rear surface of the semiconductor wafer;
    (b) cutting the semiconductor wafer along the parting areas to divide the semiconductor wafer into a plurality of semiconductor chips, and holding the semiconductor chips by the adhesive tape;
    (c) horizontally applying a first tension to an adhesive face of the adhesive tape with the semiconductor chips stuck thereto and plunging up a first semiconductor chip of the plurality to be unstuck from the adhesive tape with a plunge-up jig, and vacuuming and holding an upper face of the first semiconductor chip by a first suction force with a vacuuming collet for the purpose of unsticking the first semiconductor chip from the adhesive tape;
    (d) at a failure of the unsticking attempt, carrying out the step (c) again under the condition that at least one of the plunging amount and the plunging speed of the plunge-up jig has been changed;
    (e) at a failure of the unsticking attempt at the step (d), carrying out the step (c) again under the condition that the first tension has been reduced;
    (f) after the first semiconductor chip unsticks from the adhesive tape, vacuuming and holding the upper face of the first semiconductor chip by a second suction force smaller than the first suction force with the vacuuming collet while die-bonding a lower face of the first semiconductor chip to a chip mounting area, wherein a changeover from the first suction force to the second suction force is carried out before die-bonding the lower face of the first semiconductor chip to the chip mounting area, and wherein the changeover from the first suction force to the second suction force is carried out immediately after the first semiconductor chip is transported to the chip mounting area.

8. The method of manufacturing a semiconductor device according to claim 7, wherein the first suction force is a suction force sufficient to unstick the first semiconductor chip from the adhesive tape, and wherein the second suction force is sufficient to prevent the first semiconductor chip from dropping from the vacuuming collet.

9. The method of manufacturing a semiconductor device according to claim 8, wherein the thickness of the first semiconductor chip is not more than 100 μm.

10. The method of manufacturing a semiconductor device according to claim 9, wherein the second suction force is not more than 10 kPa.

11. The method of manufacturing a semiconductor device according to claim 9, wherein the chip mounting area is located over a principal surface of a mounting board or over a different semiconductor chip mounted over the principal surface of the mounting board.

12. The method of manufacturing a semiconductor device according to claim 8, wherein, in the step (e), die-bonding is performed by thermocompression.

13. The method of manufacturing a semiconductor device according to claim 7, wherein the thickness of the first semiconductor chip is not more than 100 μm.

14. The method of manufacturing a semiconductor device according to claim 7, wherein the second suction force is not more than 10 kPa.

15. The method of manufacturing a semiconductor device according to claim 7, wherein the chip mounting area is located over a principal surface of a mounting board or over a different semiconductor chip mounted over the principal surface of the mounting board.

16. The method of manufacturing a semiconductor device according to claim 7, wherein, in the step (e), die-bonding is performed by thermocompression.

17. The method of manufacturing a semiconductor device according to claim 7, wherein the step (d) further includes reducing the first tension.

18. The fabrication method of a semiconductor device according to claim 1, wherein the vacuuming collet is coupled to a first vacuum supply system to supply the first predetermined suction force and is coupled to a second vacuum supply system to supply the second predetermined suction force, wherein at the step (c), the first vacuum supply system is opened and the second vacuum supply system is closed to supply the first predetermined suction force to the vacuuming collet, and wherein, for supply of the second predetermined suction force at the step (d), the first vacuum supply system is closed and the second vacuum supply system is opened to supply the second predetermined suction force to the vacuuming collet.

19. The method of manufacturing a semiconductor device according to claim 7, wherein the vacuuming collet is coupled to a first vacuum supply system to supply the first suction force and is coupled to a second vacuum supply system to supply the second suction force, wherein at the step (c), the first vacuum supply system is opened and the second vacuum supply system is closed to supply the first suction force to the vacuuming collet, and wherein, for supply of the second suction force at the step (f), the first vacuum supply system is closed and the second vacuum supply system is opened to supply the second suction force to the vacuuming collet.

20. The fabrication method of a semiconductor device according to claim 2, wherein the first predetermined suction force is a suction force sufficient to cause warpage of the first semiconductor chip, and wherein the second predetermined suction force is sufficiently smaller than the first predetermined suction force to eliminate the warpage.

21. The method of manufacturing a semiconductor device according to claim 8, wherein the first suction force is a suction force sufficient to cause warpage of the first semiconductor chip, and wherein the second suction force is sufficiently smaller than the first suction force to eliminate the warpage.

* * * * *